(12) United States Patent
Hirose et al.

(10) Patent No.: US 7,423,472 B2
(45) Date of Patent: Sep. 9, 2008

(54) POWER SWITCHING CIRCUIT

(75) Inventors: Masaya Hirose, Kyoto (JP); Kinya Daio, Kyoto (JP); Masahiro Gion, Kyoto (JP); Masato Maede, Osaka (JP); Hisaki Watanabe, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 42 days.

(21) Appl. No.: 11/390,443

(22) Filed: Mar. 28, 2006

(65) Prior Publication Data

US 2006/0214722 A1    Sep. 28, 2006

(51) Int. Cl.
*H03K 17/00*  (2006.01)

(52) U.S. Cl. .................................. 327/407; 327/537

(58) Field of Classification Search .................. None
See application file for complete search history.

(56) References Cited

U.S. PATENT DOCUMENTS

| | | | | |
|---|---|---|---|---|
| 5,475,273 A * | 12/1995 | Paparo et al. | ............... | 327/545 |
| 5,517,153 A | 5/1996 | Yin et al. | | |
| 5,619,450 A * | 4/1997 | Takeguchi | ............... | 365/185.23 |
| 5,808,502 A * | 9/1998 | Hui et al. | ............... | 327/333 |
| 5,867,007 A | 2/1999 | Kim | | |
| 5,892,387 A | 4/1999 | Shigehara et al. | | |
| 6,259,306 B1 * | 7/2001 | Brulhart et al. | ............... | 327/436 |
| 6,304,129 B1 * | 10/2001 | Blair et al. | ............... | 327/378 |
| 6,307,409 B1 * | 10/2001 | Wrathall | ............... | 327/112 |
| 6,348,820 B1 * | 2/2002 | Bennett et al. | ............... | 327/110 |
| 6,359,496 B1 | 3/2002 | Steinhagen | | |
| 6,828,846 B2 | 12/2004 | Tsukazaki et al. | | |
| 6,833,732 B2 * | 12/2004 | Hwang et al. | ............... | 326/82 |
| 6,914,474 B2 * | 7/2005 | Yamahira | ............... | 327/535 |
| 6,956,426 B2 | 10/2005 | Wodnicki | | |
| 7,005,911 B1 * | 2/2006 | Om'mani | ............... | 327/408 |
| 7,116,153 B2 * | 10/2006 | Pai | ............... | 327/430 |
| 2001/0000133 A1 * | 4/2001 | Noda et al. | ............... | 365/226 |
| 2003/0090313 A1 * | 5/2003 | Burgener et al. | ............... | 327/408 |
| 2005/0024124 A1 * | 2/2005 | Mizuno et al. | ............... | 327/530 |

FOREIGN PATENT DOCUMENTS

| | | |
|---|---|---|
| JP | 10-41800 | 2/1989 |
| JP | 2003-229748 | 8/2003 |
| JP | 2003-229749 | 8/2003 |

* cited by examiner

*Primary Examiner*—Cassandra Cox
(74) *Attorney, Agent, or Firm*—McDermott Will & Emery LLP

(57) ABSTRACT

There is provided a power switching circuit capable of completely breaking a current in an OFF state of a switch connecting power sources even when a voltage difference is generated between the power sources of a plurality of functional blocks separated from each other on an LSI chip. A gate control circuit 1a has a control signal terminal INCNT, a first power imputer terminal IG11, and a second power supply terminal IG12 as input terminals and has a first output terminal OG11 and a second output terminal OG12 as output terminals. The gate of a second P-type transistor P2 is connected to the first output terminal OG11 of the gate control circuit 1a and the gate of a second P-type transistor P2 is connected to the second output terminal OG12 of the gate control circuit 1a, wherein the first P-type transistor P1 and the second P-type transistor P2 are connected in series between a first power source VDD1 and a second power source VDD2 to form a switch section.

26 Claims, 28 Drawing Sheets

POWER SWITCHING CIRCUIT

BACKGROUND OF THE INVENTION

1. Field of the Invention

The present invention relates to a power switching circuit for a CMOS LSI.

2. Description of the Related Art

In recent years, a so-called system-on-chip technology of integrating all the elements in a chip formed a main stream in LSI technologies. Accordingly, a plurality of functional blocks exist on a chip and thus it is necessary to allow the respective functional blocks to operated with the minimum voltage and to deactivate the power sources of some functional blocks at the time of non-use, for the purpose of avoiding interference of noise in the respective functional blocks and reducing power consumption.

Accordingly, power source separation that a power source is divided and supplied to the functional blocks is now used for any LSI. However, the power source separation causes increase in the number of terminals in the LSI. Accordingly, it is often difficult to supply power to all the functional blocks in a specific process such as LSI shipping inspection.

As countermeasures, it can be considered that power switches connecting the power sources separated for each functional block are mounted on the chip only in such a specific case such as LSI shipping inspection. An example of such a power switch mounted on the chip is an analog switch.

For example, a circuit configuration of an analog switching circuit in which an excessive current is suppressed from flowing to elements from input terminals under a specific use condition is disclosed in Japanese Unexamined Patent Application Publication No. 2003-229748 (see FIG. 3 ). FIG. 18 is a schematic diagram illustrating an example of such a configuration that the analog switch disclosed in Japanese Unexamined Patent Application Publication No. 2003-229749 (see FIG. 3 ) serves as a power switch.

The gate potentials of MOS transistors P1 and N14 which are connected in parallel to each other and which have different polarities are controlled by nodes PG and NG. When the switch is in the ON state and the potential of a first power source VDD1 is higher than that of a second power source VDD2, the voltage of the first power source VDD1 is delivered from a terminal AIN to a terminal AOUT. When the potential of the second power source VDD2 is higher than that of the first power source VDD1, the voltage of the second power source VDD2 is delivered from the terminal AOUT to the terminal AIN.

At this time, since the higher voltage of the voltages of the first power source VDD1 and the second power source VDD2 is selected as the well potential of the P-type transistor P1 by a well-potential control circuit 2a and is supplied from an output terminal VNW of the well-potential control circuit 2a, an excessive current does not flow through the P-type transistor P1, whether the voltage of the first power source VDD1 is higher than that of the second power source VDD2.

A circuit configuration which can prevent an unnecessary current from flowing through a parasitic diode to the earth potential from an input terminal in an analog switch under a specific use condition is disclosed in Patent Document 2.

FIG. 19 is a schematic diagram illustrating an example of such a configuration that the analog switch disclosed in Japanese Unexamined Patent Application Publication No. 10-41800 (see FIG. 1) serves as a power switch. The gate potentials of MOS transistors P1 and N14 which are connected in parallel and which have different polarities are controlled by nodes PG and NG and a voltage equal to the well potential of the P-type transistor P1 is supplied to a power source of a gate control circuit 1g.

When the switch is in the ON state and the potential of a second power source VDD2 is higher than the potential of a first power source VDD1, the potential of the second power source VDD2 is delivered from a terminal AOUT to a terminal AIN. In this case, since the voltage subsequently equal to the potential of the second power source VDD2 is supplied as the well potential of the P-type transistor from the second power source VDD2 through a diode D1, excessive current flows through the well of the P-type transistor P1.

However, in the conventional analog switches, when the switches are turned off, a problem is which voltage of a plurality of power sources is used as the voltage of a control signal for controlling the switches. Specifically, in order to turn off the P-type transistor constituting the analog switch, it is necessary to use the highest voltage of the source voltages as the gate voltage of the P-type transistor.

Specifically speaking, it is necessary to turn off the switches between the power sources of the functional blocks at the time of normal use of an LSI, but when a difference is generated between the source voltages of the functional blocks and the voltage of the control signal of the analog switch connecting the power sources of the functional blocks is lower than another source voltage, the gate voltage of the P-type transistor constituting the analog switch may be lower than the source voltage or the drain voltage thereof. In this case, there is a problem that the P-type transistor is not turned off and thus current flows between the different power sources connected to each other through the analog switch.

Accordingly, it is required that the gate voltage of the P-type transistor constituting the analog switch is the highest voltage of the power sources of the functional blocks between with the switch is connected.

In the method of supplying the highest voltage among the voltages of the power sources of the functional blocks to the gate control circuit by the use of a diode, since voltage drop occurs in the diode element, the high-level output from the gate control circuit drops in voltage, thereby sufficiently turning off the P-type transistor constituting the analog switch. Accordingly, there is a problem that leakage of current occurs.

SUMMARY OF THE INVENTION

The present invention is contrived to solve the above-mentioned problems. An object of the present invention is to provide a power switching circuit capable of completely breaking a current in an OFF state of a switch connecting power sources, even when a voltage difference is generated between the power sources of a plurality of functional blocks separated from each other on an LSI chip.

According to Aspect 1 of the present invention, there is provided a power switching circuit comprising: a first p-type transistor and a second p-type transistor connected in series between a first power source and a second power source; a gate control circuit having a first power supply terminal connected to the first power source, a second power supply terminal connected to the second power source, a control signal terminal to which a control signal is input, a first output terminal connected to the gate of the first P-type transistor, and a second output terminal connected to the gate of the second P-type transistor; and a well-potential control circuit having a first power supply terminal connected to the first power source, a second power supply terminal connected to the second power source, and an output terminal connected to the well of the first P-type transistor and the well of the second P-type transistor, wherein the gate control circuit outputs a voltage equal to that of the first power source to the first output terminal and outputs a voltage equal to that of the second power source o the second output terminal when the control signal is in a low level, and outputs an earth potential to the first output terminal and the second output terminal when the control signal is in a high level, and wherein the well-potential control circuit outputs the voltage equal to that of the first power source to the output terminal when the voltage of the first power source is higher than that of the second power source, and outputs the voltage equal to that of the second power source to the output terminal when the voltage of the second power source is higher than that of the first power source.

According to Aspect 1 described above, since the well potential of the first P-type transistor and the well potential of the second P-type transistor are controlled by the well-potential control circuit so as to be substantially equal to the higher potential of the first power source and the second power source, the leakage of current through the wells and destruction of elements are prevented. The gate control circuit can switch the power switch between the ON state and the OFF state by the use of the control signal. Accordingly, when the power switch is turned on, the gate voltage of the first P-type transistor and the gate voltage of the second P-type transistor are controlled to the low level. When the power switch is turned off, the gate voltage of the first P-type transistor is controlled to the voltage equal to the voltage of the first power supply terminal, that is, the voltage of the first power source, and the gate voltage of the second P-type transistor is controlled to the voltage equal to the voltage of the second power supply terminal, that is, the voltage of the second power source. Even when a voltage difference is generated between different power sources in the OFF state of the power switch connecting the different power sources to each other, which was a problem in the conventional analog switch, the gate voltages of the first P-type transistor and the second P-type transistor connected in series can be controlled to the voltages of the first power source and the second power source. Accordingly, when any one of the voltage of the first power source and the voltage of the second power source is higher than the other, one of the first P-type transistor and the second P-type transistor is essentially turned off, thereby completely breaking current in the power switching circuit.

In Aspect 2 of the present invention, as a first specific example of the gate control circuit, the gate control circuit may include a first resistive element and a first N-type transistor connected in series between the first power supply terminal and the earth potential and a second resistive element and a second N-type transistor connected in series between the second power supply terminal and the earth potential. Here, the gate of the first N-type transistor and the gate of the second N-type transistor may be connected to the control signal terminal, a connection node between the first resistive element and the first N-type transistor may serve as the first output terminal, and a connection node between the second resistive element and the second N-type transistor may serve as the second output terminal.

According to Aspect 2 described above, when the power switch is turned on to activate the gate control circuit, the gate voltage of the first P-type transistor and the gate voltage of the second P-type transistor are controlled to the low level. When the power switch is turned off, the gate voltage of the first P-type transistor is controlled to the potential equal to the potential of the first power supply terminal, that is, the first power source and the gate voltage of the second P-type transistor is controlled to the potential equal to the potential of the second power supply terminal, that is, the second power source.

In Aspect 3 of the present invention, the gate control circuit may include a fifth P-type transistor and a first N-type transistor connected in series between the first power supply terminal and the earth potential and a sixth P-type transistor and a second N-type transistor connected in series between the second power supply terminal and the earth potential. The gate of the first N-type transistor and the gate of the second N-type transistor are connected to the control signal terminal, the gate of the fifth P-type transistor and the gate of the sixth P-type transistor may be connected to the earth potential, a connection node between the fifth P-type transistor and the first N-type transistor may serve as the first output terminal, and a connection node between the fifth P-type transistor and the second N-type transistor may serve as the second output terminal.

According to Aspect 3 described above, when the power switch is turned on to activate the gate control circuit, the gate voltage of the first P-type transistor and the gate voltage of the second P-type transistor are controlled to the low level. When the power switch is turned off, the gate voltage of the first P-type transistor is controlled to the potential equal to the potential of the first power supply terminal, that is, the first power source and the gate voltage of the second P-type transistor is controlled to the potential equal to the potential of the second power supply terminal, that is, the second power source.

In Aspect 4 of the invention, the gate control circuit may include a seventh P-type transistor and a first N-type transistor connected in series between the first power supply terminal and the earth potential and an eighth P-type transistor and a second N-type transistor connected in series between the second power supply terminal and the earth potential. Here, the gate of the first N-type transistor, the gate of the second N-type transistor, the gate of the seventh P-type transistor, and the gate of the eighth P-type transistor may be connected to the control signal terminal, a connection node between the seventh P-type transistor and the first N-type transistor may serve as the first output terminal, and a connection node between the eighth P-type transistor and the second N-type transistor may serve as the second output terminal.

According to Aspect 4 described above, when the power switch is turned on to activate the gate control circuit, the gate voltage of the first P-type transistor and the gate voltage of the second P-type transistor are controlled to the low level. When the power switch is turned off, the gate voltage of the first P-type transistor is controlled to the potential equal to the potential of the first power supply terminal, that is, the first power source and the gate voltage of the second P-type transistor is controlled to the potential equal to the potential of the second power supply terminal, that is, the second power source.

In Aspect 5 of the invention, the well-potential control circuit may include a third P-type transistor connected between the first power supply terminal and the output terminal and a fourth P-type transistor connected between the second power supply terminal and the output terminal. Here, the gate of the third P-type transistor may be connected to the second power supply terminal and the gate of the fourth P-type transistor may be connected to the first power supply terminal.

According to Aspect 5 described above, two P-type transistors are omitted in comparison with the conventional well-potential control circuit, thereby accomplishing the decrease in area.

In Aspect 6 of the invention, a first capacitive element may be connected between the first power source and the gate of the first P-type transistor, and a second capacitive element may be connected between the second power source and the gate of the second P-type transistor.

According to Aspect 6 described above, when a spike-shaped noise appears in a power source and a voltage difference is generated between the gate and the source of the first P-type transistor or a voltage difference is generated between the gate and the source of the second P-type transistor, the power switch in the OFF state can be instantaneously turned on and thus the noise can be propagated between the first power source and the second power source. Accordingly, by connecting the first capacitive element between the first power source and the gate of the first P-type transistor and connecting the second capacitive element between the second power source and the gate of the second P-type transistor, or by connecting only one, it is possible to suppress the potential difference between the gate and the source of the first P-type transistor type transistor the potential difference between the gate and the source of the second P-type transistor even when a spike-shaped noise appears in the power source.

According to Aspect 7 of the invention, there is provided a power switching circuit comprising: a first P-type transistor and a second P-type transistor connected in series between a first power source and a second power source; a gate control circuit including a first resistive element connected between the first power source and the gate of the first P-type transistor, a second resistive element connected between the second power source and the gate of the second P-type transistor, a sixth N-type transistor connected between the gate of the second P-type transistor and an earth potential, a third resistive element, a fourth resistive element, and a seventh N-type transistor connected in series between the first power source and the earth potential, a first operational amplifier of which a normal input terminal is connected to a connection node between the third resistive element and the fourth resistive element, a wire for connecting an inverted input of the first operational amplifier to the second power source, a fifth N-type transistor connected between the gate of the first P-type transistor and the output of the first operational amplifier, a control signal terminal connected to the gate of the fifth N-type transistor, the gate of the sixth n-type transistor, and the gate of the seventh N-type transistor, a first output terminal connected to the gate of the first P-type transistor, and a second output terminal connected to the gate of the second P-type transistor; and a well-potential control circuit including a first power supply terminal connected to the first power source, a second power supply terminal connected to the second power source, and an output terminal connected to the well of the first P-type transistor and the well of the second P-type transistor, wherein the well-potential control circuit outputs a voltage equal to the voltage of the first power source to the output terminal when the voltage of the first power source is higher than the voltage of the second power source, and outputs a voltage equal to the voltage of the second power source when the voltage of the second power source is higher than the voltage of the first power source.

According to Aspect 7 described above, the first power source serves as a source and the second power source as a destination. In this case, the supply or blocking of a voltage smaller than the voltage of the first power source to the second power source can be controlled by the use of the control signal. The gate voltage of the first P-type transistor is controlled by the first operational amplifier so that the voltage determined by the ratio of the resistance of the third resistive element, the resistance of the fourth resistive element, and the ON resistance of the seventh N-type transistor is equal to the voltage of the second power source, and thus a voltage is supplied to the second power source, thereby controlling the supply and the blocking of a voltage.

In Aspect 8 of the invention, an inspecting power supply terminal may be provided to the connection node between the first P-type transistor and the second P-type transistor.

According to Aspect 8 described above, by providing the inspecting power supply terminal, the power supply path is changed from two stages of P-type transistors to one stage of P-type transistor. Accordingly, the ON resistance is reduced with the same transistor size and the voltage drop is suppressed, thereby constructing a power switch with high performance.

According to Aspect 9 of the invention, there is provided a power switching circuit comprising: a ninth P-type transistor and a tenth P-type transistor connected in series between a first power source and a second power source; an eleventh P-type transistor connected between a connection node between the ninth P-type transistor and the tenth P-type transistor and a third power source; a 3-power gate control circuit including a first power supply terminal connected to the first power source, a second power supply terminal connected to the second power source, a third power supply terminal connected to the third power source, a control signal terminal to which a control signal is input, a first output terminal connected to the gate of the ninth P-type transistor, a second output terminal connected to the gate of the tenth P-type transistor, and a third output terminal connected to the gate of the eleventh P-type transistor; a 3-power well-potential control circuit including a first power supply terminal connected to the first power source, a second power supply terminal connected to the second power source, a third power supply terminal connected to the third power source, and an output terminal connected to the well of the ninth P-type transistor, the well of the tenth P-type transistor, and the well of the eleventh P-type transistor; and an inspecting power supply terminal connected to a connection node among the ninth P-type transistor, a tenth P-type transistor, and the eleventh P-type transistor, wherein when the control signal is in a low level, the 3-power gate control circuit outputs a voltage equal to the voltage of the first power source to the first output terminal, outputs a voltage equal to the voltage of the second power source to the second output terminal, and outputs a voltage equal to the voltage of the third power source to the third output terminal, and when the control signal is in a high level, the 3-power gate control circuit outputs the earth potential to the first output terminal, the second output terminal, and the third output terminal, and wherein the 3-power well-potential control circuit outputs a voltage equal to the voltage of the first power source to the output terminal when the voltage of the first power source is higher than the voltage of the second power source and the voltage of the third power source, and outputs a voltage equal to the voltage of the second power source to the output terminal when the voltage of the second power source is higher than the voltage of the first power source and the voltage of the third power source, and outputs a voltage equal to the voltage of the third power source to the output terminal when the voltage of the third power source is higher than the voltage of the first power source and the voltage of the second power source.

According to Aspect 9 described above, the gate control circuit can switch the power switch between the ON state and the OFF state by the use of the control signal. Accordingly, when the power switch is turned on by the gate control circuit, the gate voltage of the ninth P-type transistor, the gate voltage of the tenth P-type transistor, and the gate voltage of the eleventh P-type transistor are controlled to the low level. When the power switch is turned off by the gate control circuit, the gate voltage of the ninth P-type transistor is controlled to the voltage equal to the voltage of the first power supply terminal, that is, the voltage of the first power source, the gate voltage of the tenth P-type transistor is controlled to the voltage equal to the voltage of the second power source, and the gate voltage of the eleventh P-type transistor is controlled to the voltage equal to the voltage of the third power source. Even when a voltage difference is generated between different power sources in the OFF state of the power switch, which was a problem in the conventional analog switch, the gate voltages of the eleventh P-type transistor, the tenth P-type transistor, and the ninth P-type transistor can be controlled to the voltages of the first power source, the second power source, and the third power source by the use of the inspecting power supply terminal. Accordingly, when any one among the voltage of the first power source, the voltage of the second power source, and the voltage of the third power source is higher than the others, it is possible to completely break current. In addition, by providing the inspecting power supply terminal, the power supply path is changed from two stages of P-type transistors to one stage of P-type transistor. Accordingly, the ON resistance is reduced with the same transistor size and the voltage drop is suppressed thereby constructing a power switch with high performance. As a result, power can be supplied to a plurality of power sources from one inspecting power supply terminal.

In Aspect 10 of the invention, the 3-power gate control circuit may include a fifth resistive element and an eighth N-type transistor connected in series between the first power supply terminal and the earth potential, a sixth resistive element and a ninth N-type transistor connected in series between the second power supply terminal and the earth potential, and a seventh resistive element and a tenth N-type transistor connected in series between the third power supply terminal and the earth potential. Here, the gate of the eighth N-type transistor, the gate of the ninth N-type transistor, and the gate of the tenth N-type transistor may be connected to the control signal terminal. A connection node between the fifth resistive element and the eighth N-type transistor may serve as the first output terminal, a connection node between the sixth resistive element and the ninth N-type transistor may serve as the second output terminal, and a connection node between the seventh resistive element and the tenth N-type transistor may serve as the third output terminal.

According to Aspect 10 described above, when the power switch is turned on to activate the gate control circuit, the gate voltage of the ninth P-type transistor, the gate voltage of the tenth P-type transistor, and the gate voltage of the eleventh P-type transistor are controlled to the low level. When the power switch is turned off, the gate voltage of the ninth P-type transistor is controlled to the potential equal to the potential of the first power source, the gate voltage of the tenth P-type transistor is controlled to the potential equal to the potential of the second power source, and the gate voltage of the eleventh P-type transistor is controlled to the potential equal to the potential of the third power source.

In Aspect 11 of the invention the 3-power well-potential control circuit may include two well-potential control circuits. Here, a first power supply terminal of the 3-power well-potential control circuit may be connected to a first power supply terminal of the first well-potential control circuit, a second power supply terminal of the 3-power well-potential control circuit may be connected to a second power supply terminal, a third power supply terminal of the 3-power well-potential control circuit may be connected to a second power supply terminal of the second well-potential control circuit, an output terminal of the first well-potential control circuit may be connected to a first power supply terminal of the second well-potential control circuit, and an output terminal of the second well-potential control circuit may serve as an output terminal of the 3-power well-potential control circuit.

According to the configuration of Aspect 11 described above, the 3-power well-potential control circuit is constructed by combining two 2-power well-potential control circuits. Here, the first power supply terminal of the 3-power well-potential control circuit may be connected to the first power supply terminal of the first well-potential control circuit, the second power supply terminal of the 3-power well-potential control circuit may be connected to the second power supply terminal, the third power supply terminal of the 3-power well-potential control circuit may be connected to the second power supply terminal of the second well-potential control circuit, the output terminal of the first well-potential control circuit may be connected to the first power supply terminal of the second well-potential control circuit, and the output terminal of the second well-potential control circuit may serve as the output terminal of the 3-power well-potential control circuit. In operation, the two-power well-potential control circuits are constructed in two stages and two power supply terminals are increased to three power supply terminals. In this way, the circuit capable of outputting the highest voltage among the voltage of the three power sources necessary for the 3-power well-potential control circuit according to Aspect 9 described above.

According to Aspect 12 of the invention, there is provided a power switching circuit comprising: an eleventh N-type transistor connected between a first power source and a second power source; an eighth resistive element connected between the gate of the eleventh N-type transistor and the earth potential; and an inspecting signal input terminal connected to a connection node between the gate of the eleventh N-type transistor and the eighth resistive element.

According to the configuration of Aspect 12 described above, by constructing a switch out of only N-type transistors without using p-type transistors, it is possible to turn the inspecting signal input terminal to the open state and to turn the gate of the eleventh N-type transistor to the earth potential by the use of the eighth resistive element, when the switch is turned off. Accordingly, even when any one of the voltage of the first power source and the voltage of the second power source is higher than the other, it is possible to completely break current. When the switch is turned on, the control is carried out by applying a high voltage to the inspecting signal input terminal and when it is used normally, the switch can be turned off by turning the inspecting signal input terminal to the open state.

According to Aspect 13 of the invention, there is provided a power switching circuit comprising: an eleventh N-type transistor connected between a first power source and a second power source; an eighth resistive element connected between the gate of the eleventh N-type transistor and the earth potential; and a twelfth P-type transistor connected between a connection node between the gate of the eleventh N-type transistor and the eighth resistive element, wherein an inverted control signal is input to the gate thereof.

According to the configuration of Aspect 13 described above, by constructing a switch out of only N-type transistors without using p-type transistors, it is possible to turn the gate of the twelfth P-type transistor to the high level, to turn off the gate of the twelfth N-type transistor, and to turn the gate of the eleventh P-type transistor to the earth potential by the use of the eighth resistive element, when the switch is turned off. Accordingly, even when any one of the voltage of the first power source and the voltage of the second power source is higher than the other, it is possible to completely break current. When the switch is turned on, the switch can be controlled by applying the low level voltage to the inverted control signal and when it is used normally, the switch can be controlled by applying the high level to the inverted control signal.

According to Aspect 14 of the invention, there is provided a power switching circuit comprising: an eleventh N-type transistor connected between a first power source and a second power source; an eighth resistive element connected between the gate of the eleventh N-type transistor and the earth potential; a twelfth N-type transistor connected between the first power source and a third power source; a ninth resistive element connected between the gate of the eleventh N-type transistor and the earth potential; a thirteenth N-type transistor connected between the first power source and a fourth power source; a tenth resistive element connected between the gate of the thirteenth N-type transistor and the earth potential; and an inspecting signal input terminal connected in common to a connection node between the gate of the eleventh N-type transistor and the eighth resistive element, a connection node between the gate of the twelfth N-type transistor and the ninth resistive element, and a connection node between the gate of the thirteenth N-type transistor and the tenth resistive element.

According to the configuration of Aspect 14 described above when the power switching circuit according to Aspect 12 is disposed between the first power source and the second power source, between the first power source and the third power source, and between the first power source and the fourth power source, and the three power switches can be simultaneously controlled, it is possible to share one inspecting signal input terminal with each other. Accordingly, it is possible to reduce the number of terminals by sharing the inspecting signal input terminal.

According to Aspect 15 of the invention, there is provided a power switching circuit comprising: an eleventh N-type transistor which is connected between a first power source and a second power source and of which the well potential can be controlled by a triple well process; an eighth resistive element connected between the gate of the eleventh N-type transistor and the earth potential; an inspecting well-potential control terminal connected to the well of the eleventh N-type transistor; and an inspecting signal input terminal connected to the gate of the eleventh N-type transistor.

According to the configuration of Aspect 15 described above, similarly to Aspect 12, by constructing a switch out of only N-type transistors without using p-type transistors, it is possible to turn the inspecting signal input terminal to the open state and to turn the gate of the eleventh N-type transistor to the earth potential by the use of the eighth resistive element, when the switch is turned off. Accordingly, even when any one of the voltage of the first power source and the voltage of the second power source is higher than the other, it is possible to completely break current. When the switch is turned on, the switch is controlled by applying a high voltage to the inspecting signal input terminal and when it is used normally, the switch can be turned off by turning the inspecting signal input terminal to the open state. In addition, the well potential of the N-type transistors can be controlled by the use of a triple well process. By inputting a voltage smaller than or equal to the earth potential from the well-potential controlling voltage input terminal, the threshold voltage of the eleventh N-type transistor is lowered by a back bias effect, thereby suppressing the voltage drop in the state that the switch is turned on.

According to Aspect 16 of the invention, there is provided a power switching circuit comprising: an eleventh N-type transistor which is connected between a first power source and a second power source and of which the well potential can be controlled by a triple well process; an eighth resistive element connected between the gate of the eleventh N-type transistor and the earth potential; an inspecting well-potential control terminal connected to the well of the eleventh N-type transistor; and a twelfth P-type transistor connected to a connection node between the gate of the eleventh N-type transistor and the eighth resistive element, wherein an inverted control signal is input to the gate thereof.

According to the configuration of Aspect 16 described above, similarly to Aspect 13, by constructing a switch out of only N-type transistors without using p-type transistors, it is possible to turn the gate of the twelfth P-type transistor to the high level, to turn off the twelfth P-type transistor, and to turn the gate of the eleventh N-type transistor to the earth potential by the use of the eighth resistive element, when the switch is turned off. Accordingly, even when any one of the voltage of the first power source and the voltage of the second power source is higher than the other, it is possible to completely break current. When the switch is turned on, the switch is controlled by applying a voltage of a low level to the inverted control signal and when the switch is turned off, the switch is controlled by applying a voltage of a high level to the inverted control signal. In addition, the well potential of the N-type transistors can be controlled by the use of a triple well process. By inputting a voltage smaller than or equal to the earth potential from the well-potential controlling voltage input terminal, the threshold voltage of the eleventh N-type transistor is lowered by a back bias effect, thereby suppressing the voltage drop in the state that the switch is turned on.

According to Aspect 17 of the invention, there is provided a power switching circuit comprising: a first P-type transistor and a second P-type transistor connected in series between a first power source and a second power source; a fourteenth N-type transistor connected between the first power source and the second power source; a PN gate control circuit including a first power supply terminal connected to the first power source, a second power supply terminal connected to the second power source, a control signal terminal to which a control signal is input, an inverted control signal terminal to which an inverted control signal is input, a first output terminal connected to the gate of the first P-type transistor, a second output terminal connected to the gate of the second P-type transistor, and a third output terminal connected to the gate of the fourteenth N-type transistor; and a well-potential control circuit including a first power supply terminal connected to the first power source, a second power supply terminal connected to the second power source, and an output terminal connected to the well of the first P-type transistor and the well of the second P-type transistor, wherein when the control signal is in a low level and the inverted control signal is in a high level, the PN gate control circuit outputs a voltage equal to the voltage of the first power source to the first output terminal, outputs a voltage equal to the voltage of the second power source to the second output terminal, and outputs the earth potential to the third output terminal, and when the control signal is in a high level and the inverted control signal is in a low level, the PN gate control circuit outputs the earth potential to the first output terminal and the second output terminal and outputs a voltage equal to the voltage of the first power source to the third output terminal, and wherein the well-potential control circuit outputs a voltage equal to the voltage of the first power source to the output terminal when the voltage of the first power source is higher than the voltage of the second power source, and outputs a voltage equal to the voltage of the second power source to the output terminal when the voltage of the second power source is higher than the voltage of the first power source.

Accordingly to the configuration of Aspect 17 described above, in comparison with the circuit of Aspect 1, since the switch section is constructed by the fourteenth N-type transistor in parallel to the first P-type transistor and the second P-type transistor connected in series, the ON resistance of the switch section is lowered with the lower voltage of the power source, thereby suppressing the voltage drop in the ON state of the switch section.

In Aspect 18 of the invention, the PN gate control circuit further may include an eleventh resistive element and a fifteenth N-type transistor connected in series between the first power supply terminal and the earth potential, a twelfth resistive element and a sixteenth N-type transistor connected in series between the second power supply terminal and the earth potential, and a thirteenth P-type transistor and a thirteenth resistive element connected in series between the first power source and the earth potential. Here, the gate of the fifteenth N-type transistor and the gate of the sixteenth N-type transistor may be connected to the control signal terminal, the gate of the thirteenth P-type transistor may be connected to the inverted control signal terminal, a connection node between the eleventh resistive element and the fifteenth N-type transistor may be connected to the first output terminal, a connection node between the twelfth resistive element and the sixteenth N-type transistor may be connected to the second output terminal, and a connection node between the thirteenth P-type transistor and the thirteenth resistive element may be connected to the third output terminal.

According to the configuration of Aspect 18 described above, the operations of the PN gate control circuit according to Aspect 17 described above are described. That is, when the power switch is turned off, the gate voltage of the first P-type transistor and the gate voltage of the second P-type transistor are controlled to the low level and the gate voltage of the fourteenth N-type transistor is controlled to the voltage equal to the voltage of the first power source. When the power switch is turned off, the gate voltage of the first P-type transistor is controlled to the voltage equal to the voltage of the first power source, the gate voltage of the second P-type transistor is controlled to the voltage equal to the voltage of the second power source, and the gate voltage of the fourteenth N-type transistor is controlled to the low level.

According to Aspect 19 of the invention, there is provided a power switching circuit comprising: a first P-type transistor and a second P-type transistor connected in series between a first power source and a second power source; a fourteenth N-type transistor connected between the first power source and the second power source; a fourteenth resistive element connected between the first power source and the gate of the first P-type transistor; a fifteenth resistive element connected between the second power source and the gate of the second P-type transistor; an eighteenth N-type transistor connected between the gate of the second P-type transistor and an earth potential; a seventeenth resistive element, an eighteenth resistive element, and a seventeenth N-type transistor connected in series between the first power source and the earth potential; a first operational amplifier of which a normal input terminal is connected to a connection node between the seventeenth resistive element and the eighteenth resistive element; a line for connecting an inverted input terminal of the first operational amplifier and the second power source; a twentieth N-type transistor connected between the gate of the first P-type transistor and an output terminal of the first operational amplifier; a sixteenth resistive element connected between the gate of the fourteenth N-type transistor and the earth potential; a nineteenth N-type transistor connected between the gate of the fourteenth N-type transistor and the output terminal of the first operational amplifier; a control signal terminal connected to the gate of the seventeenth N-type transistor, the gate of the eighteenth N-type transistor, the gate of the nineteenth N-type transistor, and the gate of the twentieth N-type transistor; and a well-potential control circuit having a first power supply terminal, a second power supply terminal, and an output terminal, wherein the well-potential control circuit outputs a voltage equal to the voltage of the first power source to the output terminal when the voltage of the first power source is higher than the voltage of the second power source, and outputs a voltage equal to the voltage of the second power source to the output terminal when the voltage of the second power source is higher than the voltage of the first power source.

According to the configuration of Aspect 19 described above, the first power source serves as a source and the second power source as a destination. In this case, the supply or blocking of a voltage smaller than the voltage of the first power source to the second power source can be controlled by the use of the control signal. The gate voltage of the first P-type transistor is controlled by the second operational amplifier so that the voltage determined by the ratio of the resistance of the seventeenth resistive element, the resistance of the eighteenth resistive element, and the ON resistance of the seventeenth N-type transistor is equal to the voltage of the second power source, and thus a voltage is supplied to the second power source, thereby controlling the supply and the blocking of a voltage.

In Aspect 20 of the invention, the 3-power well-potential control circuit may include first, second, and third 3-power voltage determining circuits, and each of the first, second, and third 3-power voltage determining circuits may include fourteenth and fifteenth P-type transistors connected in series between the power supply terminal and the output terminal and a twentieth N-type transistor connected between the power supply terminal and the output terminal. The gate of the twentieth N-type transistor may be connected to the power input terminal. The first power supply terminal of the 3-power well-potential control circuit may be connected to a power supply terminal of the first 3-power voltage determining circuit, the second power supply terminal of the 3-power well-potential control circuit may be connected to a power supply terminal of the second 3-power voltage determining circuit, and the third power supply terminal of the 3-power well-potential control circuit may be connected to a power supply terminal of the third 3-power voltage determining circuit. A first voltage input terminal and a second voltage input terminal, which are the gates of the fourteenth and fifteenth P-type transistors of the first 3-power voltage determining circuit, may be connected to the second power supply terminal of the 3-power well-potential control circuit and the third power supply terminal of the 3-power well-potential control circuit, respectively, or to the third power supply terminal of the 3-power well-potential control circuit and the second power supply terminal of the 3-power well-potential control circuit, respectively. A first voltage input terminal and a second voltage input terminal, which are the gates of the fourteenth and fifteenth P-type transistors of the second 3-power voltage determining circuit, may be connected to the first power supply terminal of the 3-power well-potential control circuit and the third power supply terminal of the 3-power well potential control circuit, respectively, or to the third power supply terminal of the 3-power well-potential control circuit and the first power supply terminal of the 3-power well-potential control circuit, respectively. A first voltage input terminal and a second voltage input terminal, which are the gates of the fourteenth and fifteenth P-type transistors of the third 3-power voltage determining circuit, may be connected to the first power supply terminal of the 3-power well-potential control circuit and the second power supply terminal of the 3-power well-potential control circuit, respectively, or to the second power supply terminal of the 3-power well-potential control circuit and the first power supply terminal of the 3-power well-potential control circuit, respectively. The output terminal of the 3-power well-potential control circuit may be connected to output terminals of the first, second, and third 3-power voltage determining circuits.

According to the configuration of Aspect 20 described above, each 3-power voltage determining circuit outputs the voltage equal to the voltage of the power supply terminal to the output terminal, only when the potential of the power supply terminal is higher than those of the first and second voltage input terminals and otherwise, the 3-power voltage determining circuit is in the high impedance state. By combining three 3-power voltage determining circuits, the circuit capable of outputting the highest voltage among the voltages of the three different power sources, which is necessary for the 3-power well-potential control circuit of Aspect 9, can be embodied.

In Aspect 21 of the invention, the 3-power well-potential control circuit may include first, second, and third 3-power voltage determining circuits, and each of the first, second, and third 3-power voltage determining circuits may include fourteenth and fifteenth P-type transistors connected in series between the power supply terminal and the output terminal. The connections between the first, second, and third power supply terminal of the 3-power well potential control circuit and the first voltage input terminal and the second voltage input terminal of the 3-power voltage determining circuits are similar to those described in Aspect 20.

According to the configuration of Aspect 21 described above, each 3-power voltage determining circuit outputs the voltage equal to the voltage of the power supply terminal to the output terminal, only when the potential of the power supply terminal is higher than those of the first and second voltage input terminals and otherwise, the 3-power voltage determining circuit is in the high impedance state. By combining three 3-power voltage determining circuits, the circuit capable of outputting the highest voltage among the voltages of the three different power sources, which is necessary for the 3-power well-potential control circuit of Aspect 9, can be embodied.

According to Aspect 22 of the invention, there is provided a power switching circuit comprising: an eighteenth P-type transistor connected between an inspecting power supply terminal and a first power source, a nineteenth P-type transistor connected between the inspecting power supply terminal and a second power source, a twentieth P-type transistor connected between the inspecting power supply terminal and a third power source, a twenty first P-type transistor connected between the inspecting power supply terminal and a fourth power source, and a twenty second P-type transistor connected between the inspecting power supply terminal and a fifth power source; a 5-power gate control circuit including a first power supply terminal connected to the first power source, a second power supply terminal connected to the second power source, a third power supply terminal connected to the third power source, a fourth power supply terminal connected to the fourth power source, a fifth power supply terminal connected to the fifth power source, a control signal terminal to which a control signal is input, a first output terminal connected to the gate of the eighteenth P-type transistor, a second output terminal connected to the gate of the nineteenth P-type transistor, a third output terminal connected to the gate of the twentieth P-type transistor, a fourth output terminal connected to the gate of the twenty first P-type transistor, and a fifth output terminal connected to the gate of the twenty second P-type transistor; a 5-power well-potential control circuit including a first power supply terminal connected to the first power source, a second power supply terminal connected to the second power source, a third power supply terminal connected to the third power source, a fourth power supply terminal connected to the fourth power source, a fifth power supply terminal connected to the fifth power source, and an output terminal simultaneously connected to the well of the eighteenth P-type transistor, the well of the nineteenth P-type transistor, the well of the twentieth P-type transistor, the well of the twenty first P-type transistor, and the well of the twenty second P-type transistor, wherein when the control signal is in a low level, the 5-power gate control signal outputs a voltage equal to the voltage of the first power source to the first output terminal, outputs a voltage equal to the voltage of the second power source to the second output terminal, outputs a voltage equal to the voltage of the third power source to the third output terminal, outputs a voltage equal to the voltage of the fourth power source to the fourth output terminal, and outputs a voltage equal to the voltage of the fifth power source to the fifth output terminal, and when the control signal is in a high level, the 5-power gate control circuit outputs the earth potential to the first output terminal, the second output terminal, the third output terminal, the fourth output terminal, and the fifth output terminal, and wherein the 5-power well-potential control circuit outputs a voltage equal to the voltage of the first power source to the output terminal when the voltage of the first power source is higher than the voltage of the second power source, the voltage of the third power source, the voltage of the fourth power source, and the voltage of the fifth power source, outputs a voltage equal to the voltage of the second power source to the output terminal when the voltage of the second power source is higher than the voltage of the first power source, the voltage of the third power source, the voltage of the fourth power source, and the voltage of the fifth power source, outputs a voltage equal to the voltage of the third power source to the output terminal when the voltage of the third power source is higher than the voltage of the first power source, the voltage of the second power source, the voltage of the fourth power source, and the voltage of the fifth power source, outputs a voltage equal to the voltage of the fourth power source to the output terminal when the voltage of the fourth power source is higher than the voltage of the first power source, the voltage of the second power source, the voltage of the third power source, and the voltage of the fifth power source, and outputs a voltage equal to the voltage of the fifth power source to the output terminal when the voltage of the fifth power source is higher than the voltage of the first power source, the voltage of the second power source, the voltage of the third power source, and the voltage of the fourth power source.

According to the configuration of Aspect 22 described above, since the 5-power gate control circuit can switch the power switch connected between the inspecting power supply terminal and the power sources between the ON state and the OFF state by the use of the control signal. Accordingly, when the power switch is turned on by the gate control circuit, the gate voltages of the eighteenth, nineteenth, twentieth, twenty first, and twenty second P-type transistors are controlled to the low level. When the power switch is turned off by the gate control circuit, the gate voltage of the eighteenth P-type transistor is controlled to the voltage equal to the voltage of the first power source, the gate voltage of the nineteenth P-type transistor is controlled to the voltage equal to the voltage of the second power source, the gate voltage of the twentieth P-type transistor is controlled to the voltage equal to the voltage of the third power source, the gate voltage of the twenty first P-type transistor is controlled to the voltage equal to the voltage of the fourth power source, and the gate voltage of the twenty second P-type transistor is controlled to the voltage equal to the voltage of the fifth power source.

Accordingly, even when a voltage difference is generated between different power sources in the OFF state of the power switch connecting the different power sources to each other, which was a problem in the conventional analog switch, the gate voltages of the eighteenth, nineteenth, twentieth, twenty first, and twenty second P-type transistors can be controlled to the voltages of the first, second, third, fourth, and fifth power sources by the use of the inspecting power supply terminal. Accordingly, when any one of the voltages of the first, second, third, fourth, and fifth power sources is higher than the others, it is possible to completely break current.

In addition, by providing the inspecting power supply terminal, the power supply path is changed from two stages of P-type transistors to one stage of P-type transistor. Accordingly, the ON resistance is reduced with the same transistor size and the voltage drop is suppressed, thereby constructing a power switch with high performance. As a result, power can be supplied to a plurality of power sources from one inspecting power supply terminal.

In Aspect 23 of the invention, the 5-power well-potential control circuit may include first, second, third, fourth, and fifth 5-power voltage determining circuits, and each of the first, second, third, fourth, and fifth 5-power voltage determining circuits may include a power supply terminal, first, second, third, and fourth power input terminals, and an output terminal. The power supply terminal of the first 5-power voltage determining circuit may be connected to the first power supply terminal of the 5-power well-potential control circuit, and the first, second, third, and fourth voltage input terminals of the first 5-power voltage determining circuit may be connected to any one of the second power supply terminal, the third power supply terminal, the fourth power supply terminal, and the fifth power supply terminal of the 5-power well-potential control circuit. The power supply terminal of the second 5-power voltage determining circuit may be connected to the second power supply terminal of the 5-power well-potential control circuit, and the first, second, third, and fourth voltage input terminals of the second 5-power voltage determining circuit may be connected to any one of the first power supply terminal, the third power supply terminal, the fourth power supply terminal, and the fifth power supply terminal of the 5-power well-potential control circuit. The power supply terminal of the third 5-power voltage determining circuit may be connected to the third power supply terminal of the 5-power well-potential control circuit, and the first, second, third, and fourth voltage input terminals of the third 5-power voltage determining circuit may be connected to any one of the first power supply terminal, the second power supply terminal, the fourth power supply terminal, and the fifth power supply terminal of the 5-power well-potential control circuit. The power supply terminal of the fourth 5-power voltage determining circuit may be connected to the fourth power supply terminal of the 5-power well-potential control circuit, and the first, second, third, and fourth voltage input terminals of the fourth 5-power voltage determining circuit may be connected to any one of the first power supply terminal, the second power supply terminal, the third power supply terminal, and the fifth power supply terminal of the 5-power well-potential control circuit. The power supply terminal of the fifth 5-power voltage determining circuit may be connected to the fifth power supply terminal of the 5-power well-potential control circuit, and the first, second, third, and fourth voltage input terminals of the fifth 5-power voltage determining circuit may be connected to any one of the first power supply terminal, the second power supply terminal, the third power supply terminal, and the fourth power supply terminal of the 5-power well-potential control circuit. All the output terminals of the 5-power voltage determining circuits may be connected to one node and serves as an output terminal of the 5-power well-potential control circuit.

According to the configuration of Aspect 23 described above, the 5-power voltage determining circuit outputs the voltage equal to the voltage of the power supply terminal to the output terminal, only when the potential of the power supply terminal is higher than those of the first, second, third, and fourth voltage input terminals and otherwise, the 5-power voltage determining circuit is in the high impedance state. By combining five 5-power voltage determining circuits, the circuit capable of supplying the highest voltage among the voltages of the five different power sources, which is necessary for the 5-power well-potential control circuit of Aspect 22, as the substrate potentials of the eighteenth, nineteenth, twentieth, twenty first, and twenty second P-type transistors can be embodied.

In Aspect 24 of the invention, the 5-power gate control circuit may include first, second, third, fourth, and fifth gate signal circuits, and each of the first, second, third, fourth, and fifth gate signal circuits may include a power supply terminal, a control signal terminal, and an output terminal. All the control signal terminals of the first, second, third, fourth, and fifth gate signal circuits may be connected to the control signal terminal of the 5-power gate control signal. The power supply terminals of the first, second, third, fourth, and fifth gate signal circuits may be connected to the first, second, third, fourth, and fifth power supply terminals of the 5-power gate control circuit, respectively. The output terminals of the first, second, third, fourth, and fifth gate signal circuits may be connected to the first, second, third, fourth, and fifth output terminals of the 5-power gate control circuit, respectively.

According to the configuration of Aspect 24 described above, when the control signal input to the gate signal circuit is in the low level, the voltage equal to the voltage of the power supply terminal is output and when the control signal input to the gate signal circuit is in the high level, the earth voltage is output from the gate signal circuit. By using five gate signal circuits, the 5-power gate control circuit for controlling the gate voltages of the eighteenth, nineteenth, twentieth, twenty first, and twenty second P-type transistor can be embodied, which is necessary for Aspect 22.

In Aspect 25 of the invention, the 5-power voltage determining circuit may include twenty third, twenty fourth, twenty fifth, and twenty sixth P-type transistors connected in series between the power supply terminal and the output terminal and a twenty first N-type transistor connected between the power supply terminal and the output terminal. Here, the gate of the twenty first N-type transistor may be connected to the power supply terminal, and the gates of the twenty third, twenty fourth, twenty fifth, and twenty sixth P-type transistors may serve as the first, second, third, and fourth voltage input terminals, respectively.

According to the configuration of Aspect 25 described above, the 5-power voltage determining circuit outputs the voltage equal to the voltage of the power supply terminal to the output terminal, only when the potential of the power supply terminal is higher than the first, second, third, and fourth voltage input terminals and otherwise, the 5-power voltage determining circuit is in the high impedance state. Accordingly, the operation of the 5-power voltage determining circuit necessary for Aspect 23 can be embodied.

In Aspect 26 of the invention, the 5-power voltage determining circuit may include twenty seventh, twenty eighth, twenty ninth, and thirtieth P-type transistors connected in series between the power supply terminal and the output terminal, and the gates of the twenty seventh, twenty eighth, twenty ninth, and thirtieth P-type transistors may serve as the first, second, third, and fourth voltage input terminals, respectively.

According to the configuration of Aspect 26 described above, the 5-power voltage determining circuit outputs the voltage equal to the voltage of the power supply terminal to the output terminal only when the potential of the power supply terminal is higher than the first, second, third, and fourth voltage input terminals and otherwise, the 5-power voltage determining circuit is in the high impedance state. Accordingly, the operation of the 5-power voltage determining circuit necessary for Aspect 23 can be embodied.

In Aspect 27 of the invention, an inspecting control input terminal may be connected to the control signal terminal, and a twentieth resistive element connected in series between a connection node between the control signal terminal and the inspecting control input terminal and the earth potential may be further provided.

According to the configuration of Aspect 27 described above, even when the inspecting control input terminal is open, the control signal of the 5-power gate control circuit is not in an unfixed status, but can be fixed to a low level.

Aspects 9, 10, 11, 20, and 21 provide the power switches which can supply power to three separated power sources through the inspecting power supply terminal 14 and Aspects 22, 23, and 24 provides the power switches which can supply power to five separated power sources through the inspecting power supply terminal 14. However, a power switch which can supply power through the inspecting power supply terminal can be easily embodied in four separated power sources or six or more separated power sources, by enlarging the application of the circuit according to the present invention.

In a system-on-chip in which a plurality of functional blocks is integrated on one chip, a power source is provided every functional block, and a switch is disposed between the separated power sources, the power switching circuit according to the present invention can completely break a current even when a voltage difference is generated between the power sources of the functional blocks in the state that the switches connecting the power sources are turned off.

BRIEF DESCRIPTION OF THE PREFERRED EMBODIMENTS

Hereinafter, exemplary embodiments of the present invention will be described with reference to the attached drawings.

First Embodiment

Figure 1:
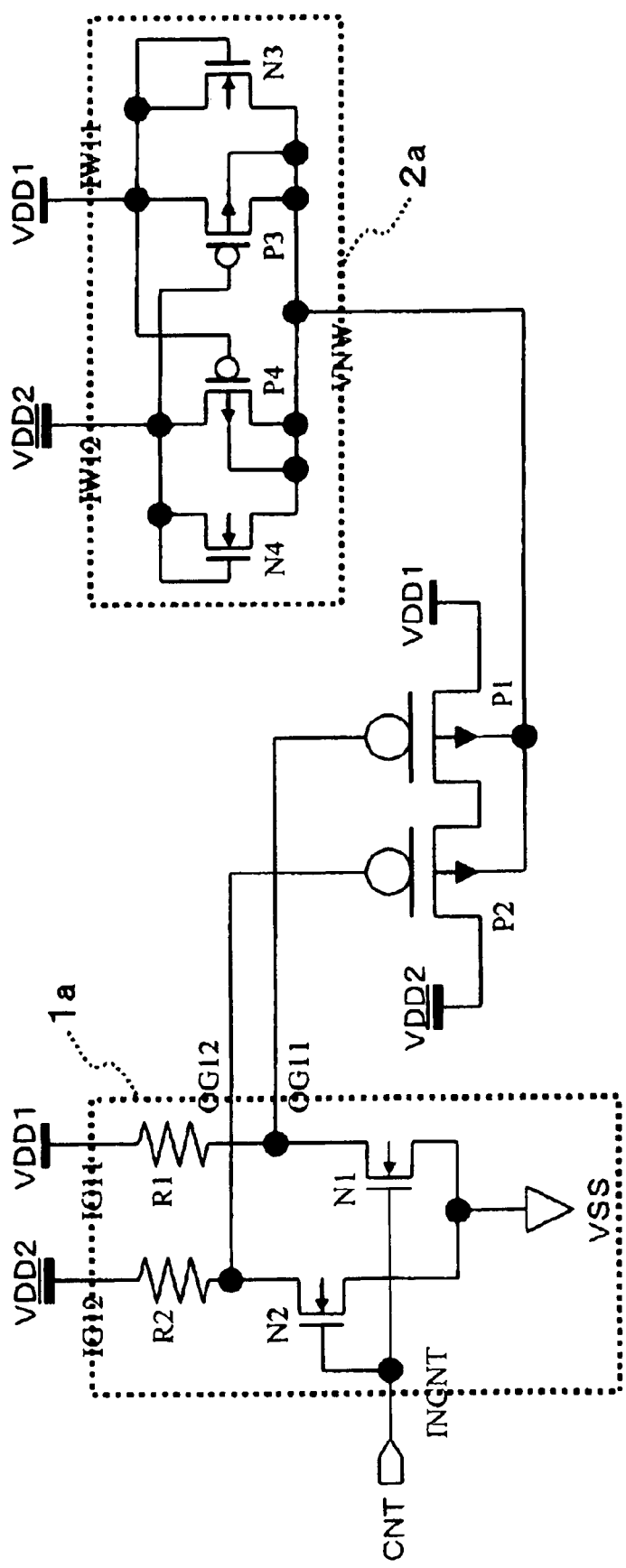
FIG. 1 is a circuit diagram illustrating a power switching circuit according to a first embodiment of the present invention.

FIG. 1 is a circuit diagram illustrating a power switching circuit according to a first embodiment of the present invention. In FIG. 1, reference numeral 1a denotes a gate control circuit having a control signal terminal INCT, a first power supply terminal IG11, and a second power supply terminal IG12 as input thereof and having a first output terminal OG11 and a second output terminal OG12 as output. Reference numeral P1 denotes a first P-type transistor of which the gate is connected to the first output terminal OG11 of the gate control circuit 1a, and reference numeral P2 denotes a second P-type transistor of which the gate is connected to the second output terminal OG12 of the gate control circuit, wherein the first P-type transistor P1 and the second P-type transistor P2 are connected in series between a first power source VDD1 and a second power source VDD2 and constitute a switch section. Reference numeral 2a denotes a well-potential control circuit using a first power supply terminal IW11 and a second power supply terminal IW12 as input terminals and using an output terminal VNW as an output terminal, wherein the output terminal VNW is connected to the well of the first P-type transistor P1 and the well of the second P-type transistor P2. The source of the first P-type transistor P1 is connected to the first power source VDD1 and the source of the second P-type transistor P2 is connected to the second power source VDD2.

First, a case that the power switching circuit according to the first embodiment is turned on is described. When a control signal CNT is in a high level, the gate control circuit 1a, as shown in Table 1, outputs a voltage subsequently equal to an earth voltage VSS to the first output terminal OG11 and the second output terminal OG12 and thus the first P-type transistor P1 and the second P-type transistor are all turned on.

TABLE 1

Operation of gate control circuit

| Input CNT | Output OG11 | Output OG12 |
| --- | --- | --- |
| Low level | Potential of IG11 | Potential of IG12 |
| High level | Potential of VSS | Potential of VSS |

In this state, when a voltage is supplied to the first power source VDD1, the voltage is propagated to the second power source VDD2 and when a voltage is supplied to the second power source VDD2, the voltage is propagated to the first power source VDD1.

Next, a case that the power switching circuit according to the first embodiment is turned off is described. When the control signal CNT is in a low level, the gate control circuit 1a, as shown in Table 1, outputs a voltage subsequently equal to the voltage of the first power source VDD1 to the first output terminal OG11 and outputs a voltage subsequently equal to that of the second power source VDD2 to the second output terminal OG12.

In this state, when voltages are supplied to the first power source VDD1 and the second power source VDD2 and the voltage of the second power source VDD2 is lower than that of the first power source VDD1, a voltage difference between the gate and the source of the first P-type transistor P1 is zero and thus the first P-type transistor P1 is completely turned off. In addition, a voltage difference between the gate and the source of the second P-type transistor P2 is zero and thus the second P-type transistor P2 is completely turned off.

When the voltage of the first power source VDD1 is lower than that of the second power source VDD2, the voltage difference between the gate and the source of the second P-type transistor P2 is zero and thus the second P-type transistor P2 is completely turned off. In addition, the voltage difference between the gate and the source of the first P-type transistor P1 is zero and thus the first P-type transistor P1 is completely turned off.

Accordingly, it can be told that the power switching circuit is completely turned off as a power switch when the voltage of the second power source VDD1 is lower than that of the first power source VDD1 and when the voltage of the first power source VDD1 is lower than that of the second power source VDD2.

In addition, even in any case that the power switching circuit is turned on or off, the well of the first P-type transistor P1 and the well of the second P-type transistor P2 are supplied with the higher voltage of the voltages of the first power source VDD1 and the second power source VDD2 by the well-potential control circuit 2a, as shown in Table 2. Accordingly, unnecessary leakage of current through a parasitic diode existing in the P-type transistors does not occur.

TABLE 2

Operation of well-potential control circuit

| Voltage relation between input IW11 and input IW12 | Output VNW |
| --- | --- |
| IW11 > IW12 | Potential of IW11 |
| IW11 < IW12 | Potential of IW12 |

A specific example of the gate control circuit is then described. In the gate control circuit 1a, a first resistive element R1 and a first N-type transistor N1 are connected in series between the first power supply terminal IG11 and the earth potential VSS, a second resistive element R2 and a second N-type transistor N2 are connected in series between the second power supply terminal IG12 and the earth potential VSS, and the gate of the first N-type transistor N1 and the gate of the second N-type transistor N2 are connected to the control signal terminal INCNT A connection node between the first resistive element R1 and the first N-type transistor N1 serves as the first output terminal OG11 and a connection node between the second resistive element R2 and the second N-type transistor N2 serves as the second output terminal OG12.

In the gate control circuit 1a, when the control signal terminal INCNT is in the low level, the first N-type transistor N1 and the second N-type transistor N2 are turned off, the first output terminal OG11 of the gate control circuit has a voltage equal to that of the first power supply terminal IG11 by the first resistive element R1, and the second output terminal OG12 of the gate control circuit has a voltage equal to that of the second power supply terminal IG12 by the second resistive element R2.

When the control signal terminal INCNT is in the high level, the first N-type transistor N1 and the second N-type transistor N2 are turned on. In this state, when an ON resistance of the first N-type transistor N1 is sufficiently smaller than a resistance of the first resistive element R1, the first output terminal OG11 has the voltage subsequently equal to the earth potential VSS. When an ON resistance of the second N-type transistor N2 is sufficiently smaller than a resistance of the second resistive element R2, the second output terminal OG12 has the voltage subsequently equal to the earth potential VSS. As a result, the necessary operations of the gate control circuit shown in Table 1 can be implemented.

Second Embodiment

Figure 2:
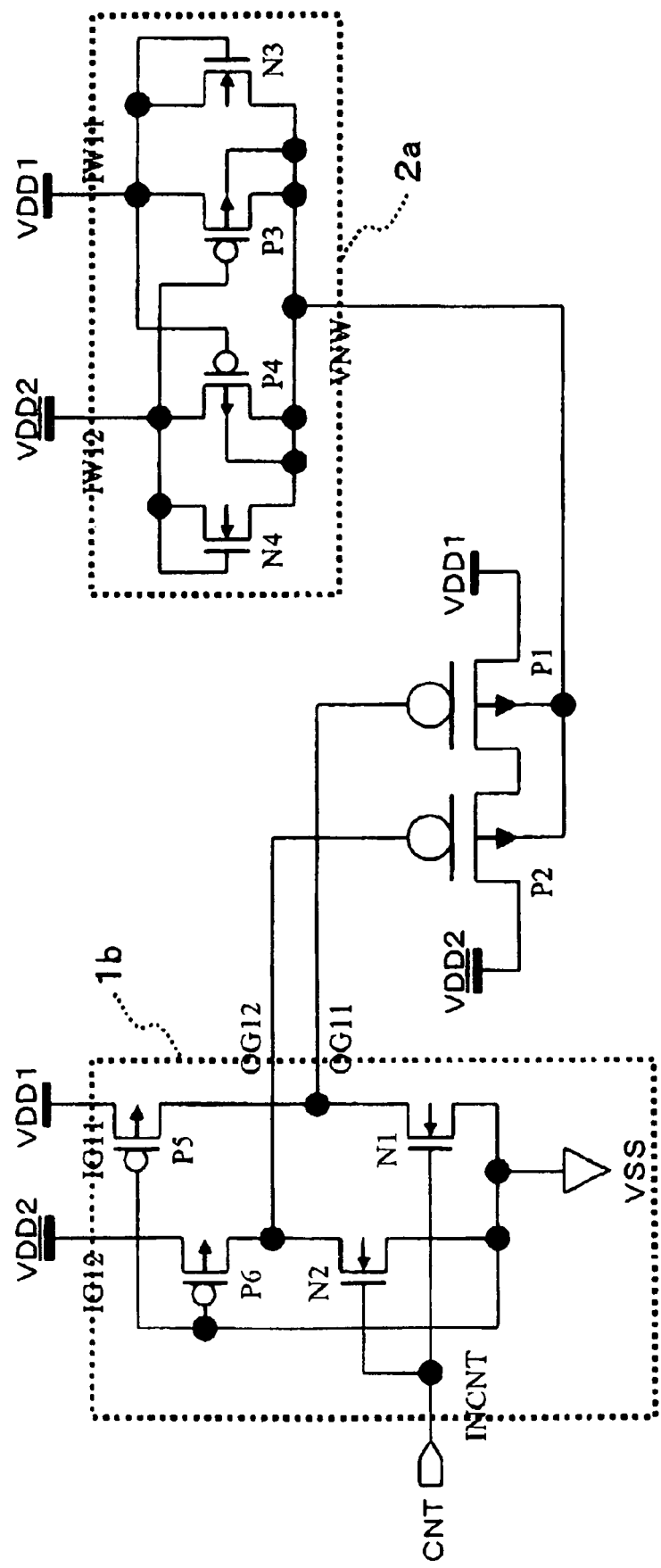
FIG. 2 is a circuit diagram illustrating a power switching circuit according to a second embodiment of the present invention.

FIG. 2 is a circuit diagram illustrating a power switching circuit according to a second embodiment of the present invention. In FIG. 2, reference numeral P1 denotes a first P-type transistor, reference numeral P2 denotes a second P-type transistor, and reference numeral 2a denotes a well-potential control circuit, which are equal to the configuration shown in FIG. 1.

In FIG. 2, reference numeral 1b denotes a gate control circuit having a control signal terminal INCT, a first power supply terminal IG11, and a second power supply terminal IG12 as input thereof and having a first output terminal OG11 and a second output terminal OG12 as output thereof.

A specific example of the gate control circuit is described. In the gate control circuit 1b, a fifth P-type transistor P5 and a first. N-type transistor N1 are connected in series between the first power supply terminal IG11 and the earth potential VSS, a sixth P-type transistor P6 and a second N-type transistor N2 are connected in series between the second power supply terminal IG12 and the earth potential VSS, the gate of the first N-type transistor N1 and the gate of the second N-type transistor N2 are connected to the control signal terminal INCNT, and the gate of the fifth P-type transistor P5 and the gate of the sixth P-type transistor P6 are connected to the earth potential VSS. A connection node between the fifth P-type transistor P5 and the first N-type transistor N1 serves as the first output terminal OG11 and a connection node between the sixth P-type transistor P6 and the second N-type transistor N2 serves as the second output terminal OG12.

In the gate control circuit 1b, when the control signal terminal INCNT is in the low level, the first N-type transistor N1 and the second N-type transistor N2 are turned off, the first output terminal OG11 of the gate control circuit has a voltage equal to that of the first power supply terminal IG11 by the fifth P-type transistor P5, and the second output terminal OG12 of the gate control circuit has a voltage equal to that of the second power supply terminal IG12 by the sixth P-type transistor P6.

When the control signal terminal INCNT is in the high level, the first N-type transistor N1 and the second N-type transistor N2 are turned on. In this state when an ON resistance of the first N-type transistor N1 is sufficiently smaller than the ON resistance of the fifth P-type transistor P5, the first output terminal OG11 has the voltage subsequently equal to the earth potential VSS. When an ON resistance of the second N-type transistor N2 is sufficiently smaller than the ON resistance of the sixth P-type transistor P6, the second output terminal OG12 has the voltage subsequently equal to the earth potential VSS. As a result, the necessary operations of the gate control circuit shown in Table 1 can be implemented.

In addition, in comparison with the gate control circuit 1a, it is possible to accomplish decrease in area in a diffusion process for manufacturing an LSI, by using the ON resistances of the P-type transistors instead of the resistive elements.

Third Embodiment

Figure 3:
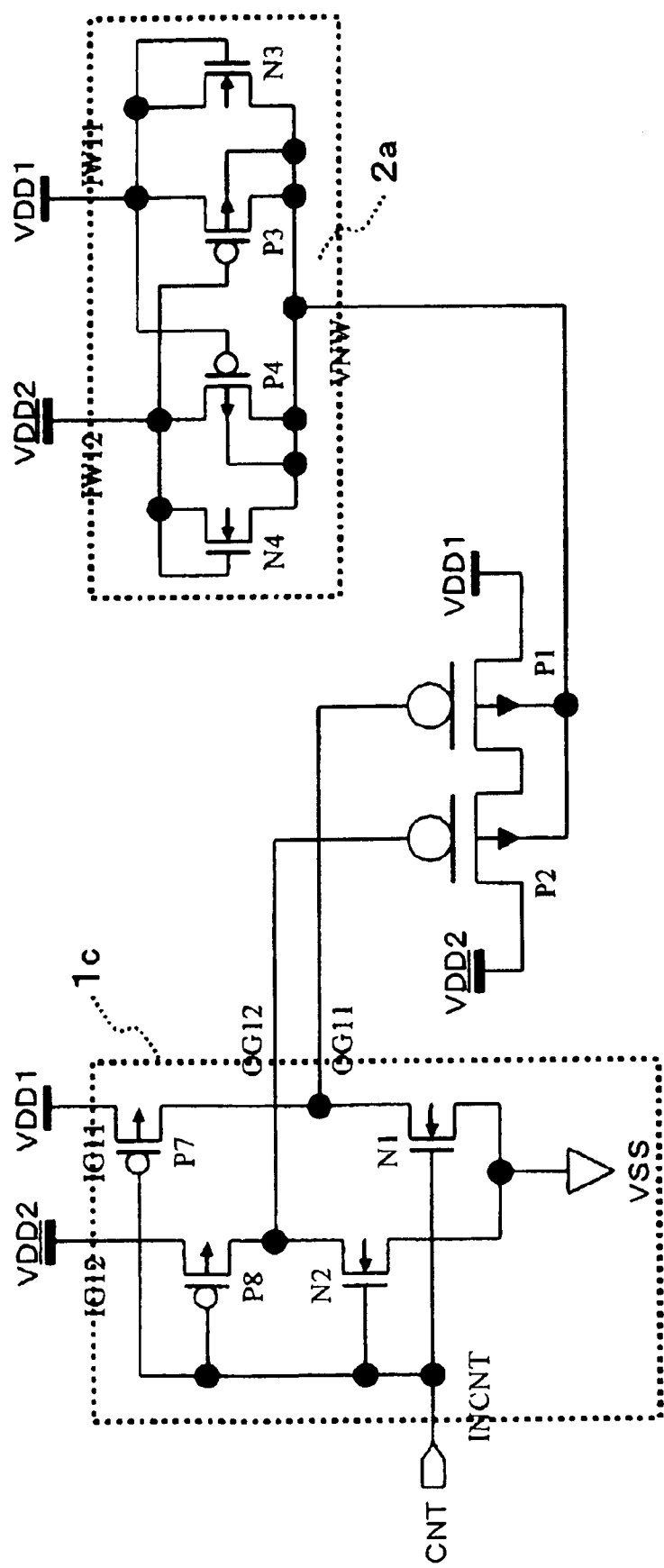
FIG. 3 is a circuit diagram illustrating a power switching circuit according to a third embodiment of the present invention.

FIG. 3 is a circuit diagram illustrating a power switching circuit according to a third embodiment of the present invention. In FIG. 3, reference numeral P1 denotes a first P-type transistor, reference numeral P2 denotes a second P-type transistor, and a reference numeral 2a denotes a well-potential control circuit, which are equal to the configuration shown in FIG. 1.

In FIG. 3, reference numeral 1c denotes a gate control circuit having a control signal terminal INCT, a first power supply terminal IG11, and a second power supply terminal IG12 as input thereof and having a first output terminal OG11 and a second output terminal OG12 as output thereof.

A specific example of the gate control circuit is described. In the gate control circuit 1c, a seventh P-type transistor P7 and a first N-type transistor N1 are connected in series between the first power supply terminal IG11 and the earth potential VSS, an eighth P-type transistor P8 and a second N-type transistor N2 are connected in series between the second power supply terminal IG12 and the earth potential VSS, and the gate of the first N-type transistor N1, the gate of the second N-type transistor N2, the gate of the seventh P-type transistor P7, and the gate of the eighth P-type transistor are connected to the control signal terminal INCNT. A connection node between the seventh P-type transistor P7 and the first N-type transistor N1 serves as the first output terminal OG11 and a connection node between the eighth P-type transistor P8 and the second N-type transistor N2 serves as the second output terminal OG12.

In the gate control circuit 1c, when the control signal terminal INCNT is in the low level, the first N-type transistor N1 and the second N-type transistor N2 are turned off, the seventh P-type transistor P7 and the eighth P-type transistor P8 are turned on, the first output terminal OG11 of the gate control circuit has a voltage equal to that of the first power supply terminal IG11 by the seventh P-type transistor P7, and the second output terminal OG12 of the gate control circuit has a voltage equal to that of the second power supply terminal IG12 by the eighth P-type transistor P8.

When the control signal terminal INCNT is in the high level, the first N-type transistor N1 and the second N-type transistor N2 are turned on and the seventh P-type transistor P7 and the eighth P-type transistor P8 are in the OFF state or a weak ON state. In this state, when an ON resistance of the first N-type transistor N1 is sufficiently smaller than the ON resistance of the seventh P-type transistor P7, the first output terminal OG11 has the voltage subsequently equal to the earth potential VSS. When an ON resistance of the second N-type transistor N2 is sufficiently smaller than the ON resistance of the eighth P-type transistor P8, the second output terminal OG12 has the voltage subsequently equal to the earth potential VSS. As a result, the necessary operations of the gate control circuit shown in Table 1 can be implemented.

In addition, in comparison with the gate control circuit 1b, the gate of the seventh P-type transistor P7 and the gate of the eighth P-type transistor P8 are connected to the control signal terminal INCNT Accordingly, when the control signal has a high level, that is, when the power switching circuit is turned on, the seventh P-type transistor P7 and the eighth P-type transistor P8 are in the OFF state or in the weak ON state, thereby reducing a current flowing uselessly.

Fourth Embodiment

Figure 4:
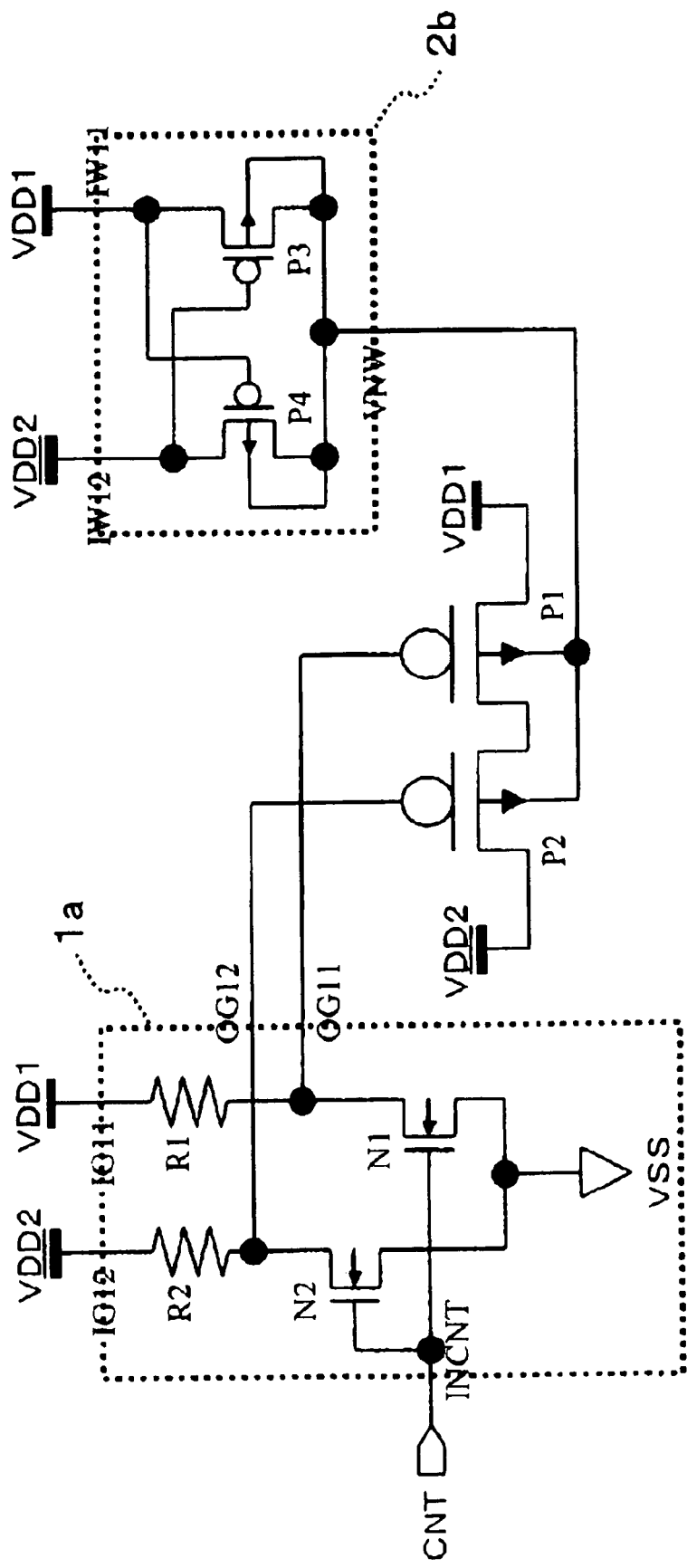
FIG. 4 is a circuit diagram illustrating a power switching circuit according to a fourth embodiment of the present invention.

FIG. 4 is a circuit diagram illustrating a power switching circuit according to a fourth embodiment of the present invention. In FIG. 4, reference numeral 1a denotes a gate control circuit, reference numeral P1 denotes a first P-type transistor, and reference numeral P2 denotes a second P-type transistor, which are equal to the configuration shown in FIG. 1.

In FIG. 4, reference numeral 2b denotes a well-potential control circuit having a first power supply terminal IW11 and a second power imputer terminal IW12 as input thereof and having an output terminal VNW as output thereof, wherein the output terminal VNW are connected to the well of the first P-type transistor P1 and the well of the second P-type transistor P2.

A specific example of the well-potential control circuit is described. In the well-potential control circuit 2b, the source of a third P-type transistor P3 is connected to the first power supply terminal IW11, the gate of the third P-type transistor P3 is connected to the second power supply terminal IW12, the drain of the third P-type transistor P3 is connected to the output terminal VNW, the source of a fourth P-type transistor P4 is connected to the second power supply terminal IW12, the gate of the fourth P-type transistor P4 is connected to the first power supply terminal IW11, and the drain of the fourth P-type transistor P4 is connected to the output terminal VNW. In comparison with the well-potential control circuit 1a, two N-type transistors are omitted, thereby accomplishing decrease in area.

In the well-potential control circuit 2b, when the voltage of the second power supply terminal IW12 is lower than that of the first power supply terminal IW11, a voltage difference is generated between the gate and the source of the third P-type transistor P3 and thus the third P-type transistor P3 is turned on, thereby propagating the potential of the first power supply terminal IW11 to the output terminal VNW. At this time, the fourth P-type transistor P4 is in the OFF state.

When the voltage of the first power supply terminal IW11 is lower than that of the second power supply terminal IW12, a voltage difference is generated between the gate and the source of the fourth P-type transistor P4 and thus the fourth P-type transistor P4 is turned on, thereby propagating the potential of the second power supply terminal IW12 to the output terminal VNW. At this time, the third P-type transistor P3 is in the OFF state. Accordingly, the necessary operations of the well-potential control circuit shown in Table 2 can be implemented.

Fifth Embodiment

Figure 5:
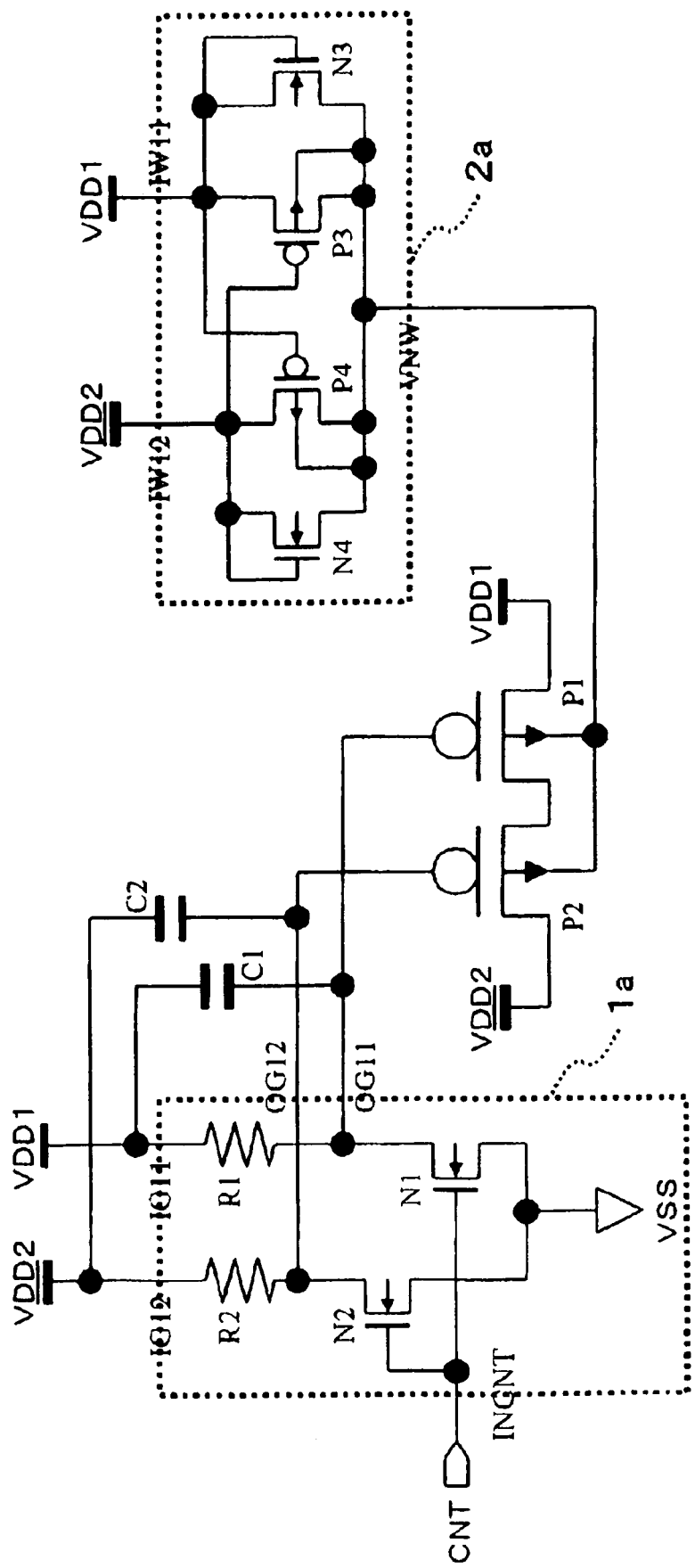
FIG. 5 is a circuit diagram illustrating a power switching circuit according to a fifth embodiment of the present invention.

FIG. 5 is a circuit diagram illustrating a power switching circuit according to a fifth embodiment of the present invention. In FIG. 5, reference numeral 1a denotes a gate control circuit, reference numeral P1 denotes a first P-type transistor, reference numeral P2 denotes a second P-type transistor, and reference numeral 2a denotes a well-potential control circuit, which are equal to the configuration shown in FIG. 1. Reference numeral C1 denotes a first capacitive element connected between a first power source VDD1 and the gate of the first P-type transistor P1 and reference numeral C2 denotes a second capacitive element connected between a second power source VDD2 and the gate of the second P-type transistor P2.

An operation of the circuit shown in FIG. 5 and advantages of the first capacitive element C1 and the second capacitive element C2 are described with reference to the voltage waveform diagram shown in FIGS. 6 and 7.

Figure 6:
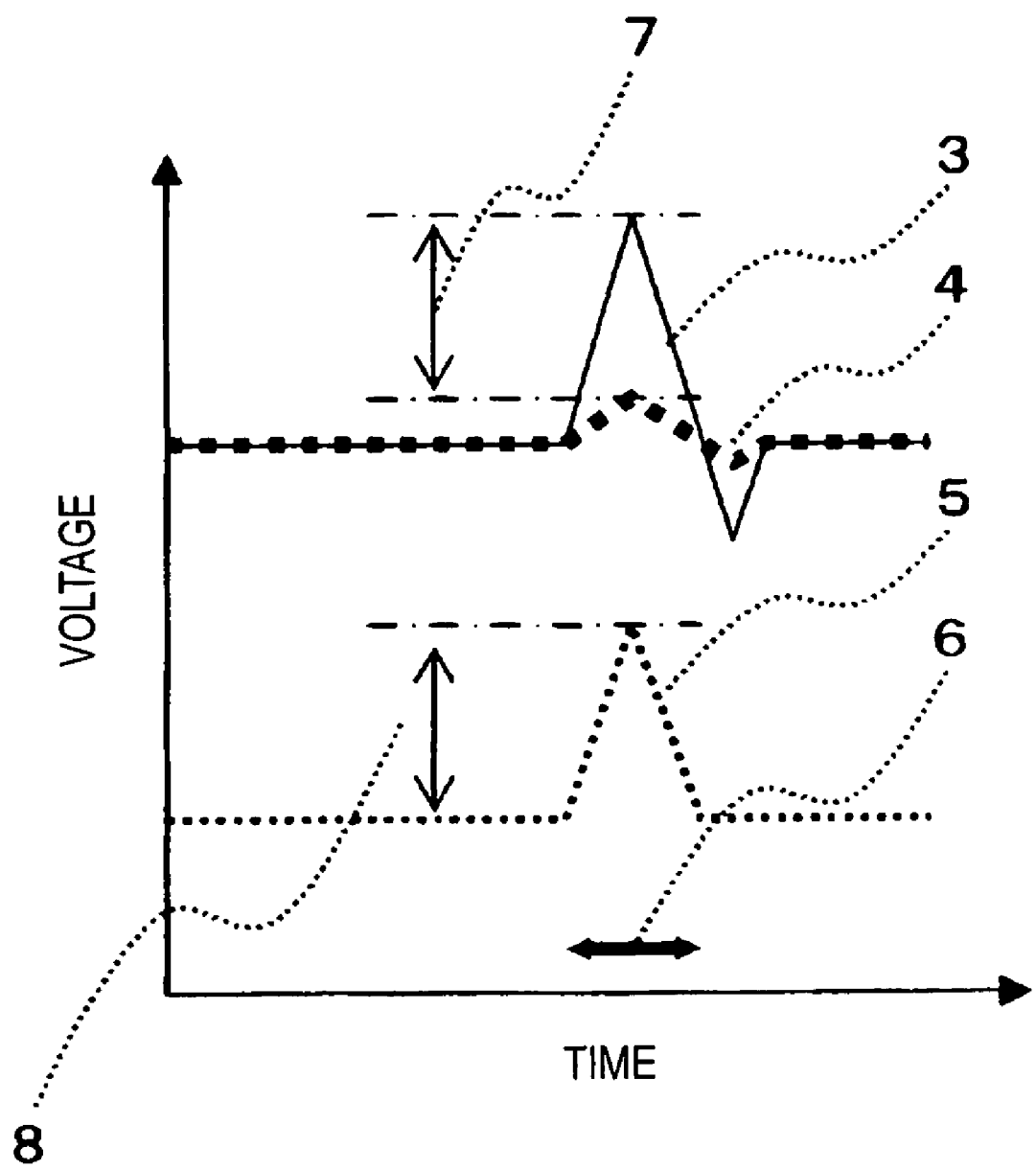
FIG. 6 is a voltage waveform diagram illustrating operations of the circuit shown in FIG. 5 according to the first embodiment.

FIG. 6 is a schematic voltage waveform diagram illustrating the gate voltage of the first P-type transistor P1, a period of time when the first P-type transistor P1 and the second P-type transistor P2 are all turned on, and a noise propagated to the second power source VDD2, when a source noise is generated in the first power source VDD1 of the circuit shown in FIG. 1.

When the voltage of the first power source VDD1 is higher than that of the second power source VDD2 in the OFF state of the power switching circuit and a spike-shaped noise appears on the high voltage side as in the voltage waveform 3 of VDD1 in FIG. 6, the signal having a high frequency component is not propagated to the gate of the first P-type transistor P1 due to existence of the first resistive element R1, but the gate voltage of the first P-type transistor P1 has the gate voltage waveform 4 of P1. Accordingly, the potential difference 7 generated due to the noise appears in the voltage waveform 3 of VDD1 and the gate voltage waveform 4 of the first P-type transistor P1.

The potential difference 7 generated due to the noise is a voltage between the gate and the source of the first P-type transistor P1 and thus the first P-type transistor P1 is turned on. Since the first P-type transistor P1 is turned on, the high voltage of the first power source VDD1 is propagated to the second power source VDD2 and a new noise such as the propagated noise potential 8 appears.

Figure 7:
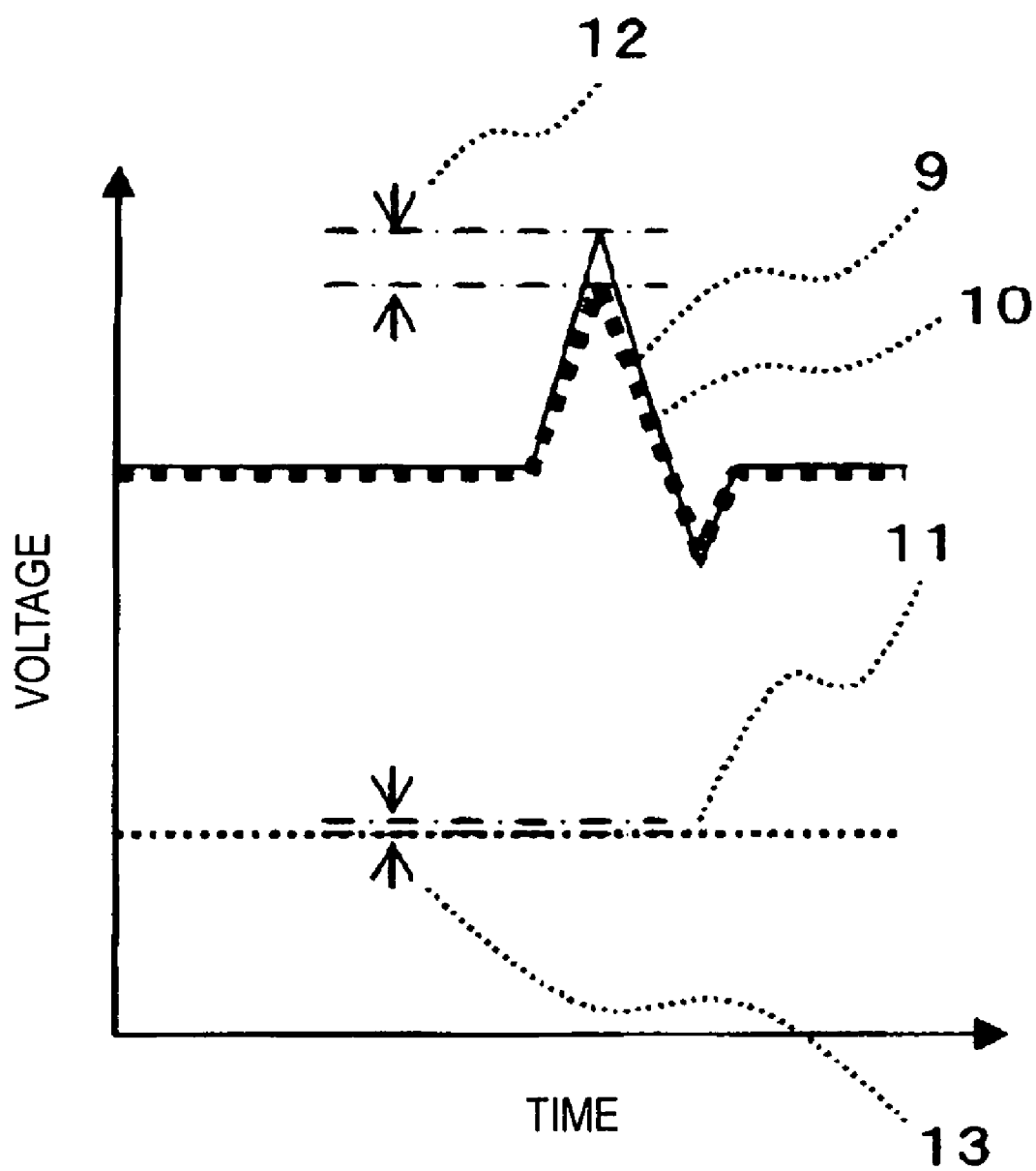
FIG. 7 is a voltage waveform diagram illustrating operations of the circuit shown in FIG. 5 according to the fifth embodiment.

FIG. 7 is a schematic voltage waveform diagram illustrating a gate voltage of the first P-type transistor P1 and a noise propagated to the second power source VDD2 when the noise appears in the first power source VDD1 in the circuit shown in FIG. 5.

When the voltage of the first power source VDD1 is higher than that of the second power source VDD2 in the OFF state of the power switching circuit and a spike-shaped noise appears on the high voltage side as in the voltage waveform 9 of VDD1 in FIG. 7, the signal having a high frequency component is propagated to the gate of the first P-type transistor P1 due to existence of the first capacitive element C1 and the gate voltage of the first P-type transistor P1 has the gate voltage waveform 10 of P1. Accordingly, the potential difference 12 generated due to the noise appearing in the voltage waveform 9 of VDD1 and the gate voltage waveform 10 of the first P-type transistor P1 is smaller than that of the circuit shown in FIG. 1.

The potential difference 12 generated due to the noise is a voltage between the gate and the source of the first P-type transistor and the OFF state of the first P-type transistor P1 can be maintained. Accordingly, like the propagated noise 13, the noise appearing in the second power source VDD2 can be suppressed.

When the voltage of the second power source VDD2 is higher than that of the first power source VDD1 in the power switching circuit shown in FIG. 5 and a spike-shaped noise appears on the high voltage side in the second power source VDD2, the second capacitive element C2 propagates the signal having a high frequency component to the gate of the second P-type transistor P2. Accordingly, since the potential difference generated due to the noise is smaller compared with the case that the second capacitive element C2 is not provided and the OFF state of the second P-type transistor P2 can be maintained, the noise appearing in the first power source VDD1 can be suppressed.

Sixth Embodiment

Figure 8:
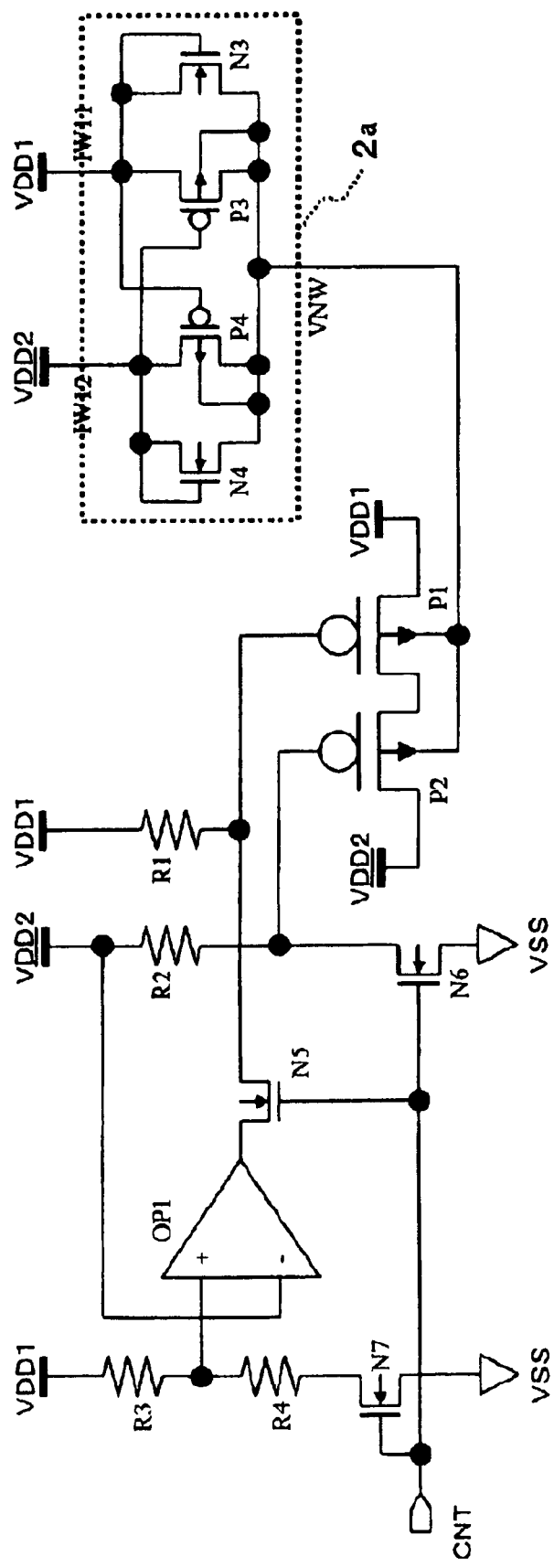
FIG. 8 is a circuit diagram illustrating a power switching circuit according to a sixth embodiment of the present invention.

FIG. 8 is a circuit diagram illustrating a power switching circuit according to a sixth embodiment of the present invention. In FIG. 8, reference numeral P1 denotes a first P-type transistor, reference numeral P2 denotes a second P-type transistor, and reference numeral 2*a* denotes a well-potential control circuit, which are equal to the configuration shown in FIG. 1.

In FIG. 8, reference numeral N5 denotes a first N-type transistor, reference numeral N6 denotes a sixth N-type transistor, reference numeral N7 denotes a seventh N-type transistor, reference numeral R1 denotes a first resistive element, reference numeral R2 denotes a second resistive element, reference numeral R3 denotes a third resistive element, reference numeral R4 denotes a fourth resistive element, and OP1 denotes a first operational amplifier.

A first P-type transistor P1 and a second P-type transistor P2 are connected in series between an imputer terminal of a first power source VDD1 and an input terminal of a second power source VDD2, the first resistive element R1 is connected between the first power source VDD1 and the gate of the first P-type transistor P1, the second resistive element R2 is connected between the second power source VDD2 and the gate of the second P-type transistor P2, the sixth N-type transistor is connected between the gate of the second P-type transistor and the earth potential VSS, and the third resistive element R3, the fourth resistive element R4, and the seventh N-type transistor N7 are connected in series between the first power source VDD1 and the earth potential VSS. The normal input of the first operational amplifier OP1 is connected to a connection node between the third resistive element R3 and the fourth resistive element R4, the inverted input of the first operation amplifier OP1 is connected to the second power source VDD2, the fifth N-type transistor N5 is connected between the gate of the first P-type transistor P1 and the output of the first operational amplifier OP1, and the gate of the fifth N-type transistor N5, the gate of the sixth N-type transistor N6, and the gate of the seventh N-type transistor N7 are connected to the control signal terminal CNT Reference numeral 2*a* denotes a well-potential control circuit having a first power supply terminal IW11 and a second power supply terminal as input thereof and having an output terminal VNW as output thereof, where the output terminal VNW is connected to the well of the first P-type transistor P1 and the well of the second P-type transistor P2.

Now, operations thereof are described. When a voltage is supplied only to the first power source VDD1, no voltage is supplied to the second power source VDD2, and the control signal CNT is in the high level, the fifth N-type transistor N5 is turned on, the sixth N-type transistor N6 is turned on, and the seventh N-type transistor N7 is turned on. A voltage by resistive voltage division appears in the connection node between the third resistive element R3 and the fourth resistive element R4 and is applied to the normal input terminal of the first operational amplifier OP1.

Since the first operational amplifier OP1 controls its output voltage so that the voltages of the normal input terminal and the inverted input terminal are equal to each other, the gate voltage of the first P-type transistor P1 is controlled so that the voltage generated by the resistive voltage division of the third resistive element R3 and the fourth resistive element R4 is equal to the voltage of the second power source VDD2.

That is, the voltage equal to the voltage determined by the resistance of the third resistive element R3 and the resistance of the fourth resistive element R4 can be supplied to the second power source VDD2 from the first power source VDD1.

When the control signal CNT is in the low level, the fifth N-type transistor N5, the sixth N-type transistor N6, and the seventh N-type transistor N7 are turned off, and the first P-type transistor P1 and the second P-type transistor P2 constituting the switch section are also turned off. Accordingly, the power switch is completely turned off similarly to the circuit shown in FIG. 1.

Since the latest micro LSI often operates with a plurality of power sources (a plurality of voltages), the semiconductor process is performed in consideration of a plurality of power sources. That is, it is necessary to supply a plurality of source voltages (different voltages) from the outside of the LSI. According to the sixth embodiment, since only one source voltage is supplied from the outside of the LSI and the other source voltages can be generated in the inside of the LSI, it is possible to reduce the number of external devices (such as power supply circuits). When the number of power sources is reduced in appearance, the number of power supply terminals (terminals of the LSI) can be reduced, thereby decreasing the size of the LSI.

Seventh Embodiment

Figure 9:
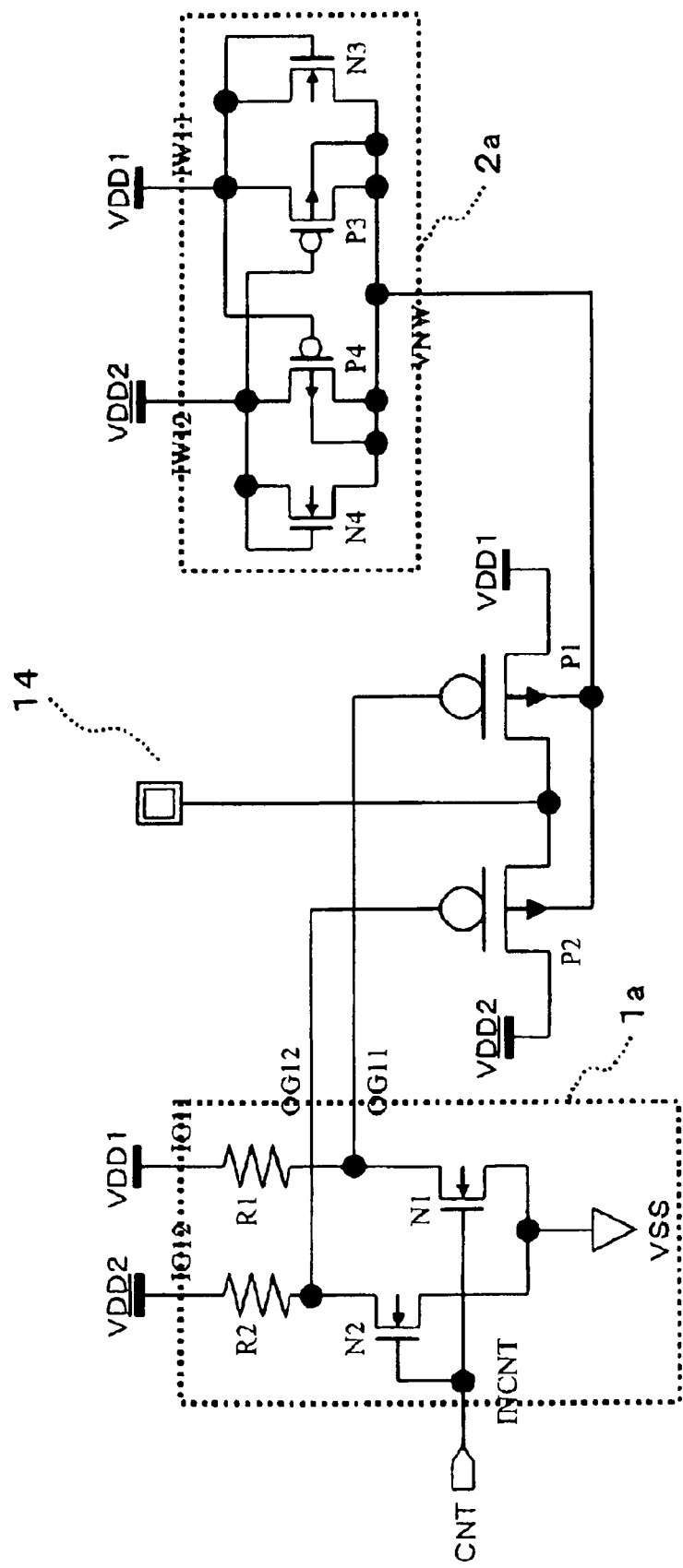
FIG. 9 is a circuit diagram illustrating a power switching circuit according to a seventh embodiment of the present invention.

FIG. 9 is a circuit diagram illustrating a power switching circuit according to a seventh embodiment of the present invention. In FIG. 7, reference numeral 1*a* denotes a gate control circuit, reference numeral P1 denotes a first P-type transistor, reference numeral P2 denotes a second P-type transistor, and reference numeral 2*a* denotes a well-potential control circuit, which are similar to the configuration shown in FIG. 1. An inspecting power supply terminal 14 is a terminal which is drawn from a connection node between the first P-type transistor P1 and the second P-type transistor P2 and which is opened at the time of normal use.

Operations thereof are now described. Under the condition other than the normal use, such as inspection, when the number of power sources is insufficient due to restrictions to circuits and the like but an inspecting power supply terminal can be provided, the circuit configuration according to the seventh embodiment can be used.

In the circuit according to the seventh embodiment, when a control signal CNT is in the high level and a power switch is turned on, only the inspecting power supply terminal 14 supplies power and thus the voltage of the inspecting power supply terminal 14 is propagated to a first power source VDD1 and a second power source VDD2 through the first P-type transistor P1 and the second P-type transistor P2.

The transistor configuration of the switch section of the circuit shown FIG. 1 is changed from two stages to one stage and thus the voltage drop of the switch section when large current flows in the switch section can be suppressed.

Eighth Embodiment

Figure 10:
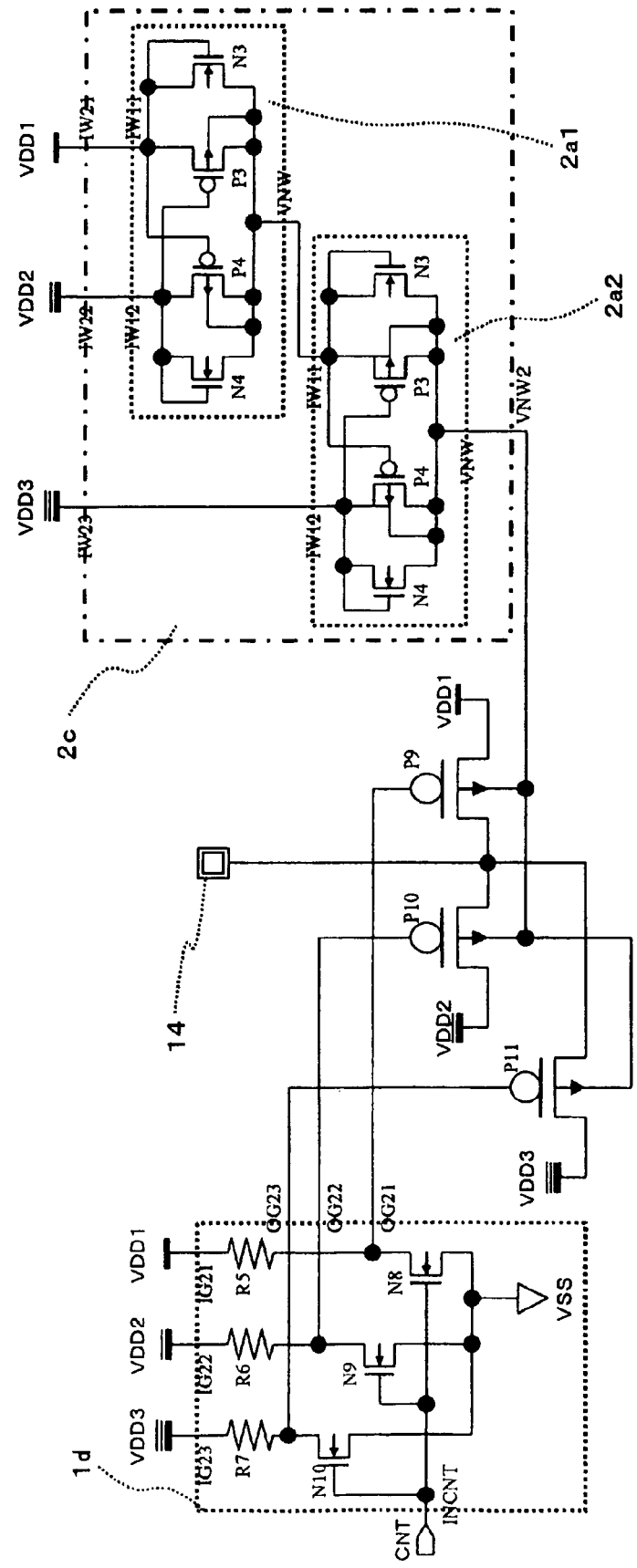
FIG. 10 is a circuit diagram illustrating a power switching circuit according to an eighth embodiment of the present invention.

FIG. 10 is a circuit diagram illustrating a power switching circuit according to an eighth embodiment of the present invention. A ninth P-type transistor P9 and a tenth P-type transistor P10 are connected in series between a first power source VDD1 and a second power source VDD2. An eleventh P-type transistor P11 is connected between a connection node between the ninth P-type transistor P9 and the tenth P-type transistor P10 and a third power source VDD3.

A 3-power gate control circuit 1d has a first power supply terminal IG21, a second power supply terminal IG22, a third power supply terminal IG23, a control signal terminal INCNT, a first output terminal OG21, a second output terminal OG22, and a third output terminal OG23. A 3-power well-potential control circuit 2c has a first power supply terminal IW21, a second power supply terminal IW22, a third power supply terminal IW23, and an output terminal VNW2.

The first power supply terminal IG21 of the 3-power gate control circuit 1d is connected to the first power source VDD1, the second power supply terminal IG22 of the 3-power gate control circuit 1d is connected to the second power source VDD2, the third power supply terminal IG23 of the 3-power gate control circuit 1d is connected to the third power source VDD3. A control signal CNT is supplied to the control signal terminal INCNT of the 3-power gate control circuit 1d. The first output terminal OG21 of the 3-power gate control circuit 1d is connected to the gate of the ninth P-type transistor P9, the second output terminal OG22 of the 3-power gate control circuit 1d is connected to the gate of the tenth P-type transistor P10, and the third output terminal OG23 of the 3-power gate control circuit 1d is connected to the gate of the eleventh P-type transistor P11.

On the other hand, the first power supply terminal IW21 of the 3-power well-potential control circuit 2c is connected to the first power source VDD1, the second power supply terminal IW21 of the 3-power well-potential control circuit 2c is connected to the second power source VDD2, and the third power supply terminal IW21 of the 3-power well-potential control circuit 2c is connected to the third power source VDD3. The output terminal VNW of the 3-power well-potential control circuit 2c is connected to the well of the ninth P-type transistor P9, the well of the tenth P-type transistor P10, and the well of the eleventh P-type transistor P11.

When the control signal CNT is in the low level, the 3-power gate control circuit 1d outputs a voltage equal to the voltage of the first power source VDD1 to the first output terminal OG21, outputs a voltage equal to the voltage of the second power source VDD2 to the second output terminal OG22, and outputs a voltage equal to the voltage of the third power source VDD3 to the third output terminal OG23. When the control signal CNT is in the high level, the 3-power gate control circuit 1d outputs a voltage equal to the earth potential VSS to the first output terminal OG21, the second output terminal OG22, and the third output terminal OG23.

The 3-power well-potential control circuit 2c outputs a voltage equal to the voltage of the first power source VDD1 to the output terminal VNW2 when the voltage of the first power source VDD1 is higher than the voltage of the second power source VDD2 and the voltage of the third power source VDD3, and outputs a voltage equal to the voltage of the second power source VDD2 to the output terminal VNW2 when the voltage of the second power source VDD2 is higher than the voltage of the first power source VDD1 and the voltage of the third power source VDD3, and outputs a voltage equal to the voltage of the third power source VDD3 to the output terminal VNW2 when the voltage of the third power source VDD1 is higher than the voltage of the first power source VDD1 and the voltage of the second power source VDD2.

An inspecting power supply terminal 14 is connected to a connection node between the tenth P-type transistor P10, the eleventh P-type transistor P11, and the ninth P-type transistor P9.

A case that the power switching circuit according to the eighth embodiment is in the ON state is described first. When the control signal CNT is in the high level, as shown in Table 3, the 3-power gate control circuit outputs a voltage subsequently equal to the earth potential VSS to the first output terminal OG21, the second output terminal OG22, and the third output terminal OG23, and the ninth P-type transistor P9, the tenth P-type transistor P10, and the eleventh P-type transistor P11 are all turned on.

TABLE 3

| Operation of 3-power gate control circuit | | | |
|---|---|---|---|
| Input CNT | Input OG21 | Output OG22 | Output OG23 |
| Low level | Potential of IG21 | Potential of IG22 | Potential of IG23 |
| High level | Potential of VSS | Potential of VSS | Potential of VSS |

In this state, when a voltage is supplied to the inspecting power supply terminal 14, the voltage is propagated to the first power source VDD1, the second power source VDD2, and the third power source VDD3.

Next, a case that the power switching circuit according to the eighth embodiment is turned off is described. When the control signal CNT is in the low level, as shown in Table 3, the 3-power gate control circuit outputs a voltage equal to the voltage of the first power supply terminal IG21 to the first output terminal OG21, outputs a voltage equal to the voltage of the second power supply terminal IG22 to the second output terminal OG22, and outputs a voltage equal to the voltage of the third power supply terminal IG23 to the third output terminal OG23.

In this state, when the voltage of the first power source VDD1 is higher than the voltage of the second power source VDD2 and the voltage of the third power source VDD3, the voltage difference between the gate and the source of the ninth P-type transistor P9 is zero and thus the ninth P-type transistor P9 is completely turned off.

When the voltage of the second power source VDD2 is higher than the voltage of the first power source VDD1 and the voltage of the third power source VDD3, the voltage difference between the gate and the source of the tenth P-type transistor P10 is zero and thus the tenth P-type transistor P10 is completely turned off.

When the voltage of the third power source VDD3 is higher than the voltage of the first power source VDD1 and the voltage of the second power source VDD2, the voltage difference between the gate and the source of the eleventh P-type transistor P11 is zero and thus the eleventh P-type transistor P11 is completely turned off.

Therefore, even when any one of the voltages of the first power source VDD1, the second power source VDD2, and the third power source VDD3 is higher, it can be told that the power switching circuit is completely turned off.

In addition, whether the power switching circuit according to the eighth embodiment is turned on or off, as shown in Table 4, the highest voltage of the voltages of the first power source VDD1, the second power source VDD2, and the third power source VDD3 is supplied as the well potential of the ninth P-type transistor P9, the well potential of the tenth P-type transistor P10, and the well potential of the eleventh P-type transistor P11. Accordingly, the unnecessary leakage of current through a parasitic diode existing in the P-type transistors does not occur.

TABLE 4

Operation of 3-power well-potential control circuit

| Voltage relation between input IW21, IW22, and IW23 | Output VNW2 |
| --- | --- |
| IW21 > IW22 > IW23 | Potential of IW21 |
| IW21 > IW23 > IW22 | |
| IW22 > IW21 > IW23 | Potential of IW22 |
| IW22 > IW23 > IW21 | |
| IW23 > IW22 > IW21 | Potential of IW23 |
| IW23 > IW21 > IW22 | |

Next, a specific example of the 3-power gate control circuit 1d is described. In the 3-power gate control circuit 1d, the fifth resistive element R5 and the eighth N-type transistor N8 are connected in series between the first power supply terminal IG21 and the earth potential VSS, the sixth resistive element R6 and the ninth N-type transistor N9 are connected in series between the second power supply terminal IG22 and the earth potential VSS, the seventh resistive element R7 and the tenth N-type transistor N10 are connected in series between the third power supply terminal IG23 and the earth potential VSS, and the gate of the eighth N-type transistor N8, the gate of the ninth N-type transistor N9, and the gate of the tenth N-type transistor N10 are connected to the control signal terminal INCNT. A connection node between the fifth resistive element R5 and the eighth N-type transistor N8 serves as a first output terminal OG21, a connection node between the sixth resistive element R6 and the ninth N-type transistor N9 serves as a second output terminal OG22 and a connection node between the seventh resistive element R7 and the tenth N-type transistor N10 serves as a third output terminal OG23.

Operations shown in Table 3 can be implemented by adding a resistive element and an N-type transistor connected in series to the gate control circuit 1a shown in FIG. 1 to change two power supply terminals to three power supply terminals.

Next, a specific example of the 3-power well-potential control circuit 2c is described. The 3-power well-potential control circuit is constructed by combining two well-potential control circuits 2a shown in FIG. 1. That is, in the 3-power well-potential control circuit, the first power supply terminal IW21 of the 3-power well-potential control circuit 2c is connected to the first power supply terminal IW11 of a first well-potential control circuit 2a1, the second power supply terminal IW22 of the 3-power well-potential control circuit 2c is connected to the second power supply terminal IW12 of the first well-potential control circuit 2a1, the third power supply terminal IW23 of the 3-power well-potential control circuit 2c is connected to the second power supply terminal IW12 of a second well-potential control circuit 2a2, the output terminal VNW of the first well-potential control circuit 2a1 is connected to the first power supply terminal IW11 of the second well-potential control circuit 2a2, and the output terminal VNW of the second well-potential control circuit 2a2 serves as the output terminal VNW2 of the 3-power well-potential control circuit 2c.

Operations shown in Table 4 can be implemented by constructing the well-potential control circuit 2a shown in FIG. 1 with two stages and changing two power supply terminals to three power supply terminals.

When the first power source VDD1, the second power source VDD2, and the third power source VDD3 are supplied with voltages through the inspecting power supply terminals 14, the configuration of the transistors of the switch section is changed from two stages to one stage, thereby suppressing the voltage drop in the switch section when large current flows in the switch section.

In addition, since the first power source VDD1, the second power source VDD2, and the third power source VDD3 are all supplied with voltages through the inspecting power supply terminal 14, it is possible to reduce the number of terminals.

Although it has been described in the eighth embodiment that the source voltages are supplied through three systems, the voltages may be supplied through four systems or more.

Ninth Embodiment

Figure 11:
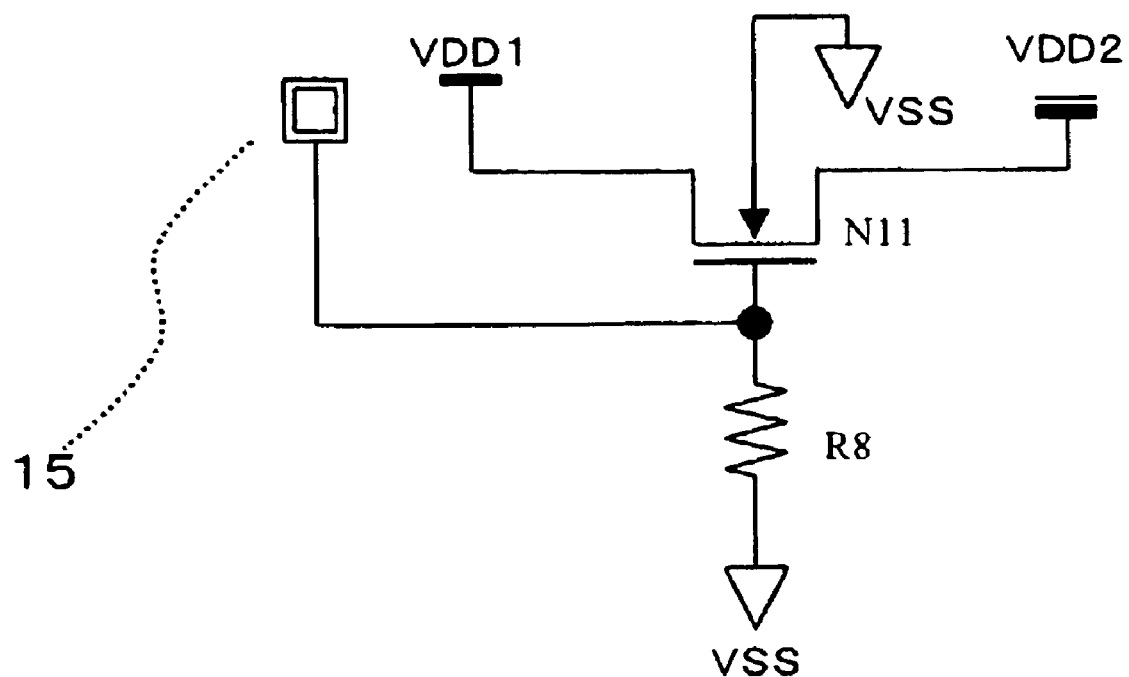
FIG. 11 is a circuit diagram illustrating a power switching circuit according to a ninth embodiment of the present invention.

FIG. 11 is a circuit diagram illustrating a power switching circuit according to a ninth embodiment of the present invention. An eleventh N-type transistor N11 is connected between a first power source VDD1 and the second power source VDD2, an eighth resistive element R8 is connected between the gate of the eleventh N-type transistor N11 and the earth potential VSS, and an inspecting signal supply terminal 15 is connected to the gate of the eleventh N-type transistor N11.

Operations are described now. When the inspecting signal input terminal 15 is open, the gate of the eleventh N-type transistor N11 has the earth potential by the eighth resistive element R8 and thus the eleventh N-type transistor N11 of the switch section is turned off.

When a high voltage is applied to the inspecting signal input terminal 15, the gate of the eleventh N-type transistor N11 is turned to the high level and thus the eleventh N-type transistor N11 of the switch section is open.

The circuit shown in FIG. 11 is a power switching circuit which can be embodied by adding only the inspecting signal input terminal to an ESD (Electrostatic Discharge) protection circuit for the N-type transistors used in the system-on-chip, and the area of the system-on-chip can be decreased by using the ESD protection circuit for the N-type transistors and the power switching circuit in common.

In addition, since the voltage of the inspecting signal input terminal connected to the gate of the eleventh N-type transistor N11 can be controlled directly from the outside, it is possible to apply a voltage greater than the voltage of the first power source VDD1 and the voltage of the second power source VDD2, thereby suppressing the voltage drop of the switch section.

Tenth Embodiment

Figure 12:
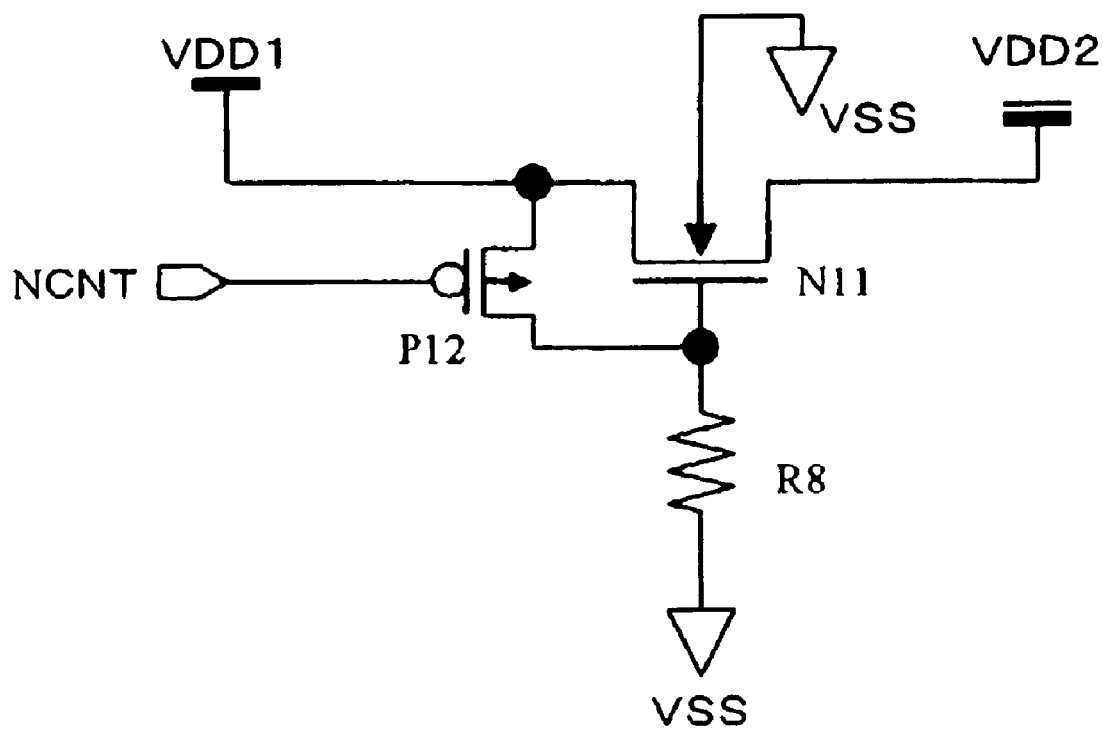
FIG. 12 is a circuit diagram illustrating a power switching circuit according to a tenth embodiment of the present invention.

FIG. 12 is a circuit diagram illustrating a power switching circuit according to a tenth embodiment of the present invention. An eleventh N-type transistor N11 is connected between a first power source VDD1 and a second power source VDD2, an eight resistive element R8 is connected between the gate of the eleventh N-type transistor N11 and the earth potential VSS, a twelfth P-type transistor P12 is connected between the gate of the eleventh N-type transistor N11 and the first power source VDD1, and the gate of the twelfth P-type transistor P12 is connected to an inverted control terminal NCNT.

Now, operations thereof are described. When the inverted control terminal NCNT is in the high level, the twelfth P-type transistor is in the open state, the gate of the eleventh N-type transistor N11 is connected to the earth potential VSS through the eighth resistive element R8, and the eleventh N-type transistor N11 of the switch section is in the open state.

When the inverted control terminal NCNT is in the low level, the twelfth P-type transistor P12 is turned on, the gate voltage of the eleventh N-type transistor N11 becomes subsequently equal to the voltage of the first power source VDD1, and the eleventh N-type transistor N11 of the switch section is turned on.

The circuit shown in FIG. 12 is a power switching circuit which can be embodied by adding the twelfth P-type transistor P12 and the inversion control terminal NCNT to an ESD protection circuit for the N-type transistors used in the system-on-chip, and the area of the system-on-chip can be decreased by using the ESD protection circuit for the N-type transistors and the power switching circuit in common. In addition, since the ON and OFF states of the switch section can be controlled by an internal signal, the inspecting signal input terminal is not required.

Eleventh Embodiment

Figure 13:
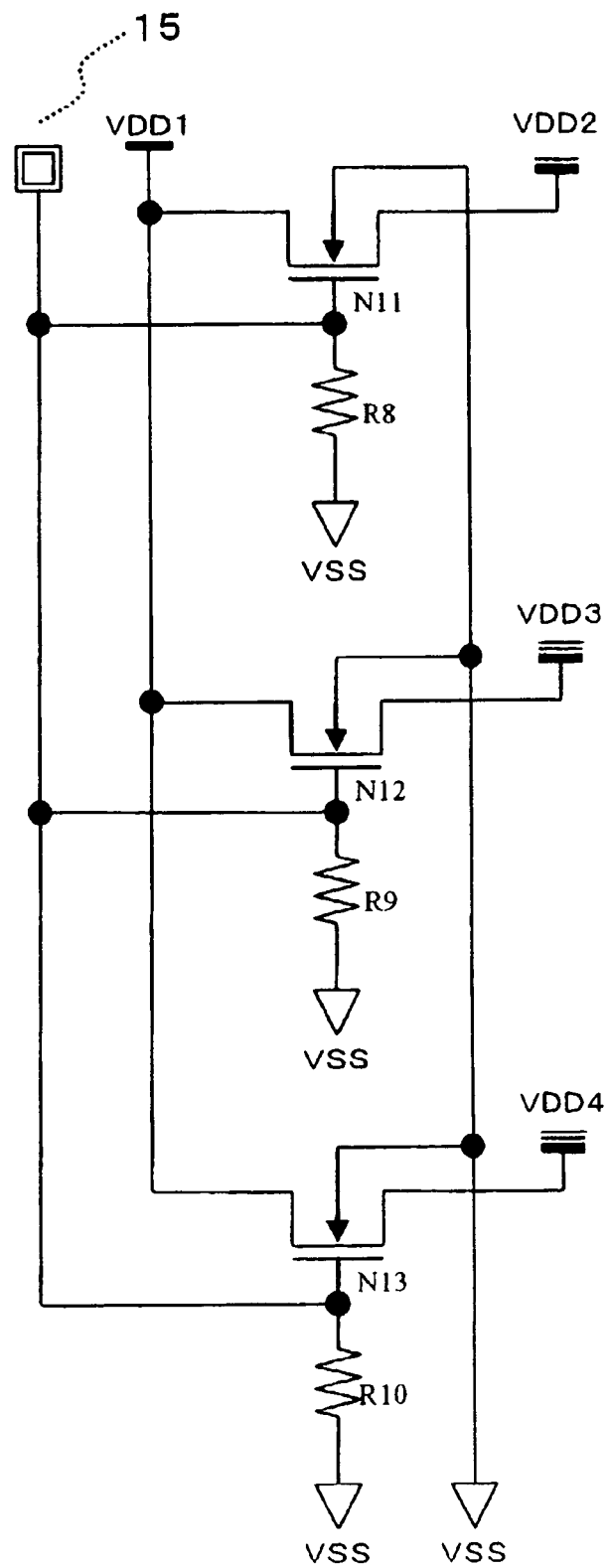
FIG. 13 is a circuit diagram illustrating a power switching circuit according to an eleventh embodiment of the present invention.

FIG. 13 is a circuit diagram illustrating a power switching circuit according to an eleventh embodiment of the present invention. An eleventh N-type transistor N11 is connected between a first power source VDD1 and a second power source VDD2, an eighth resistive element R8 is connected between the gate of the eleventh N-type transistor N11 and the earth potential VSS, a twelfth N-type transistor N12 is connected between the first power source VDD1 and a third power supply terminal VDD3, a ninth resistive element R9 is connected between the gate of the twelfth N-type transistor N12 and the earth potential VSS, a thirteenth N-type transistor N13 is connected between the first power source VDD1 and a fourth power supply terminal VDD4, a tenth resistive element R10 is connected between the gate of the thirteenth N-type transistor N13 and the earth potential VSS, and the gate of the eleventh N-type transistor N11, the gate of the twelfth N-type transistor N12, and the gate of the thirteenth N-type transistor N13 are connected in common to an inspecting signal input terminal 15.

Now, operations thereof are described. The operations of the eleventh N-type transistor N11, the twelfth N-type transistor N12, and the thirteenth N-type transistor N13 are similar to those of the eleventh N-type transistor N11 according to the ninth embodiment shown in FIG. 11 and perform a function of a power switch.

In the eleventh embodiment, by using the inspecting signal input terminal 15 in common, the eleventh N-type transistor N11, the twelfth N-type transistor N12, and the thirteenth N-type transistor N13 which are three power switches can be simultaneously controlled by one inspecting signal input terminal 15, thereby reducing the number of inspecting signal input terminals.

In the eleventh embodiment, it has been described that three power switches of the eleventh N-type transistor N11, the twelfth N-type transistor N12, and the thirteenth N-type transistor N13 are controlled simultaneously. However, it is also possible to control four or more power switches.

The circuit shown in FIG. 13 is a power switching circuit which can be embodied by adding only the inspecting signal input terminal to an ESD protection circuit for the N-type transistors used in the system-on-chip, and the area of the system-on-chip can be decreased by using the ESD protection circuit for the N-type transistors and the power switching circuit in common.

Twelfth Embodiment

Figure 14:
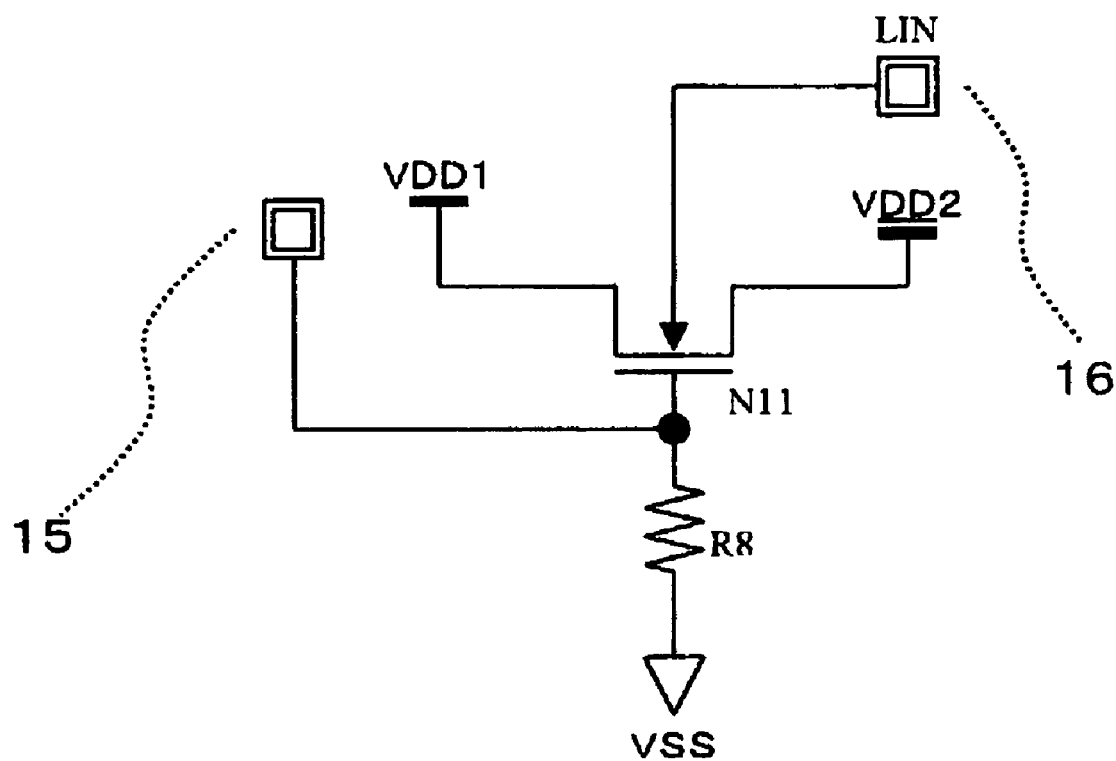
FIG. 14 is a circuit diagram illustrating a power switching circuit according to a twelfth embodiment of the present invention.

FIG. 14 is a circuit diagram illustrating a power switching circuit according to a twelfth embodiment of the present invention. In N-type transistors used in the twelfth embodiment, the well potential and the earth potential can be separated from each other by a triple well structure and thus the N-type transistors can be controlled arbitrarily.

An eleventh N-type transistor N11 is connected between a first power source VDD1 and a second power source VDD2, an eighth resistive element R8 is connected between the gate of the eleventh N-type transistor N11 and the earth potential VSS, an inspecting signal input terminal 15 is connected to the gate of the eleventh N-type transistor N11, and an inspecting well-potential control terminal 16 is connected to the well of the eleventh N-type transistor N11.

Now, operations thereof are described. The operation of the eleventh N-type transistor N11 is similar to that of the eleventh N-type transistor N11 according to the ninth embodiment shown in FIG. 11 and performs a function of a power switch.

In the twelfth embodiment, the inspecting well-potential control terminal 16 is connected to the well of the eleventh N-type transistor N11. Accordingly, in a specific case such as LSI shipping inspection, by supplying a potential lower than the earth potential VSS to the well of the eleventh N-type transistor N11, the threshold voltage of the eleventh N-type transistor can be lowered, thereby suppressing the voltage drop in the ON state of the switch. As a result, it is possible to lower the ON resistance of the power switch.

Thirteenth Embodiment

Figure 15:
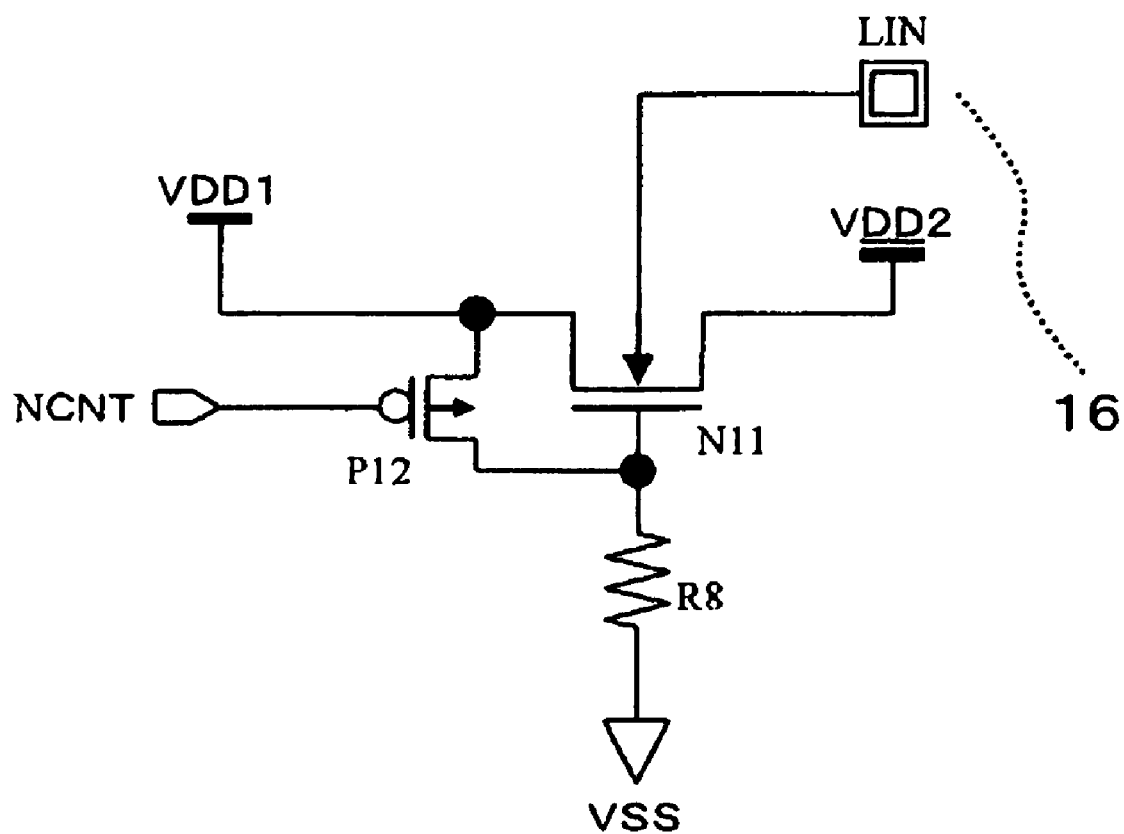
FIG. 15 is a circuit diagram illustrating a power switching circuit according to a thirteenth embodiment of the present invention.

FIG. 15 is a circuit diagram illustrating a power switching circuit according to a thirteenth embodiment of the present invention. In N-type transistors used in the thirteenth embodiment, the well potential and the earth potential can be separated from each other by a triple well structure and thus the N-type transistors can be controlled arbitrarily.

An eleventh N-type transistor N11 is connected between a first power source VDD1 and a second power source VDD2, an eighth resistive element R8 is connected between the gate of the eleventh N-type transistor N11 and the earth potential VSS, a twelfth P-type transistor P12 is connected between the gate of the eleventh N-type transistor N11 and the first power source VDD1, the gate of the twelfth P-type transistor P12 is connected to an inverted control terminal NCNT, and an inspecting well-potential control terminal 16 is connected to the well of the eleventh N-type transistor N11.

Now, operations thereof are described. The operation of the eleventh N-type transistor N11 is similar to that of the eleventh N-type transistor N11 according to the tenth embodiment shown in FIG. 12 and performs a function of a power switch.

In the thirteenth embodiment, the inspecting well-potential control terminal 16 is connected to the well of the eleventh N-type transistor N11. Accordingly, in a specific case such as LSI shipping inspection, by supplying a potential lower than the earth potential VSS to the well of the eleventh N-type transistor N11, the threshold voltage of the eleventh N-type transistor can be lowered, thereby suppressing the voltage drop in the ON state of the switch. As a result, it is possible to lower the ON resistance of the power switch.

Fourteenth Embodiment

Figure 16:
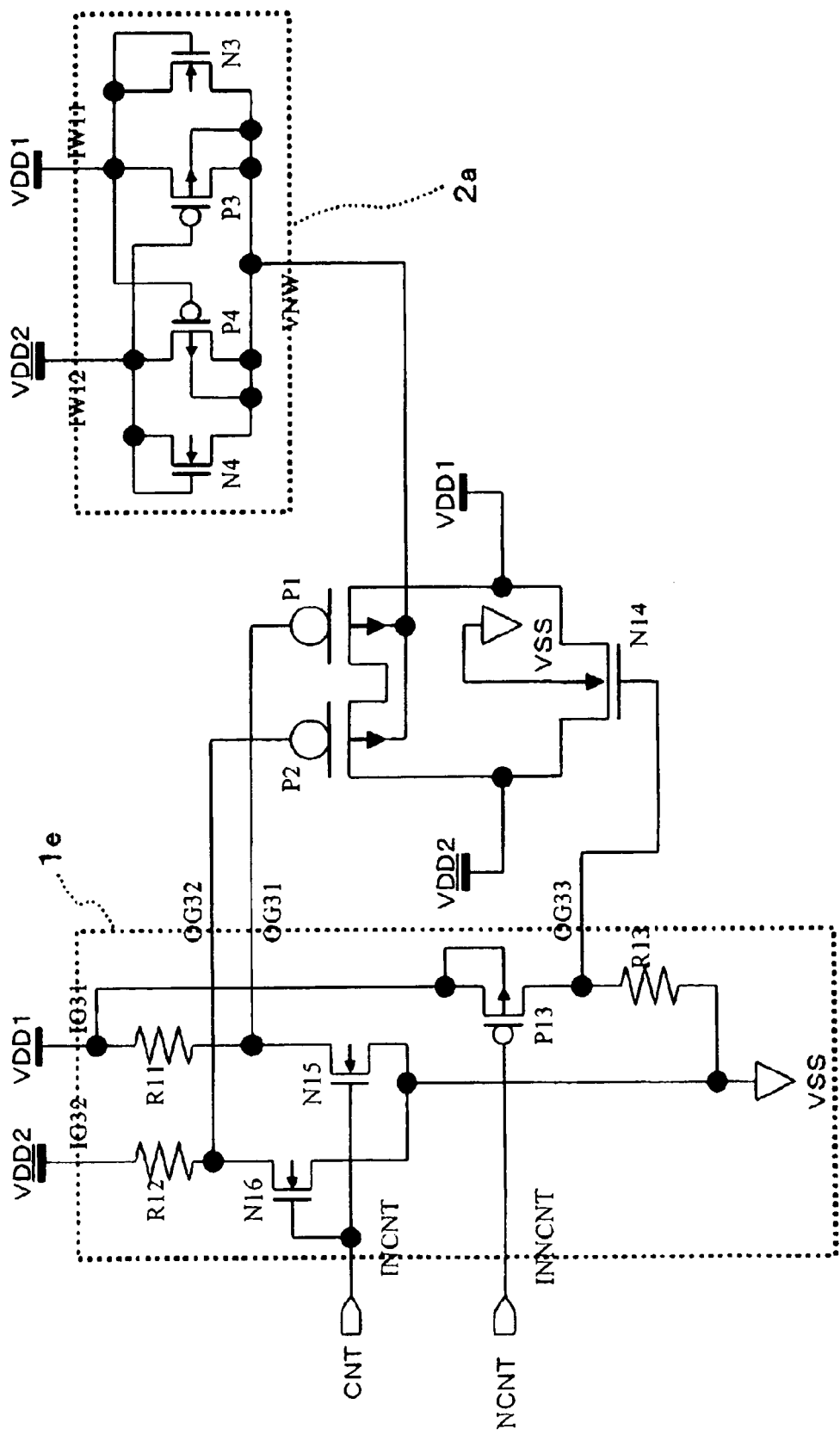
FIG. 16 is a circuit diagram illustrating a power switching circuit according to a fourteenth embodiment of the present invention.

FIG. 16 is a circuit diagram illustrating a power switching circuit according to a fourteenth embodiment of the present invention. In FIG. 16, reference numeral 1e denotes a PN gate control circuit having a control signal terminal INCNT, an inverted control signal terminal INNCNT, a first power supply terminal IG31, and a second power supply terminal IG32 as input and having a first output terminal OG31, a second output terminal OG32, and a third output terminal OG33 as output.

Reference numeral P1 denotes a first P-type transistor of which the gate is connected to the first output terminal of the PN gate control circuit, reference numeral P2 denotes a second P-type transistor of which the gate is connected to the second output terminal OG32 of the PN gate control circuit, and reference numeral N14 denotes a fourteenth N-type transistor of which the gate is connected to the third output terminal OG33 of the PN gate control circuit. Here, the first P-type transistor P1 and the second P-type transistor P2 are connected in series between the first power source VDD1 and the second power source VDD2, and the fourteenth N-type transistor N14 is also connected between the first power source VDD1 and the second power source VDD2, thereby constituting the switch section.

On the other hand, reference numeral 2a is a well-potential control circuit having a first power supply terminal IW11 and a second power supply terminal IW12 as input thereof and having an output terminal VNW as output thereof. The output terminal VNW is connected to the well of the first P-type transistor P1 and the well of the second P-type transistor P2.

First, a case that the power switching circuit according to the fourteenth embodiment is turned on is described. When the control signal CNT is in the high level and the inverted control signal NCNT is in the low level, the PN gate control circuit, as shown in Table 5, outputs a voltage subsequently equal to the earth potential VSS to the first output terminal OG31 and the second output terminal OG32, and outputs a voltage equal to the voltage of the first power supply terminal IG31 to the third output terminal OG33. Accordingly, all the transistors of the switch section, that is, the first P-type transistor P1, the second P-type transistor P2, and the fourteenth N-type transistor N14, are turned on.

Table 5

TABLE 5

Operation of PN gate control circuit

| Input CNT | Input NCNT | Output OG31 | Output OG32 | Output OG33 |
|---|---|---|---|---|
| Low level | High level | Potential of IG31 | Potential of IG32 | Potential of VSS |
| High level | Low level | Potential of VSS | Potential of VSS | Potential of IG31 |

In this state, when a voltage is supplied to the first power source VDD1, the voltage is propagated to the second power source VDD2 and when a voltage is supplied to the second power source VDD2, the voltage is propagated to the first power source VDD1.

The fourteenth embodiment is greatly different from the first embodiment shown in FIG. 1, in that the fourteenth N-type transistor N14 is added to the switch element section. It is possible to further reduce the ON resistance of the power switching circuit in comparison with the case that the switch element section includes only the first P-type transistor P1 and the second P-type transistor P2. In addition, the area of the system-on-chip can be decreased by using the ESD protection circuit for the N-type transistors used in the system-on-chip and a part of the power switching circuit in common.

Next, a case that the power switching circuit according to the fourteenth embodiment is turned off is described. When the control signal CNT is in the low level and the inverted control signal NCNT is in the high level, the PN gate control circuit, as shown in Table 5, outputs a voltage equal to the voltage of the first power supply terminal IG31 to the first output terminal OG31, outputs a voltage equal to the voltage of the second power supply terminal IG32 to the second output terminal OG32, and outputs a voltage equal to the earth potential VSS to the third output terminal OG33. In this state, when the voltages are supplied to the first power source VDD1 and the second power source VDD2 and the voltage of the second power source VDD2 is lower than the voltage of the first power source VDD1, a voltage difference between the gate and the source of the first P-type transistor P1 is zero and thus the first P-type transistor P1 is completely turned off.

When the voltage of the first power source VDD1 is lower than the voltage of the second power source VDD2, a voltage difference between the gate and the source of the second P-type transistor P2 is zero and thus the second P-type transistor P2 is completely turned off. The gate voltage of the fourteenth N-type transistor N14 is always equal to the earth potential VSS and thus the fourteenth N-type transistor N14 is completely turned off.

Accordingly, it can be told that the power switching circuit is completely turned off as a power switch when the voltage of the second power source VDD1 is lower than that of the first power source VDD1 and when the voltage of the first power source VDD1 is lower than that of the second power source VDD2.

In addition, whether the power switching circuit is turned on or off, the well of the first P-type transistor P1 and the well of the second P-type transistor P2 are supplied with the higher voltage of the voltages of the first power source VDD1 and the second power source VDD2 by the well-potential control circuit 2a, as shown in Table 2. Accordingly, unnecessary leakage of current through a parasitic diode existing in the P-type transistors does not occur.

Next, a specific example of the PN gate control circuit is described. In the gate control circuit 1e, an eleventh resistive element R11 and a fifteenth N-type transistor N15 are connected in series between the first power supply terminal IG31 and the earth potential VSS, a twelfth resistive element R12 and a sixteenth N-type transistor N16 are connected in series between the second power supply terminal IG32 and the earth potential VSS, the gate of the fifteenth N-type transistor N15 and the gate of the sixteenth N-type transistor N16 are connected to the control signal terminal INCNT. In addition, a connection node between the eleventh resistive element R11 and the fifteenth N-type transistor N15 serves as a first output terminal OG31, a connection node between the twelfth resistive element R12 and the sixteenth N-type transistor N16 serves as a second output terminal OG32, a thirteenth P-type transistor P13 and a thirteenth resistive element R13 are connected in series between the first power supply terminal IG31 and the earth potential VSS, the gate of the thirteenth P-type transistor P13 is connected to the inverted control signal terminal INNCNT, and a connection node between the thirteenth resistive element R13 and the thirteenth P-type transistor P13 serves as a third output terminal OG33.

In the PN gate control circuit 1e, when the control signal terminal IINCNT is in the low level and the inverted control signal terminal INNCNT is in the high level, the fifteenth N-type transistor N15, the sixteenth N-type transistor N16, and the thirteenth P-type transistor P13 are turned off, the first output terminal OG31 of the PN gate control circuit has a voltage equal to the voltage of the first power supply terminal IG31 by the eleventh resistive element R11, the second output terminal OG32 of the PN gate control circuit has a voltage equal to the voltage of the second power supply terminal IG32 by the twelfth resistive element R12, and the third output terminal OG33 of the PN gate control circuit has a voltage equal to the earth potential by the thirteenth resistive element R13.

When the control signal terminal INCNT is in the high level and the inverted control signal terminal INCNT is in the low level, the fifteenth N-type transistor N15, the sixteenth N-type transistor N16, and the thirteenth P-type transistor P13 are turned on. At this time, when the ON resistance of the fifteenth N-type transistor N15 is sufficiently smaller than the resistance of the eleventh resistive element R11, the first output terminal OG31 is subsequently equal to the earth potential VSS. When the ON resistance of the sixteenth N-type transistor N16 is sufficiently smaller than the resistance of the twelfth resistive element R12, the second output terminal OG32 is subsequently equal to the earth potential. When the ON resistance of the thirteenth P-type transistor P13 is sufficiently smaller than the resistance of the thirteenth resistive element R13, the third output terminal OG33 has a voltage subsequently equal to the voltage of the first power supply terminal IG31. In this way, the necessary operations of the PN gate control circuit shown in Table 5 can be implemented.

In addition, whether the power switching circuit is turned on or off, the well potential of the first P-type transistor P1 and the well potential of the second P-type transistor P2 are controlled to the higher voltage of the voltages of the first power source VDD1 and the second power source VDD2 by the well potential control circuit 2a, as shown in Table 2. Accordingly, unnecessary leakage of current through a parasitic diode existing in the P-type transistors does not occur.

Fifteenth Embodiment

Figure 17:
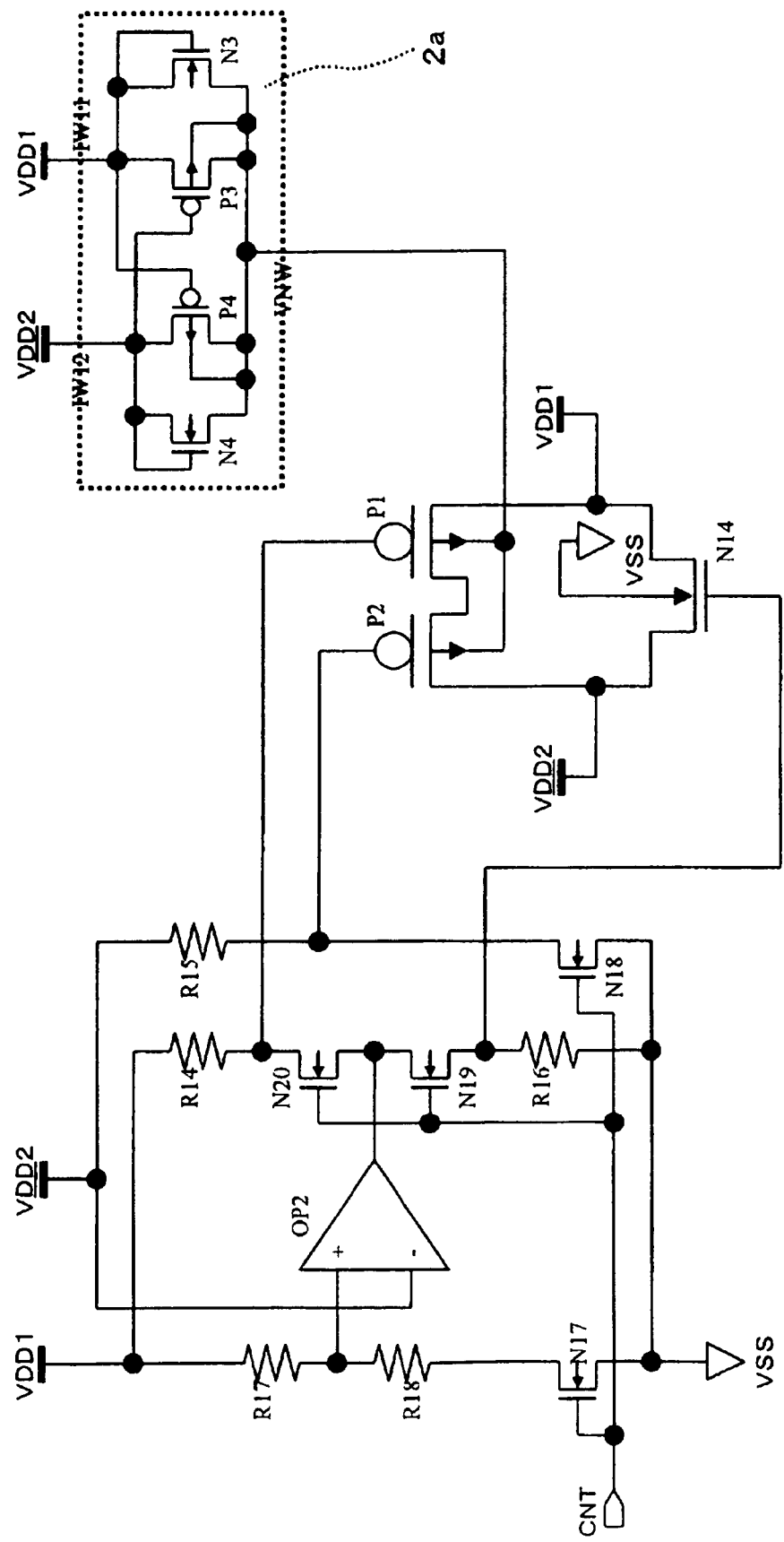
FIG. 17 is a circuit diagram illustrating a power switching circuit according to a fifteenth embodiment of the present invention.
Figure 18:
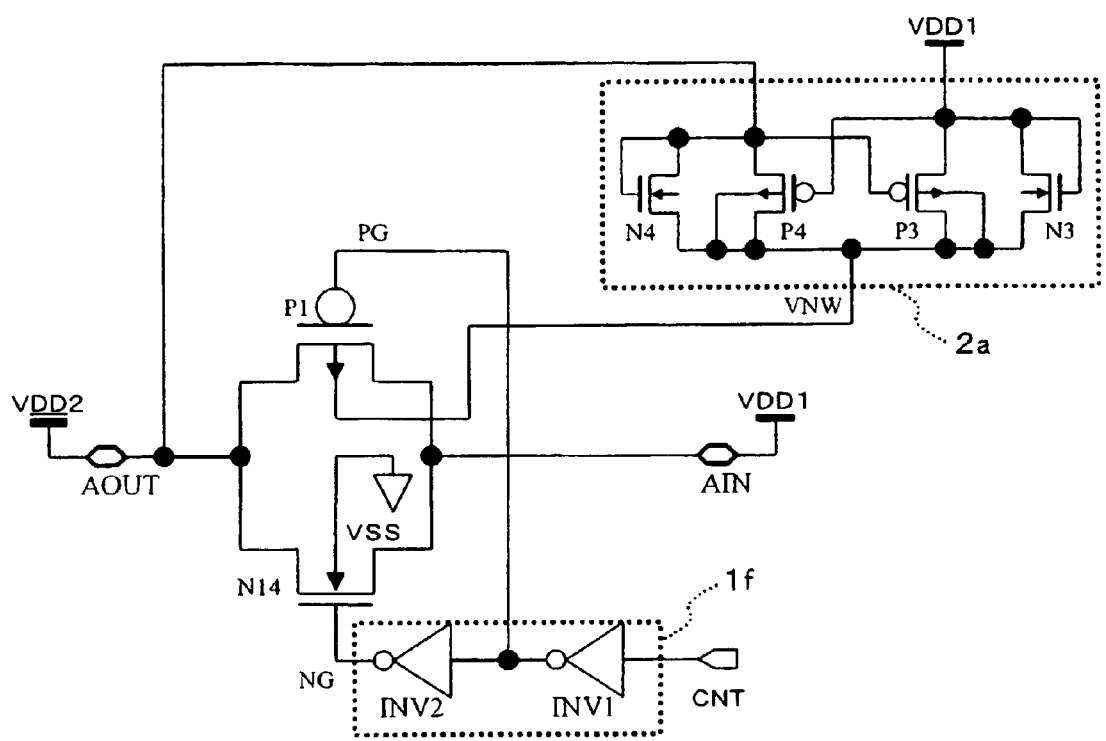
FIG. 18 is a circuit diagram illustrating a conventional power switching circuit.
Figure 19:
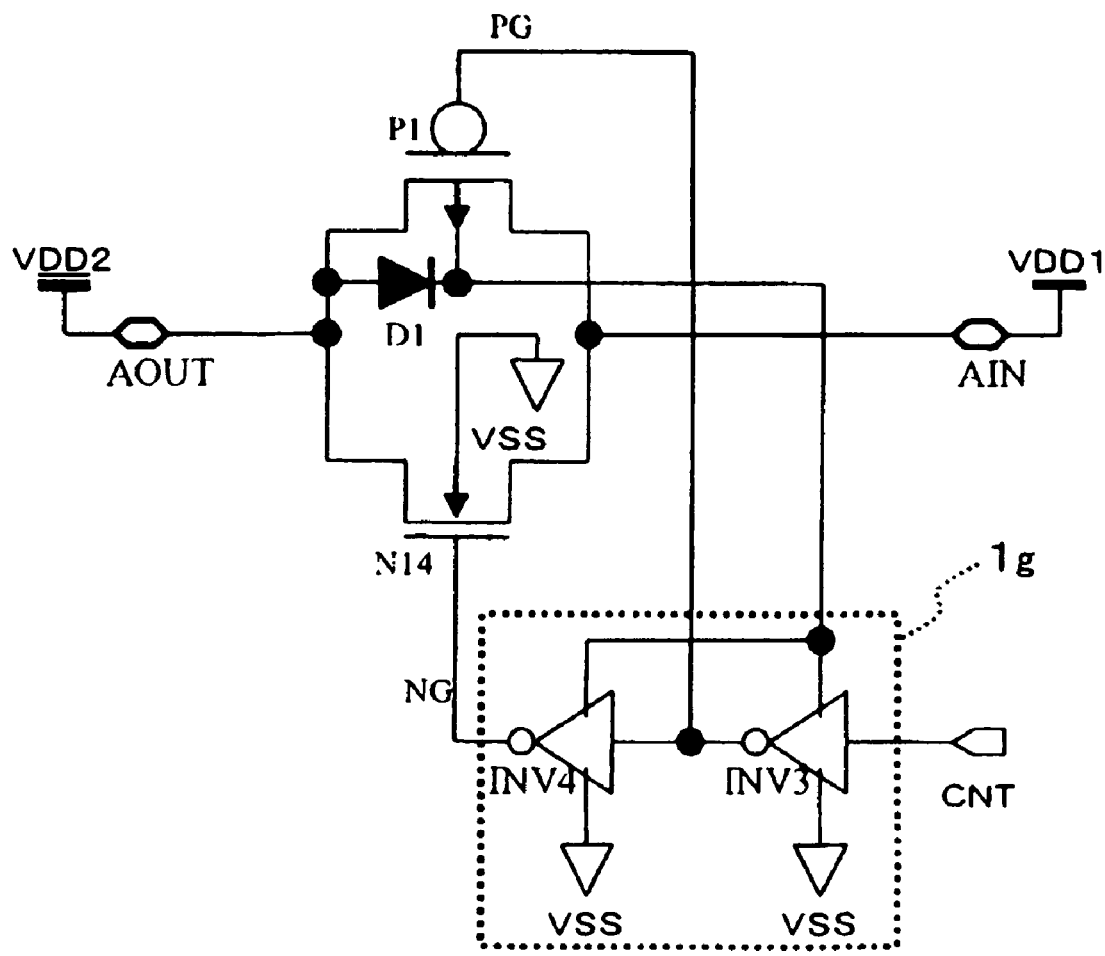
FIG. 19 is a circuit diagram illustrating a conventional power switching circuit.

FIG. 17 is a circuit diagram illustrating a power switching circuit according to a fifteenth embodiment of the present invention. In FIG. 17, reference numeral P1 denotes a first P-type transistor, reference numeral P2 denotes a second P-type transistor, and reference numeral 2a denotes a well-potential control circuit, which are equal to the configuration shown in FIG. 1.

In FIG. 17, reference numeral N17 denotes a seventeenth N-type transistor, reference numeral N18 denotes an eighteenth N-type transistor, reference numeral N19 denotes a nineteenth N-type transistor, reference numeral N20 denotes a twentieth N-type transistor, reference numeral R14 denotes a fourteenth resistive element, reference numeral R15 denotes a fifteenth resistive element, reference numeral R16 denotes a sixteenth resistive element, reference numeral R17 denotes a seventeenth resistive element, reference numeral R18 denotes an eighteenth resistive element, and reference numeral OP2 denotes a second operation amplifier.

The well-potential control circuit 2a having a first power supply terminal IW11, a second power supply terminal IW12, and an output terminal VNW, the first P-type transistor P1, and the second P-type transistor P2 are connected in series between a first power source VDD1 and a second power source VDD2. The fourteenth resistive element R14 is connected between the first power source VDD1 and the gate of the first P-type transistor P1, the fifteenth resistive element R15 is connected between the second power source VDD2 and the gate of the second P-type transistor P2, the eighteenth N-type transistor N18 is connected between the gate of the second P-type transistor P2 and the earth potential VSS, and the seventeenth resistive element R17, the eighteenth resistive element R18, and the seventeenth N-type transistor N17 are connected in series between the first power source VDD1 and the earth potential VSS. The normal input terminal of the second operational amplifier is OP2 is connected to a connection node between the seventeenth resistive element R17 and the eighteenth resistive element R18 and the inverted input terminal of the second operational amplifier OP2 is connected to the second power source VDD2. The twentieth N-type transistor N20 is connected between the gate of the first P-type transistor P1 and the output terminal of the second operational amplifier OP2, the fourteenth N-type transistor N14 is connected between the first power source VDD1 and the second power source VDD2, and the sixteenth resistive element R16 is connected between the gate of the fourteenth N-type transistor N14 and the output of the second operational amplifier OP2. The gate of the seventeenth N-type transistor N17, the gate of the eighteenth N-type transistor N18, the gate of the nineteenth N-type transistor N19, and the gate of the twentieth N-type transistor N20 are connected to the control signal CNT. When the well-potential control circuit 2a outputs a voltage equal to the voltage of the first power source VDD1 to the output terminal VNW when the voltage of the first power source VDD1 is higher than the voltage of the second power source VDD2, and outputs a voltage equal to the voltage of the second power source VDD2 to the output terminal VNW when the voltage of the second power source VDD2 is higher than the voltage of the first power source VDD1.

Now, operations thereof are described. When a voltage is supplied only to the first power source VDD1, no voltage is supplied to the second power source VDD2, and the control signal CNT is in the high level, the seventeenth N-type transistor N17 is turned on, the eighteenth N-type transistor N18 is turned on, the nineteenth N-type transistor N19 is turned on, and the twentieth N-type transistor N20 is turned on. A voltage by resistive voltage division appears in the connection node between the seventeenth resistive element R17 and the eighteenth resistive element R18 and is applied to the normal input terminal of the second operational amplifier OP2.

Since the second operational amplifier OP2 controls its output voltage so that the voltages of the normal input terminal and the inverted input terminal are equal to each other, the gate voltage of the first P-type transistor P1 is controlled so that the voltage generated by the resistive voltage division of the seventeenth resistive element R17 and the eighteenth resistive element R18 is equal to the voltage of the second power source VDD2.

That is, the voltage equal to the voltage determined by the resistance of the seventeenth resistive element R17 and the resistance of the eighteenth resistive element R18 can be supplied to the second power source VDD2 from the first power source VDD1.

When the control signal CNT is in the low level, the seventeenth N-type transistor N17, the eighteenth N-type transistor N18, and the nineteenth N-type transistor N19, and the twentieth N-type transistor N20 are turned off, and the first P-type transistor P1 and the second P-type transistor P2 constituting the switch section are also turned off. Accordingly, the power switch is completely turned off similarly to the circuit shown in FIG. 1.

The fifteenth embodiment is greatly different from the sixth embodiment shown in FIG. 8, in that the fourteenth N-type transistor N14 is added to the switch element section. In comparison with the case that the switch element section includes only the first P-type transistor P1 and the second P-type transistor P2, it is possible to further reduce the ON resistance of the power switching circuit. In addition, the area of the system-on-chip can be decreased by using the ESD protection circuit for the N-type transistors used in the system-on-chip and a part of the power switching circuit in common.

Sixteenth Embodiment

Figure 20:
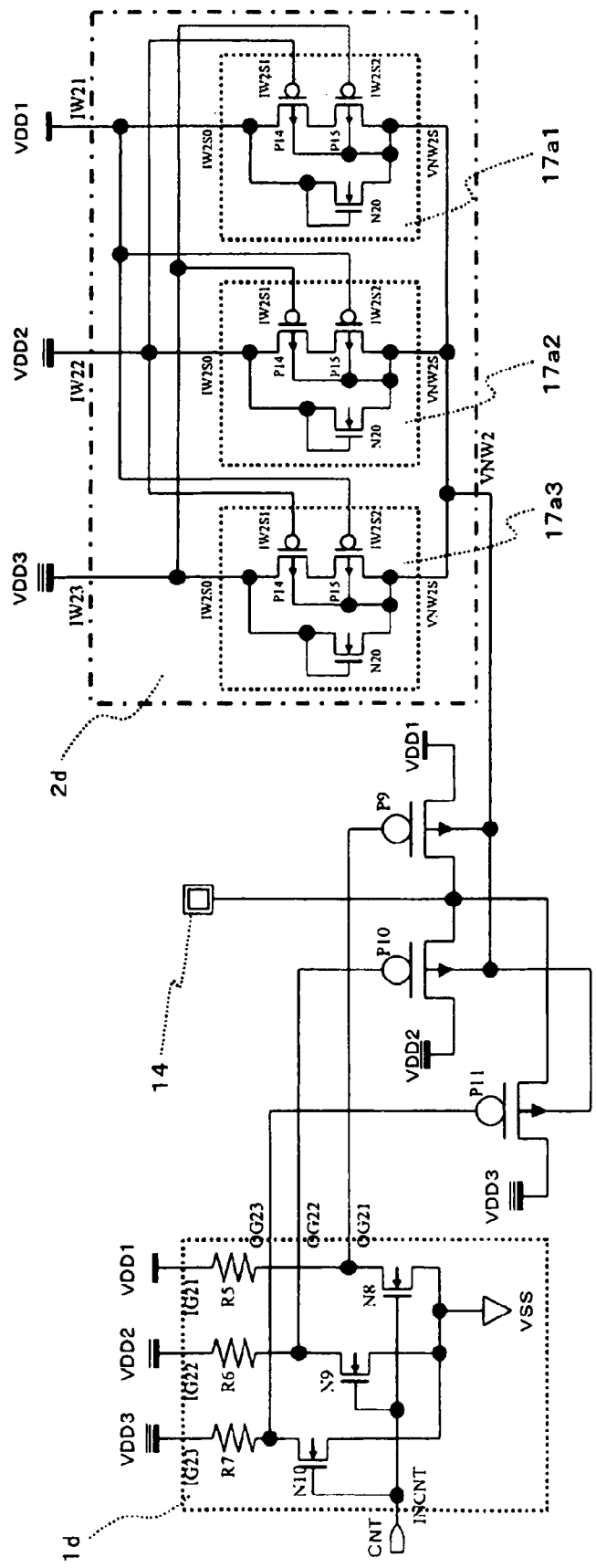
FIG. 20 is a circuit diagram illustrating a power switching circuit according to a sixteenth embodiment of the present invention.

FIG. 20 is a circuit diagram illustrating a power switching circuit according to a sixteenth embodiment of the present invention. A ninth P-type transistor P9, a tenth P-type transistor P10, an eleventh P-type transistor P11, and a 3-power gate control circuit 1d are completely equal to those of the eighth embodiment shown in FIG. 10. A 3-power well-potential control circuit 2d is different from the 3-power well-potential control circuit 2c according to the eighth embodiment shown in FIG. 10 in configuration, but is equal thereto in operation.

A specific example of the 3-power well-potential control circuit 2d is described. The 3-power well-potential control circuit 2d is constructed by combining three 3-power voltage determining circuits 17a. That is, in the 3-power well-potential control circuit, a power supply terminal IW2S0 of a first 3-power voltage determining circuit 17a1 serves as a first power supply terminal IW21 of the 3-power well-potential control circuit 2d, a power supply terminal IW2S0 of a second 3-power voltage determining circuit 17a2 serves as a second power supply terminal IW22 of the 3-power well-potential control circuit 2c, and a power supply terminal IW2S0 of a third 3-power voltage determining circuit 17a3 serves as a third power supply terminal IW23 of the 3-power well-potential control circuit 2d. The second voltage input terminal IW2S2 of the first 3-power voltage determining circuit 17a1 and the first voltage input terminal IW2S1 of the second 3-power voltage determining circuit 17a2 are connected to the third power supply terminal IW23 of the 3-power well-potential control circuit 2d, the first voltage input terminal IW2S2 of the first 3-power voltage determining circuit 17a1 and the first voltage input terminal IW2S1 of the third 3-power voltage determining circuit 17a3 are connected to the second power supply terminal IW22 of the 3-power well-potential control circuit 2d, the second voltage input terminal IW2S2 of the second 3-power voltage determining circuit 17a2 and the second voltage input terminal IW2S2 of the third 3-power voltage determining circuit 17a3 are connected to the first power supply terminal IW21 of the 3-power well-potential control circuit 2d.

Next, a specific example of the 3-power voltage determining circuit 17a is described. The 3-power voltage determining circuit 17a includes a fourteenth P-type transistor P14, a fifteenth P-type transistor P15, and a twentieth N-type transistor N20. The fourteenth P-type transistor P14 and the fourteenth P-type transistor P15 are connected in series between the power supply terminal IW2S0 of the 3-power voltage determining circuit 17a and the output terminal VNW2S of the 3-power voltage determining circuit 17a, and the twentieth N-type transistor N20 is connected between the power supply terminal IW2S0 of the 3-power voltage determining circuit 17a and the output terminal VNW2S of the 3-power voltage determining circuit 17a.

Operations of the 3-power voltage determining circuit 17a are described now. When both of the first voltage input terminal IW2S1 and the second voltage input terminal IW2S2 have a voltage lower than that of the power supply terminal IW2S0, the output terminal VNW2S has a potential subsequently equal to the voltage of the power supply terminal IW2S0. When at least one of the first voltage input terminal IW2S1 and the second voltage input terminal IW2S2 has a voltage higher than that of the power supply terminal IW2S0, the output terminal VNW2S is in a high impedance state (open state).

The 3-power well-potential control circuit 2d an implement operations shown in Table 4 by combining three 3-power voltage determining circuits 17a. Even when the first voltage input terminal IW2S1 and the second voltage input terminal IW2S2 of the 3-power voltage determining circuit 17a are inversely connected, the same operations can be implemented.

Compared with the 3-power well-potential control circuit 2c according to the eighth embodiment shown in FIG. 10, the 3-power well-potential control circuit 2d according to the sixteenth embodiment has the larger number of transistor elements, but has the smaller number of separated wells of the P-type transistors, thereby reducing an area for forming the circuit.

Seventeenth Embodiment

Figure 21:
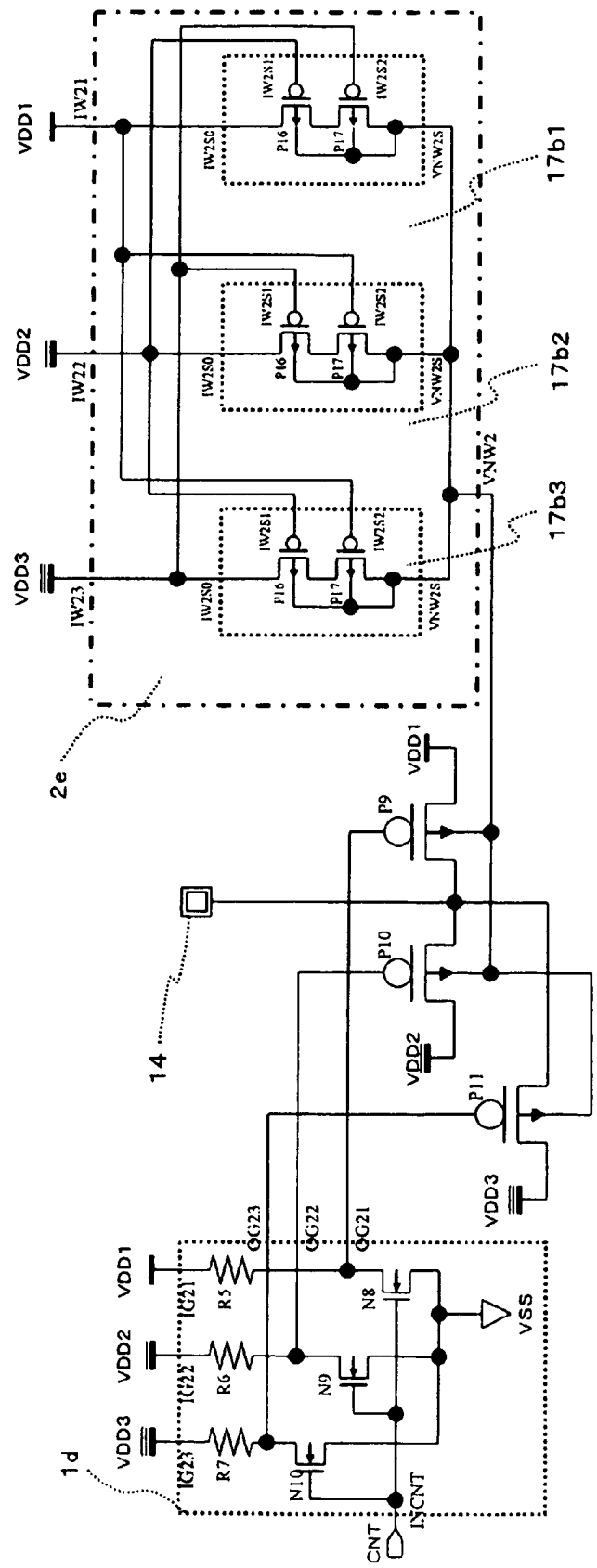
FIG. 21 is a circuit diagram illustrating a power switching circuit according to a seventeenth embodiment of the present invention.

FIG. 21 is a circuit diagram illustrating a power switching circuit according to a seventeenth embodiment of the present invention. A ninth P-type transistor P9, a tenth P-type transistor P10, an eleventh P-type transistor P11, and a 3-power gate control circuit 1d are completely equal to those of the sixteenth embodiment shown in FIG. 20. A 3-power well-potential control circuit 2e is different from the 3-power well-potential control circuit 2d according to the sixteenth embodiment shown in FIG. 20 in configuration, but is equal thereto in operation.

A specific example of the 3-power well-potential control circuit 2e is described. The 3-power well-potential control circuit 2e is constructed by combining three 3-power voltage determining circuits 17b and connections thereof are equal to those of the 3-power well-potential control circuit 2d according to the sixteenth embodiment shown in FIG. 20.

Next, a specific example of the 3-power voltage determining circuit 17b is described. The 3-power voltage determining circuit 17b includes a sixteenth P-type transistor P16 and a seventeenth P-type transistor P17. The sixteenth P-type transistor P16 and the seventeenth P-type transistor P17 are connected in series between a power supply terminal IW2S0 of the 3-power voltage determining circuit 17b and an output terminal VNW2S of the 3-power voltage determining circuit 17b.

The operation of the 3-power voltage determining circuit 17b is equal to that of the 3-power voltage determining circuit 17a according to the sixteenth embodiment shown in FIG. 20. The 3-power well-potential control circuit 2e can implement operations shown in Table 4 by combining three 3-power voltage determining circuits 17b. Even when the first voltage input terminal IW2S1 and the second voltage input terminal IW2S2 of the 3-power voltage determining circuit 17b are inversely connected, the same operations can be implemented.

Compared with the 3-power well-potential control circuit 2d according to the fifteenth embodiment shown in FIG. 20, the output terminal VNW2S of the 3-power well-potential control circuit 2e according to the seventeenth embodiment is slightly unstable but the number of transistor elements can be reduced. Accordingly, it is possible to reduce an area for forming the circuit.

Eighteenth Embodiment

Figure 22:
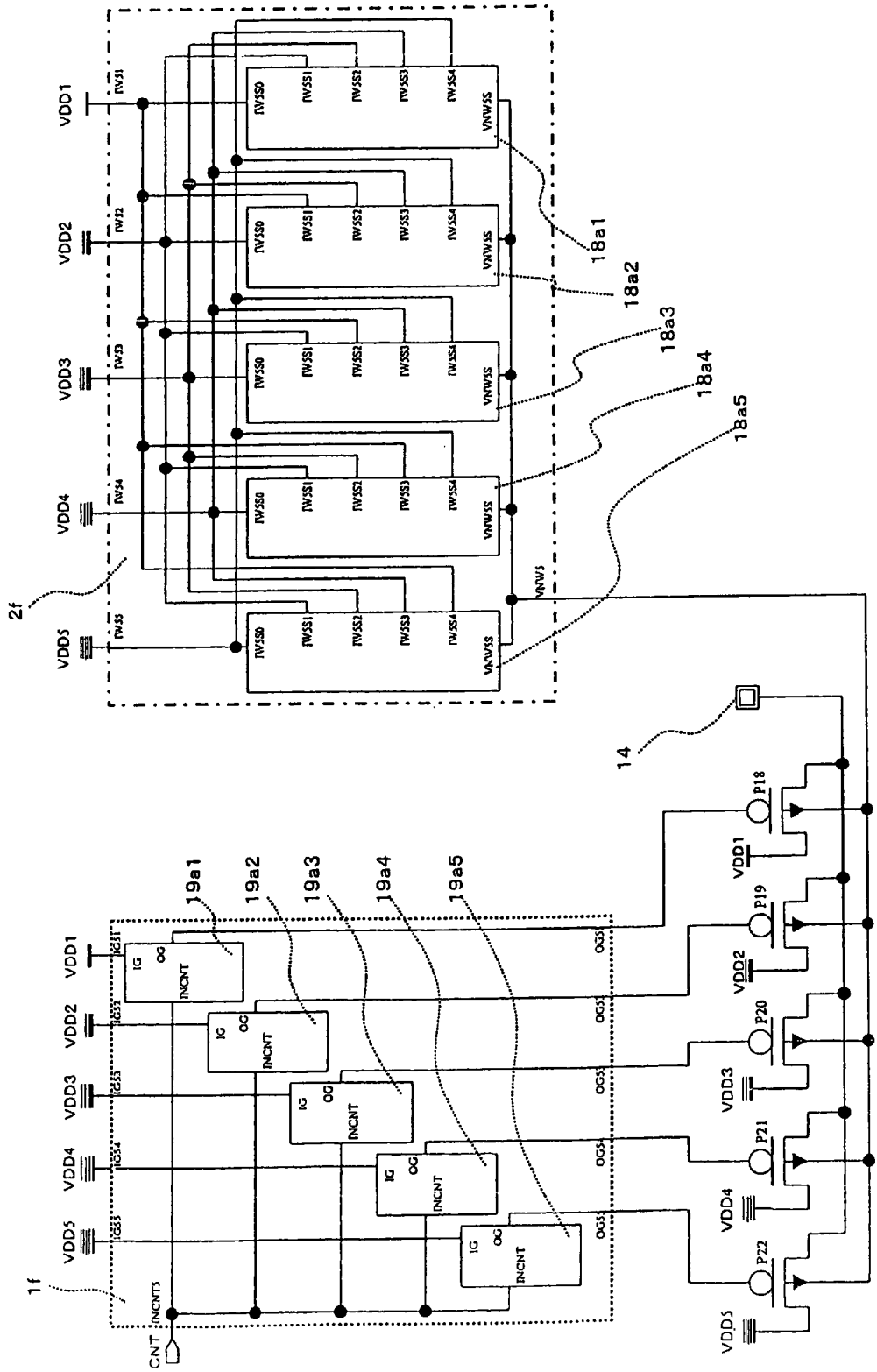
FIG. 22 is a circuit diagram illustrating a power switching circuit according to an eighteenth embodiment of the present invention.

FIG. 22 is a circuit diagram illustrating a power switching circuit according to an eighth embodiment of the present invention. An eighth P-type transistor P18 is connected between a first power source VDD1 and an inspecting power supply terminal 14, a nineteenth P-type transistor P19 is connected between a second power source VDD2 and the inspecting power supply terminal 14, a twentieth P-type transistor P20 is connected between a third power source VDD3 and the inspecting power supply terminal 14, a twenty first P-type transistor P21 is connected between a fourth power source VDD4 and the inspecting power supply terminal 14, and a twenty second P-type transistor P22 is connected between a fifth power source VDD5 and the inspecting power supply terminal 14. A first power supply terminal IG51 of a 5-power gate control circuit is connected to the first power source VDD1, a second power supply terminal IG52 is connected to the second power source VDD2, a third power supply terminal IG53 is connected to the third power source VDD3, a fourth power supply terminal IG54 is connected to the fourth power source VDD4, and a fifth power supply terminal IG55 is connected to the fifth power source VDD5. A first output terminal OG51 is connected to the gate of the eighteenth P-type transistor P18, a second output terminal OG52 is connected to the gate of the nineteenth P-type transistor P19, a third output terminal OG53 is connected to the gate of the twentieth P-type transistor P20, a fourth output terminal OG54 is connected to the gate of the twenty first P-type transistor P21, and a fifth output terminal OG55 is connected to the gate of the twenty second P-type transistor P22. A control signal terminal INCNT5 is connected to a control signal CNT A first power supply terminal IW51 of a 5-power well-potential control circuit is connected to the first power source VDD1, a second power supply terminal IW52 is connected to the second power source VDD2, a third power supply terminal IW53 is connected to the third power source VDD3, a fourth power supply terminal IW54 is connected to the fourth power source VDD4, and a fifth power supply terminal IW55 is connected to the fifth power source VDD5. An output terminal VNW5 is connected to the well of the eighteenth P-type transistor P18, the well of the nineteenth P-type transistor P19, the well of the twentieth P-type transistor P20, the well of the twenty first P-type transistor P21, and the well of the twenty second P-type transistor P22.

First, a specific example of the 5-power well-potential control circuit 2f is described. The 5-power well-potential control circuit, as shown in Table 7, serves to output from its output terminal NW5 a voltage equal to the highest voltage among the voltages of the first power supply terminal IW51, the second power supply terminal IW52, the third power supply terminal IW53, the power supply terminal IW54, and the fifth power supply terminal IW55. The circuit is constructed by combining five 5-power voltage determining circuits. A power supply terminal IW5S0 of a first 5-power voltage determining circuit is connected to the first power source VDD1, and a first voltage input terminal IW5S1, a second voltage input terminal IW5S2, a third voltage input terminal IW5S3, and a fourth voltage input terminal IW5S4 are connected to the second power source VDD2, the third power source VDD3, the fourth power source VDD4, and the fifth power source VDD5. A power supply terminal IW5S0 of a second 5-power voltage determining circuit is connected to the second power source VDD2, and the first voltage input terminal IW5S1, the second voltage input terminal IW5S2, the third voltage input terminal IW5S3, and the fourth voltage input terminal IW5S4 are connected to the first power source VDD1, the third power source VDD3, the fourth power source VDD4, and the fifth power source VDD5. A power supply terminal IW5S0 of a third 5-power voltage determining circuit is connected to the third power source VDD3, and the first voltage input terminal IW5S1, the second voltage input terminal IW5S2, the third voltage input terminal IW5S3, and the fourth voltage input terminal IW5S4 are connected to the first power source VDD1, the second power source VDD2, the fourth power source VDD4, and the fifth power source VDD5. A power supply terminal IW5S0 of a fourth 5-power voltage determining circuit is connected to the fourth power source VDD4, and the first voltage input terminal IW5S1, the second voltage input terminal IW5S2, the third voltage input terminal IW5S3, and the fourth voltage input terminal IW5S4 are connected to the first power source VDD1, the second power source VDD2, the third power source VDD3, and the fifth power source VDD5. A power supply terminal IW5S0 of a fifth 5-power voltage determining circuit is connected to the fifth power source VDD5, and the first voltage input terminal IW5S1, the second voltage input terminal IW5S2, the third voltage input terminal IW5S3, and the fourth voltage input terminal IW5S4 are connected to the first power source VDD1, the second power source VDD2, the third power source VDD34, and the fourth power source VDD4. All the output terminals VNW5S of the first 5-power voltage determining circuit, the second 5-power voltage determining circuit, the third 5-power voltage determining circuit, the fourth 5-power voltage determining circuit, and the fifth 5-power voltage determining circuit are connected to each other, thereby constituting an output terminal VNW5 of the 5-power well-potential control circuit 2f.

TABLE 6

Operation of 5-power gate control circuit

| Input CNT | Output OG51 | Output OG52 | Output OG53 | Output OG54 | Output OG55 |
|---|---|---|---|---|---|
| Low level | Potential of IG51 | Potential of IG52 | Potential of IG53 | Potential of IG54 | Potential of IG55 |
| High level | Potential of VSS | Potential of VSS | Potential of VSS | Potential of VSS | Potential of VSS |

TABLE 7

Operation of 5-power well-potential control circuit

| Voltage relation between inputs IW51, IW52, IW53, IW54, and IW55 | Output VNW5 |
|---|---|
| IW51 > (IW52, IW53, IW54, and IW55) (Voltage of IW51 is highest) | Potential of IW51 |
| IW52 > (IW51, IW53, IW54, and IW55) (Voltage of IW52 is highest) | Potential of IW52 |
| IW53 > (IW51, IW52, IW54, and IW55) (Voltage of IW53 is highest) | Potential of IW53 |
| IW54 > (IW51, IW52, IW53, and IW55) (Voltage of IW54 is highest) | Potential of IW54 |
| IW55 > (IW51, IW52, IW53, and IW54) (Voltage of IW55 is highest) | Potential of IW55 |

Figure 23:
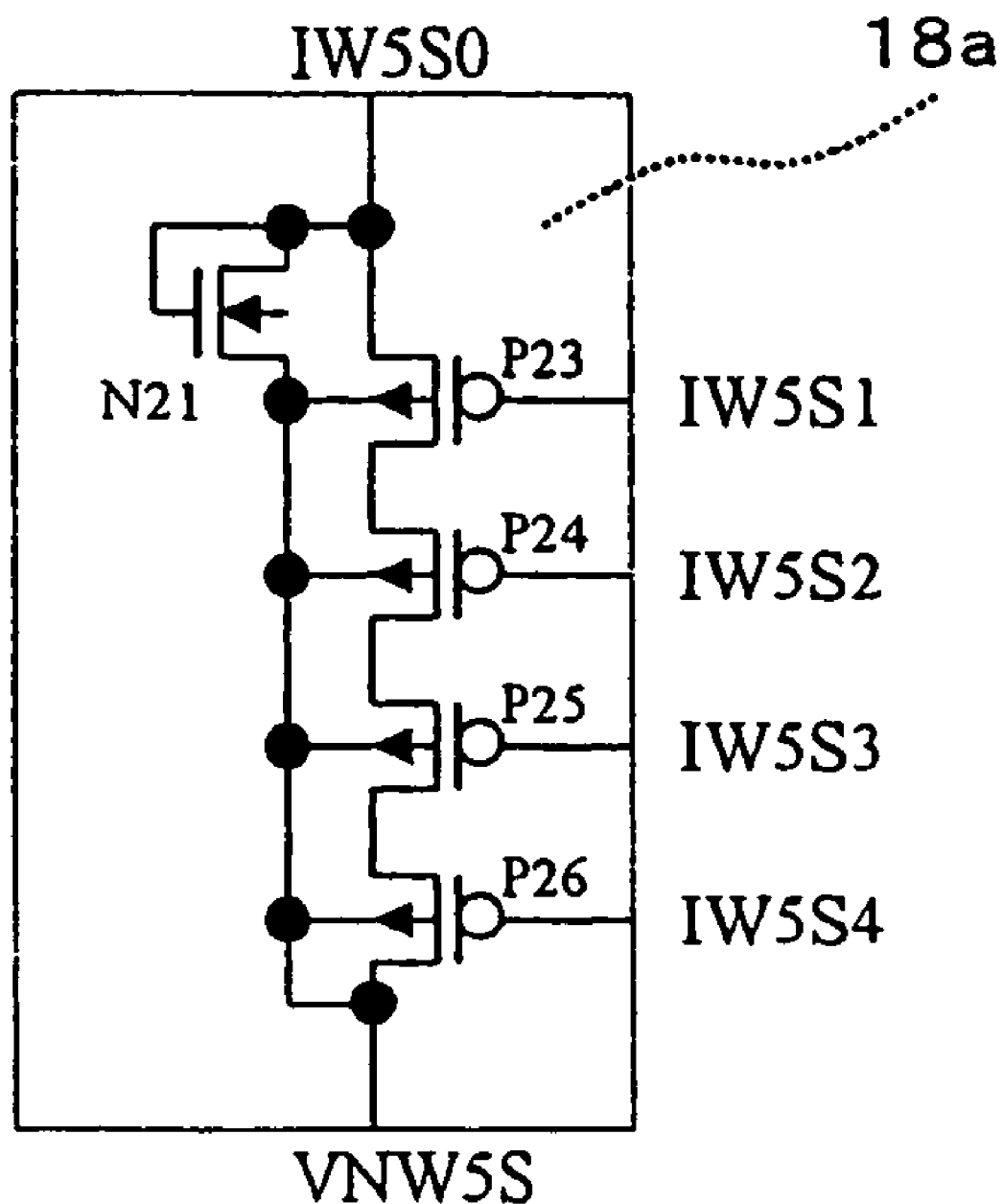
FIG. 23 is a circuit diagram illustrating a 5-power voltage determining circuit used in the power switching circuit according to the eighteenth embodiment of the present invention.

A specific example of the 5-power voltage determining circuit 18a is described. FIG. 23 shows the 5-powervoltage determining circuit 18a, which includes a twenty third P-type transistor P23, a twenty fourth P-type transistor P24, a twenty fifth P-type transistor P25, a twenty sixth P-type transistor P26, and a twenty first N-type transistor N21. The twenty third P-type transistor P23, the twenty fourth P-type transistor P24, the twenty fifth P-type transistor P25, and the twenty sixth P-type transistor P26 are connected in series between the power supply terminal IW5S0 of the 5-power voltage determining circuit 18a and the output terminal VNW5S of the 5-power voltage determining circuit 18a, and the twenty first N-type transistor N21 is connected between the power supply terminal IW5S0 of the 5-power voltage determining circuit 18a and the output terminal VNW5S of the 5-power voltage determining circuit 18a. An operation of the 5-power voltage determining circuit 18a is described. As shown in Table 8, when all the voltages of the first voltage input terminal IW5S1, the second voltage input terminal IW5S2, the third voltage input terminal IW5S3, and the fourth voltage input terminal IW5S4 are lower than the voltage of the power supply terminal IW5S0, the output terminal VNW5S has a potential subsequently equal to the power supply terminal IW5S0. When at least one voltage among the voltages of the first voltage input terminal IW5S1, the second voltage input terminal IW5S2, the third voltage input terminal IW5S3, and the fourth voltage input terminal IW5S4 is greater than or equal to the voltage of the power supply terminal IW5S0, the output terminal VNW5S is changed to a high impedance state (open state).

TABLE 8

Operation of 5-power voltage determining circuit

| Voltage relation between inputs IW5S0, IW5S1, IW5S2, IW5S3, and IW5S4 | Output VNW5S |
|---|---|
| IW5S0 > (IW5S1, IW5S2, IW5S3, and IW5S4) (Voltage of IW5S0 is highest) | Potential of IW5S0 |
| IW5S0 < (IW5S1, IW5S2, IW5S3, or IW5S4) (any one voltage among voltages of IW5S1, IW5S2, IW5S3, and IW5S4 is higher than voltage of IW5S0) | High impedance state (OPEN) |

A specific example of the 5-power gate control circuit 1f is described. As shown in Table 6, when the control signal terminal INCNT5 connected to the control signal CNT is in the low level, the 5-power gate control circuit outputs a voltage subsequently equal to the voltage input to the first power supply terminal IG51 to the first output terminal OG51, outputs a voltage subsequently equal to the voltage input to the second power supply terminal IG52 to the second output terminal OG52, outputs a voltage subsequently equal to the voltage input to the third power supply terminal IG53 to the third output terminal OG53, outputs a voltage subsequently equal to the voltage input to the fourth power supply terminal IG54 to the fourth output terminal OG54, and outputs a voltage subsequently equal to the voltage input to the fifth power supply terminal IG55 to the fifth output terminal OG55. When the control signal terminal INCNT5 connected to the control signal CNT is in the high level the 5-power gate control signal outputs a voltage subsequently equal to the earth potential VSS to the first output terminal OG51, the second output terminal OG52, the third output terminal OG53, the fourth output terminal OG54, and the fifth output terminal OG55. The specific example of the 5-power gate control signal is constructed by combining 5 gate signal circuits. A power supply terminal IG of a first gate signal circuit 19a1 is connected to the first power supply terminal IG51 of the 5-power gate control circuit 1f, a control signal terminal INCNT is connected to the control signal terminal INCNT5 of the 5-power gate control circuit 1f, and an output terminal OG is connected to the first output terminal OG51 of the 5-power gate control circuit 1f. A power supply terminal IG of a second gate signal circuit 19a2 is connected to the second power supply terminal IG52 of the 5-power gate control circuit 1f, a control signal terminal INCNT is connected to the control signal terminal INCNT5 of the 5-power gate control circuit 1f, and an output terminal OG is connected to the second output terminal OG52 of the 5-power gate control circuit 1f. A power supply terminal IG of a third gate signal circuit 19a3 is connected to the third power supply terminal IG53 of the 5-power gate control circuit 1f, a control signal terminal INCNT is connected to the control signal terminal INCNT5 of the 5-power gate control circuit 1f, and an output terminal OG is connected to the third output terminal OG53 of the 5-power gate control circuit 1f. A power supply terminal IG of a fourth gate signal circuit 19a4 is connected to the fourth power supply terminal IG54 of the 5-power gate control circuit 1f, a control signal terminal INCNT is connected to the control signal terminal INCNT5 of the 5-power gate control circuit 1f, and an output terminal OG is connected to the fourth output terminal OG54 of the 5-power gate control circuit 1f. A power supply terminal IG of a fifth gate signal circuit 19a5 is connected to the fifth power supply terminal IG55 of the 5-power gate control circuit 1f, a control signal terminal INCNT is connected to the control signal terminal INCNT5 of the 5-power gate control circuit 1f, and an output terminal OG is connected to the fifth output terminal OG55 of the 5-power gate control circuit 1f.

Figure 25:
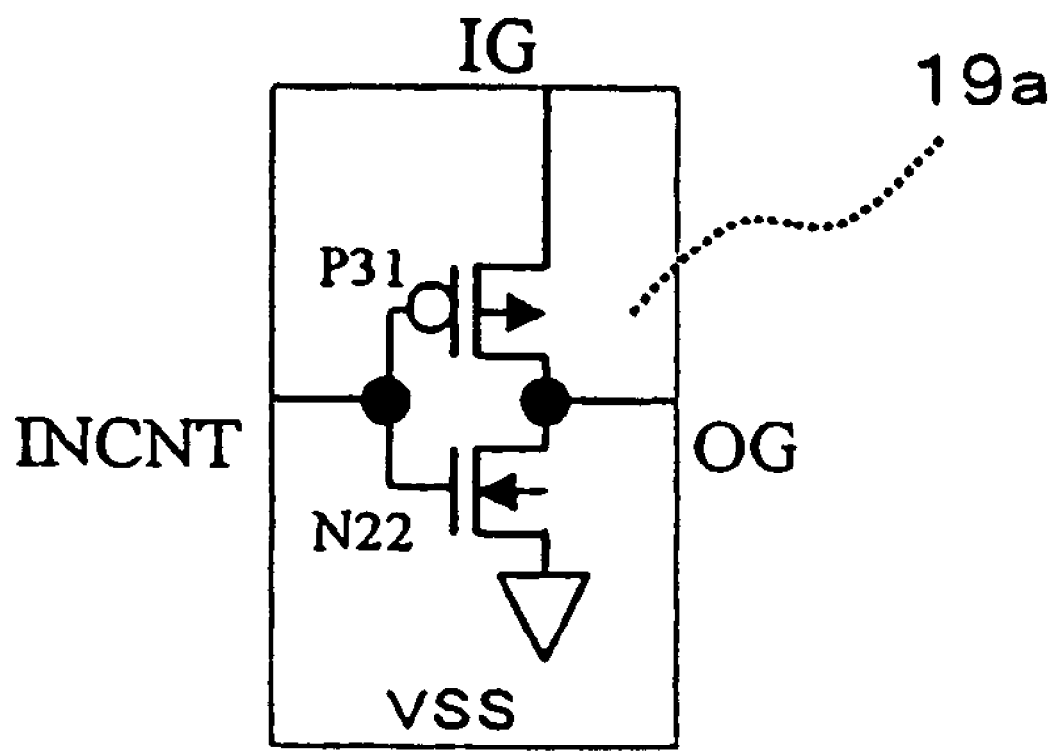
FIG. 25 is a circuit diagram illustrating a gate signal circuit used in the power switching circuit according to the eighteenth embodiment of the present invention.

Next, a specific example of the gate signal circuit is described. The gate signal circuit, as shown in Table 9, outputs a potential substantially equal to the power supply terminal IG from the output terminal OG when the control signal terminal INCNT is in the low level, and outputs a potential substantially equal to the earth potential VSS from the output terminal OG FIG. 25 shows a configuration of the gate signal circuit 19a, which includes a thirty first P-type transistor P31 and a twenty second N-type transistor N22. The source of the thirty first P-type transistor P31 is connected to the power supply terminal IG of the gate signal circuit 19a, the source of the twenty second N-type transistor N22 is connected to the earth potential VSS, the drain of the thirty first P-type transistor P31 and the drain of the twenty second N-type transistor N22 are all connected to the output terminal OG of the gate signal circuit 19a, and the gate of the thirty first P-type transistor P31 and the gate of the twenty second N-type transistor N22 are all connected to the control signal terminal INCNT of the gate signal circuit 19a. The necessary operation can be implemented by the use of such a circuit configuration.

TABLE 9

Operation of gate signal circuit

| Input INCNT | Output OG |
|---|---|
| Low level | Potential of IG |
| High level | Potential of VSS |

First, a case that the power switching circuit according to the eighteenth embodiment is on the ON state is described. When the control signal CNT is in the high level, the 5-power gate control circuit, as shown in Table 6, outputs a voltage substantially equal to the earth potential VSS to the first output terminal OG51, the second output terminal OG52, the third output terminal OG53, the fourth output terminal OG54, and the fifth output terminal OG55. The eighteenth P-type transistor P18, the nineteenth P-type transistor P19, the twentieth P-type transistor P20, the twenty first P-type transistor P21, and the twenty second P-type transistor P22 are all turned on.

In this state, when a voltage is supplied to the inspecting power supply terminal 14, the voltage is propagated to the first power source VDD1, the second power source VDD2, the third power source VDD3, the fourth power source VDD4, and the fifth power source VDD5.

Next, a case that the power switching circuit according to the eighteenth embodiment is in the OFF state is described. When the control signal CNT is in the low level, the 5-power gate control circuit, as shown in Table 6, outputs a voltage substantially equal to the first power source VDD1 to the first output terminal OG51, outputs a voltage substantially equal to the second power source VDD2 to the second output terminal OG52, the third output terminal OG53, outputs a voltage substantially equal to the fourth power source VDD4 to the fourth output terminal OG54, and outputs a voltage substantially equal to the fifth power source VDD5 to the fifth output terminal OG55.

In this state, when voltages are supplied to the first power source VDD1, the second power source VDD2, the third power source VDD3, the fourth power source VDD4, and the fifth power source VDD5 and the inspecting power supply terminal 14 is in the open state, a voltage difference between the gate and the source, that is, a voltage difference from the side connected to the first power source VDD1, of the eighteenth P-type transistor P18 is zero, and thus current does not flow in the inspecting power supply terminal 14 from the first power source VDD1.

The same is true of the nineteenth P-type transistor P19, the twentieth P-type transistor P20, the twenty first P-type transistor P21, and the twenty second P-type transistor P22. Accordingly, current does not flow in the inspecting power supply terminal 14 from the second power source VDD2, the third power source VDD3, the fourth power source VDD4, and the fifth power source VDD5.

When the inspecting power supply terminal 14 is in the open state but the potential thereof is generally increased, for example, when the first power source VDD1 has the lowest voltage, a voltage difference exists between the gate and the source, that is, the side connected to the inspecting power supply terminal 14, of the eighteenth P-type transistor P18. Accordingly, current flows to the first power source VDD1 from the inspecting power supply terminal 14. That is, the current flows until the potential of the inspecting power supply terminal 14 is substantially equal to the potential of the first power source VDD1 and the current does not flow thereafter.

The same is true of the combinations that any one of the second power source VDD2, the third power source VDD3, the fourth power source VDD4, and the fifth power source VDD5 is the lowest voltage, respectively. As a result, in all the combinations of power sources, the inspecting power supply terminal 14 has the lowest voltage among the voltages of the first power source VDD1, the second power source VDD2, the third power source VDD3, the fourth power source VDD4, and the fifth power source VDD5.

Finally, the eighteenth P-type transistor P18, the nineteenth P-type transistor P19, the twentieth P-type transistor P20, the twenty first P-type transistor P21, and the twenty second P-type transistor P22 are all turned off.

Nineteenth Embodiment

Figure 24:
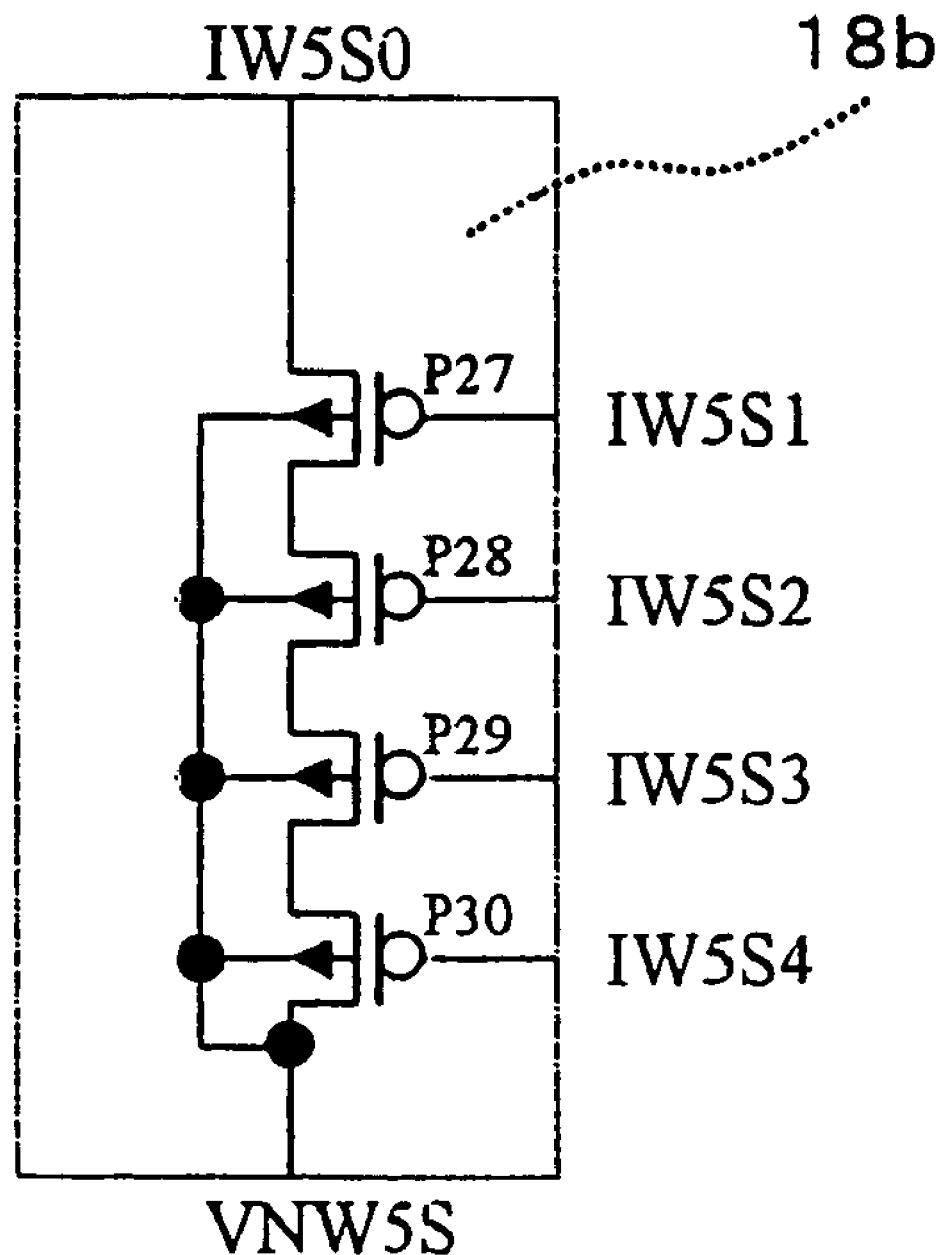
FIG. 24 is a circuit diagram illustrating a 5-power voltage determining circuit used in a power switching circuit according to a nineteenth embodiment of the present invention.

FIG. 24 is a circuit diagram illustrating a 5-power voltage determining circuit used in a power switching circuit according to a nineteenth embodiment of the present invention. An operation of the 5-power voltage determining circuit 18b is slightly unstable and is basically equal to that shown in Table 8. The 5-power voltage determining circuit requires the smaller number of elements than that of the 5-power voltage determining circuit 18a shown in FIG. 23, and thus is advantageous for decrease in area.

Twentieth Embodiment

Figure 26:
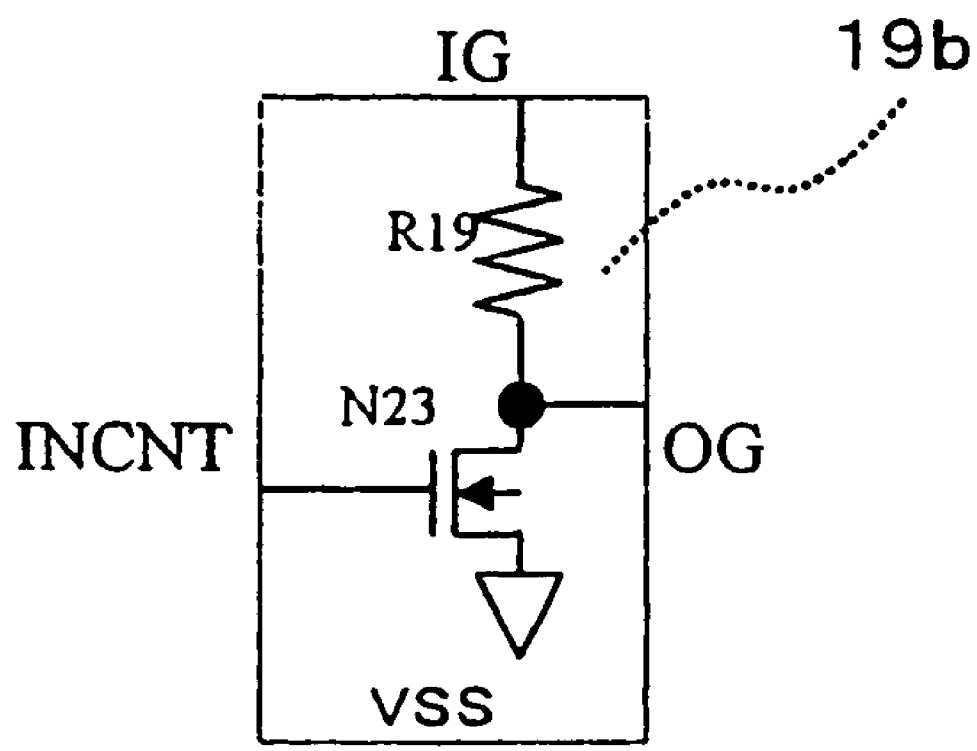
FIG. 26 is a circuit diagram illustrating a gate signal circuit used in a power switching circuit according to a twentieth embodiment of the present invention.

FIG. 26 is a circuit diagram illustrating a gate signal circuit used for a power switching circuit according to a twentieth embodiment of the present invention. The gate signal circuit 19b is constructed by replacing the thirty first P-type transistor of the gate signal circuit 19a shown in FIG. 25 with a resistive element R19, and basically performs the operation shown in Table 9. The gate signal circuit 19b is equivalent to the gate signal circuit 19a shown in FIG. 25.

Twenty first Embodiment

Figure 27:
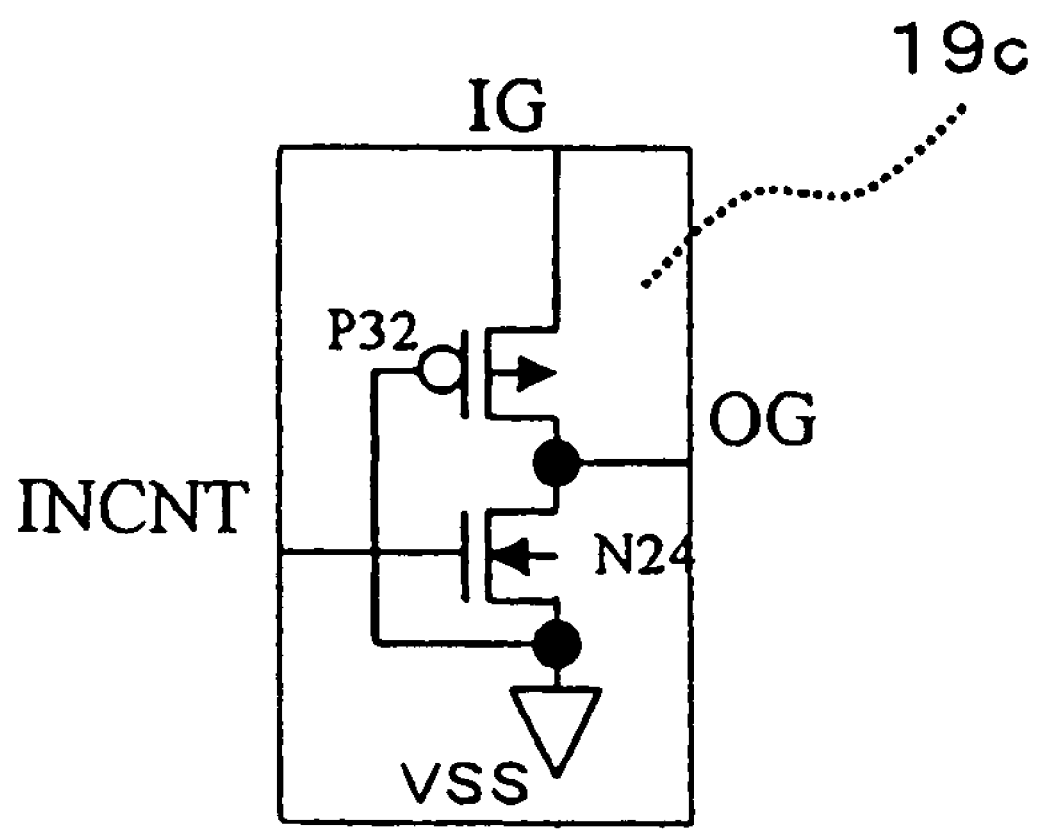
FIG. 27 is a circuit diagram illustrating a gate signal circuit used in a power switching circuit according to a twenty first embodiment of the present invention.

FIG. 27 is a circuit diagram illustrating a gate signal circuit used for a power switching circuit according to a twenty first embodiment of the present invention. In the gate signal circuit 19c, the gate of the thirty first P-type transistor P31 of the gate signal circuit 19a shown in FIG. 25 is connected to the earth potential VSS, a thirty second P-type transistor P32 is further provided, and an operation thereof is basically equal to that shown in Table 9. The gate signal circuit 19c is equivalent to the gate signal circuit shown in FIG. 25.

Twenty Second Embodiment

Figure 28:
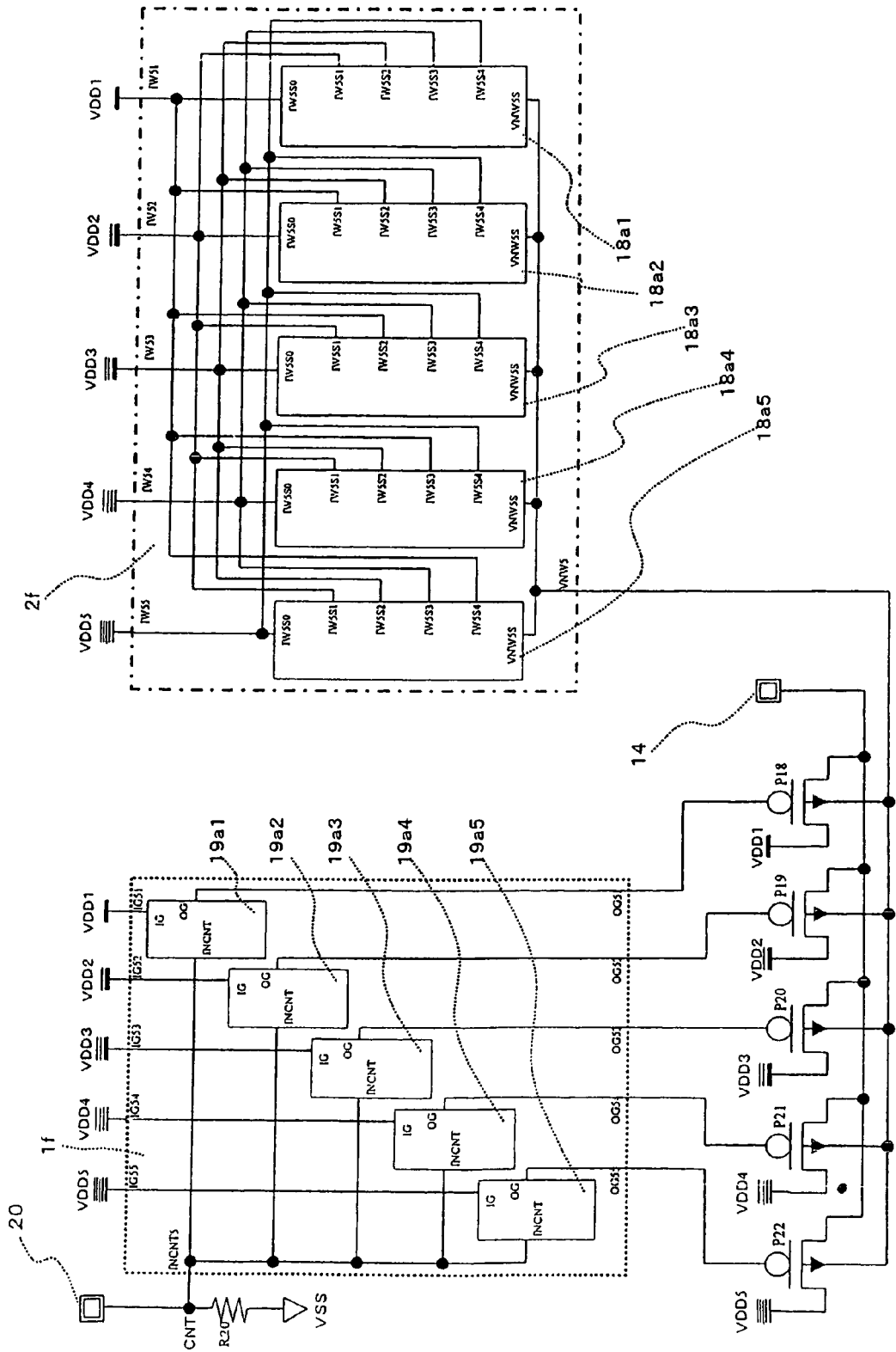
FIG. 28 is a circuit diagram illustrating a power switching circuit according to a twenty second embodiment of the present invention.

FIG. 28 is a circuit diagram illustrating a power switching circuit according to a twenty second embodiment of the present invention. An eighteenth P-type transistor P18, a nineteenth P-type transistor P19, a twentieth P-type transistor P20, a twenty first P-type transistor P21, a twenty second P-type transistor P22, a 5-power gate control circuit 1f, and a 5-power well-potential control circuit 2f are equal to those according to the eighteenth embodiment shown in FIG. 22. The control signal terminal INCNT5 of the 5-power gate control circuit 1f is connected to an inspecting control input terminal 20 and a resistive element R22 is connected between the control signal terminal INCNT5 and the earth potential VSS.

The basic operation is shown in Table 10. In comparison with the circuit according to the eighteenth embodiment shown in FIG. 22, even when the control signal terminal INCNT5 of the 5-power gate control circuit 1f is in the high impedance state that a control signal for the inspecting control input terminal 20 is not input, the eighteenth P-type transistor P18, the nineteenth P-type transistor P19, the twentieth P-type transistor P20, the twenty first P-type transistor P21, and the twenty second P-type transistor P22 can be all turned off, thereby improving convenience.

TABLE 10

Operations of inspecting control input terminal and 5-power gate control circuit

| State of inspecting control input terminal | State of inspecting control input terminal 19 | Output OG51 | Output OG52 | Output OG53 | Output OG54 | Output OG55 |
|---|---|---|---|---|---|---|
| Low level input | Low level | Potential of IG51 | Potential of IG52 | Potential of IG53 | Potential of IG54 | Potential of IG55 |

TABLE 10-continued

Operations of inspecting control input terminal and 5-power gate control circuit

| State of inspecting control input terminal | State of inspecting control input terminal 19 | Output OG51 | Output OG52 | Output OG53 | Output OG54 | Output OG55 |
|---|---|---|---|---|---|---|
| High level input | High level | Potential of VSS | Potential of VSS | Potential of VSS | Potential of VSS | Potential of VSS |
| High impedance state (OPEN) | Low level | Potential of IG51 | Potential of IG52 | Potential of IG53 | Potential of IG54 | Potential of IG55 |

The power switching circuit according to the present invention has a structure which can completely break a current in the OFF state of a switch connecting power sources even when a voltage difference is generated between the power sources of functional blocks separated from each other on an LSI chip and can be usefully used as a power switch to be inserted between the power sources of the functional blocks separated in a system-on-chip.

What is claimed is:

1. A power switching circuit, comprising:
a first p-type transistor and a second p-type transistor connected in series between a first power source and a second power source;
a gate control circuit having a first power supply terminal connected to the first power source, a second power supply terminal connected to the second power source, a control signal terminal to which a control signal is input, a first output terminal connected to the gate of the first P-type transistor, and a second output terminal connected to the gate of the second P-type transistor; and
a well-potential control circuit having a first power supply terminal connected to the first power source, a second power supply terminal connected to the second power source, and an output terminal connected to the well of the first P-type transistor and the well of the second P-type transistor;
wherein the gate control circuit outputs a voltage equal to that of the first power source to the first output terminal and outputs a voltage equal to that of the second power source to the second output terminal when the control signal is in a low level, and outputs an earth potential to the first output terminal and the second output terminal when the control signal is in a high level, and
wherein the well-potential control circuit outputs the voltage equal to that of the first power source to the output terminal when the voltage of the first power source is higher than that of the second power source, and outputs the voltage equal to that of the second power source to the output terminal when the voltage of the second power source is higher than that of the first power source.

2. The power switching circuit according to claim 1, wherein the gate control circuit includes a first resistive element and a first N-type transistor connected in series between the first power supply terminal and the earth potential and a second resistive element and a second N-type transistor connected in series between the second power supply terminal and the earth potential, and
wherein the gate of the first N-type transistor and the gate of the second N-type transistor are connected to the control signal terminal, a connection node between the first resistive element and the first N-type transistor serves as the first output terminal, and a connection node between the second resistive element and the second N-type transistor serves as the second output terminal.

3. The power switching circuit according to claim 1, wherein the gate control circuit includes a fifth P-type transistor and a first N-type transistor connected in series between the first power supply terminal and the earth potential and a sixth P-type transistor and a second N-type transistor connected in series between the second power supply terminal and the earth potential, and
wherein the gate of the first N-type transistor and the gate of the second N-type transistor are connected to the control signal terminal, the gate of the fifth P-type transistor and the gate of the sixth P-type transistor are connected to the earth potential, a connection node between the fifth P-type transistor and the first N-type transistor serves as the first output terminal, and a connection node between the fifth P-type transistor and the second N-type transistor serves as the second output terminal.

4. The power switching circuit according to claim 1, wherein the gate control circuit includes a seventh P-type transistor and a first N-type transistor connected in series between the first power supply terminal and the earth potential and an eighth P-type transistor and a second N-type transistor connected in series between the second power supply terminal and the earth potential, and
wherein the gate of the first N-type transistor, the gate of the second N-type transistor, the gate of the seventh P-type transistor, and the gate of the eighth P-type transistor are connected to the control signal terminal, a connection node between the seventh P-type transistor and the first N-type transistor serves as the first output terminal, and a connection node between the eighth P-type transistor and the second N-type transistor serves as the second output terminal.

5. The power switching circuit according to claim 1, wherein the well-potential control circuit includes a third P-type transistor connected between the first power supply terminal and the output terminal and a fourth P-type transistor connected between the second power supply terminal and the output terminal, and
wherein the gate of the third P-type transistor is connected to the second power supply terminal and the gate of the fourth P-type transistor is connected to the first power supply terminal.

6. The power switching circuit according to claim 1, further comprising a first capacitive element connected between the first power source and the gate of the first P-type transistor, and/or a second capacitive element connected between the second power source and the gate of the second P-type transistor.

7. A power switching circuit comprising:
a first P-type transistor and a second P-type transistor connected in series between a first power source and a second power source;

a gate control circuit including a first resistive element connected between the first power source and the gate of the first P-type transistor, a second resistive element connected between the second power source and the gate of the second P-type transistor, a sixth N-type transistor connected between the gate of the second P-type transistor and an earth potential, a third resistive element, a fourth resistive element, and a seventh N-type transistor connected in series between the first power source and the earth potential, a first operational amplifier of which a normal input terminal is connected to a connection node between the third resistive element and the fourth resistive element, a wire for connecting an inverted input of the first operational amplifier to the second power source, a fifth N-type transistor connected between the gate of the first P-type transistor and the output of the first operational amplifier, a control signal terminal connected to the gate of the fifth N-type transistor, the gate of the sixth n-type transistor, and the gate of the seventh N-type transistor, a first output terminal connected to the gate of the first P-type transistor, and a second output terminal connected to the gate of the second P-type transistor; and a well-potential control circuit including a first power supply terminal connected to the first power source, a second power supply terminal connected to the second power source, and an output terminal connected to the well of the first P-type transistor and the well of the second P-type transistor, wherein the well-potential control circuit outputs a voltage equal to the voltage of the first power source to the output terminal when the voltage of the first power source is higher than the voltage of the second power source, and outputs a voltage equal to the voltage of the second power source when the voltage of the second power source is higher than the voltage of the first power source.

8. The power switching circuit according to claim 1, wherein a connection node between the first P-type transistor and the second P-type transistor is provided with an inspecting power supply terminal.

9. A power switching circuit comprising:

a ninth P-type transistor and a tenth P-type transistor connected in series between a first power source and a second power source;

an eleventh P-type transistor connected between a connection node between the ninth P-type transistor and the tenth P-type transistor and a third power source;

a 3-power gate control circuit including a first power supply terminal connected to the first power source, a second power supply terminal connected to the second power source, a third power supply terminal connected to the third power source, a control signal terminal to which a control signal is input, a first output terminal connected to the gate of the ninth P-type transistor, a second output terminal connected to the gate of the tenth P-type transistor, and a third output terminal connected to the gate of the eleventh P-type transistor;

a 3-power well-potential control circuit including a first power supply terminal connected to the first power source, a second power supply terminal connected to the second power source, a third power supply terminal connected to the third power source, and an output terminal connected to the well of the ninth P-type transistor, the well of the tenth P-type transistor, and the well of the eleventh P-type transistor; and an inspecting power supply terminal connected to a connection node among the ninth P-type transistor, a tenth P-type transistor, and the eleventh P-type transistor, wherein when the control signal is in a low level, the 3-power gate control circuit outputs a voltage equal to the voltage of the first power source to the first output terminal, outputs a voltage equal to the voltage of the second power source to the second output terminal, and outputs a voltage equal to the voltage of the third power source to the third output terminal, and when the control signal is in a high level, the 3-power gate control circuit outputs the earth potential to the first output terminal, the second output terminal, and the third output terminal, and wherein the 3-power well-potential control circuit outputs a voltage equal to the voltage of the first power source to the output terminal when the voltage of the first power source is higher than the voltage of the second power source and the voltage of the third power source, and outputs a voltage equal to the voltage of the second power source to the output terminal when the voltage of the second power source is higher than the voltage of the first power source and the voltage of the third power source, and outputs a voltage equal to the voltage of the third power source to the output terminal when the voltage of the third power source is higher than the voltage of the first power source and the voltage of the second power source.

10. The power switching circuit according to claim 9, wherein the 3-power gate control circuit includes a fifth resistive element and an eighth N-type transistor connected in series between the first power supply terminal and the earth potential, a sixth resistive element and a ninth N-type transistor connected in series between the second power supply terminal and the earth potential, and a seventh resistive element and a tenth N-type transistor connected in series between the third power supply terminal and the earth potential, wherein the gate of the eighth N-type transistor, the gate of the ninth N-type transistor, and the gate of the tenth N-type transistor are connected to the control signal terminal, and wherein a connection node between the fifth resistive element and the eighth N-type transistor serves as the first output terminal, a connection node between the sixth resistive element and the ninth N-type transistor serves as the second output terminal, and a connection node between the seventh resistive element and the tenth N-type transistor serves as the third output terminal.

11. The power switching circuit according to claim 9, wherein the 3-power well-potential control circuit includes first and second well-potential control circuits, wherein each of the first and second well-potential control circuits has a third P-type transistor connected between the first power supply terminal and the output terminal and a fourth P-type transistor connected between the second power supply terminal and the output terminal, the gate of the third P-type transistor is connected to the second power supply terminal, and the gate of the fourth N-type transistor is connected to the first power supply terminal, and wherein a first power supply terminal of the 3-power well-potential control circuit is connected to a first power supply terminal of the first well-potential control circuit, a second power supply terminal of the 3-power well-potential control circuit is connected to a second power supply terminal, a third power supply terminal of the 3-power well-potential control circuit is connected to a second power supply terminal of the second well-potential control circuit, an output terminal of the first well-potential control circuit is connected to a first power supply terminal of the second well-potential control circuit, and an output terminal of the second well-potential control circuit serves as an output terminal of the 3-power well-potential control circuit.

12. The power switching circuit according to claim 9, wherein the 3-power well-potential control circuit includes first, second, and third 3-power voltage determining circuits, wherein each of the first, second, and third 3-power voltage determining circuits includes fourteenth and fifteenth P-type transistors connected in series between the power supply terminal and the output terminal and a twentieth N-type transistor connected between the power supply terminal and the output terminal, wherein the gate of the twentieth N-type transistor is connected to the power input terminal, wherein the first power supply terminal of the 3-power well-potential control circuit is connected to a power supply terminal of the first 3-power voltage determining circuit, the second power supply terminal of the 3-power well-potential control circuit is connected to a power supply terminal of the second 3-power voltage determining circuit, and the third power supply terminal of the 3-power well-potential control circuit is connected to a power supply terminal of the third 3-power voltage determining circuit, wherein a first voltage input terminal and a second voltage input terminal, which are the gates of the fourteenth and fifteenth P-type transistors of the first 3-power voltage determining circuit, are connected to the second power supply terminal of the 3-power well-potential control circuit and the third power supply terminal of the 3power well-potential control circuit, respectively, or to the third power supply terminal of the 3-power well-potential control circuit and the second power supply terminal of the 3-power well-potential control circuit, respectively, wherein a first voltage input terminal and a second voltage input terminal, which are the gates of the fourteenth and fifteenth P-type transistors of the second 3-power voltage determining circuit, are connected to the first power supply terminal of the 3-power well-potential control circuit and the third power supply terminal of the 3-power well-potential control circuit, respectively, or to the third power supply terminal of the 3-power well-potential control circuit and the first power supply terminal of the 3-power well-potential control circuit, respectively, wherein a first voltage input terminal and a second voltage input terminal, which are the gates of the fourteenth and fifteenth P-type transistors of the third 3-power voltage determining circuit, are connected to the first power supply terminal of the 3-power well-potential control circuit and the second power supply terminal of the 3-power well-potential control circuit, respectively, or to the second power supply terminal of the 3-power well-potential control circuit and the first power supply terminal of the 3-power well-potential control circuit, respectively, and wherein the output terminal of the 3-power well-potential control circuit is connected to output terminals of the first, second, and third 3-power voltage determining circuits.

13. The power switching circuit according to claim 9, wherein the 3-power well-potential control circuit includes first, second, and third 3-power voltage determining circuits, wherein each of the first, second, and third 3-power voltage determining circuits includes fourteenth and fifteenth P-type transistors connected in series between the power supply terminal and the output terminal, wherein the first power supply terminal of the 3-power well-potential control circuit is connected to a power supply terminal of the first 3-power voltage determining circuit, the second power supply terminal of the 3-power well-potential control circuit is connected to a power supply terminal of the second 3-power voltage determining circuit, and the third power supply terminal of the 3-power well-potential control circuit is connected to a power supply terminal of the third 3-power voltage determining circuit, wherein a first voltage input terminal and a second voltage input terminal, which are the gates of the fourteenth and fifteenth P-type transistors of the first 3-power voltage determining circuit, are connected to the second power supply terminal of the 3-power well-potential control circuit and the third power supply terminal of the 3-power well-potential control circuit, respectively, or to the third power supply terminal of the 3-power well-potential control circuit and the second power supply terminal of the 3-power well-potential control circuit, respectively, wherein a first voltage input terminal and a second voltage input terminal, which are the gates of the fourteenth and fifteenth P-type transistors of the second 3-power voltage determining circuit, are connected to the first power supply terminal of the 3-power well-potential control circuit and the third power supply terminal of the 3-power well-potential control circuit, respectively, or to the third power supply terminal of the 3-power well-potential control circuit and the first power supply terminal of the 3-power well-potential control circuit, respectively, wherein a first voltage input terminal and a second voltage input terminal, which are the gates of the fourteenth and fifteenth P-type transistors of the third 3-power voltage determining circuit, are connected to the first power supply terminal of the 3-power well-potential control circuit and the second power supply terminal of the 3-power well-potential control circuit, respectively, or to the second power supply terminal of the 3-power well-potential control circuit and the first power supply terminal of the 3-power well-potential control circuit, respectively, and wherein the output terminal of the 3-power well-potential control circuit is connected to output terminals of the first, second, and third 3-power voltage determining circuits.

14. A power switching circuit comprising:

an eleventh N-type transistor connected between a first power source and a second power source;

an eighth resistive element connected between the gate of the eleventh N-type transistor and the earth potential; and a twelfth P-type transistor connected between a connection node between the gate of the eleventh N-type transistor and the eighth resistive element and said first power source, wherein an inverted control signal is input to the gate thereof.

15. A power switching circuit comprising:
an eleventh N-type transistor connected between a first power source and a second power source;
an eighth resistive element connected between the gate of the eleventh N-type transistor and the earth potential;
a twelfth N-type transistor connected between the first power source and a third power source;
a ninth resistive element connected between the gate of the twelfth N-type transistor and the earth potential;
a thirteenth N-type transistor connected between the first power source and a fourth power source;
a tenth resistive element connected between the gate of the thirteenth N-type transistor and the earth potential; and
an inspecting signal input terminal connected in common to a connection node between the gate of the eleventh N-type transistor and the eighth resistive element, a connection node between the gate of the twelfth N-type transistor and the ninth resistive element, and a connection node between the gate of the thirteenth N-type transistor and the tenth resistive element.

16. A power switching circuit comprising:
an eleventh N-type transistor which is connected between a first power source and a second power source and of which the well potential can be controlled by a triple well process;
an eighth resistive element connected between the gate of the eleventh N-type transistor and the earth potential;
an inspecting well-potential control terminal connected to the well of the eleventh N-type transistor; and
an inspecting signal input terminal connected to the gate of the eleventh N-type transistor.

17. A power switching circuit comprising:
an eleventh N-type transistor which is connected between a first power source and a second power source and of which the well potential can be controlled by a triple well process;
an eighth resistive element connected between the gate of the eleventh N-type transistor and the earth potential;
an inspecting well-potential control terminal connected to the well of the eleventh N-type transistor; and
a twelfth P-type transistor connected to a connection node between the gate of the eleventh N-type transistor and the eighth resistive element, wherein an inverted control signal is input to the gate thereof.

18. A power switching circuit comprising:
a first P-type transistor and a second P-type transistor connected in series between a first power source and a second power source;
a fourteenth N-type transistor connected between the first power source and the second power source;
a PN gate control circuit including a first power supply terminal connected to the first power source, a second power supply terminal connected to the second power source, a control signal terminal to which a control signal is input, an inverted control signal terminal to which an inverted control signal is input, a first output terminal connected to the gate of the first P-type transistor, a second output terminal connected to the gate of the second P-type transistor, and a third output terminal connected to the gate of the fourteenth N-type transistor; and
a well-potential control circuit including a first power supply terminal connected to the first power source, a second power supply terminal connected to the second power source, and an output terminal connected to the well of the first P-type transistor and the well of the second P-type transistor,
wherein when the control signal is in a low level and the inverted control signal is in a high level, the PN gate control circuit outputs a voltage equal to the voltage of the first power source to the first output terminal, outputs a voltage equal to the voltage of the second power source to the second output terminal, and outputs the earth potential to the third output terminal, and when the control signal is in a high level and the inverted control signal is in a low level, the PN gate control circuit outputs the earth potential to the first output terminal and the second output terminal and outputs a voltage equal to the voltage of the first power source to the third output terminal, and
wherein the well-potential control circuit outputs a voltage equal to the voltage of the first power source to the output terminal when the voltage of the first power source is higher than the voltage of the second power source, and outputs a voltage equal to the voltage of the second power source to the output terminal when the voltage of the second power source is higher than the voltage of the first power source.

19. The power switching circuit according to claim 18, wherein the PN gate control circuit further includes an eleventh resistive element and a fifteenth N-type transistor connected in series between the first power supply terminal and the earth potential, a twelfth resistive element and a sixteenth N-type transistor connected in series between the second power supply terminal and the earth potential, and a thirteenth P-type transistor and a thirteenth resistive element connected in series between the first power source and the earth potential, and
wherein the gate of the fifteenth N-type transistor and the gate of the sixteenth N-type transistor are connected to the control signal terminal, the gate of the thirteenth P-type transistor is connected to the inverted control signal terminal, a connection node between the eleventh resistive element and the fifteenth N-type transistor is connected to the first output terminal, a connection node between the twelfth resistive element and the sixteenth N-type transistor is connected to the second output terminal, and a connection node between the thirteenth P-type transistor and the thirteenth resistive element is connected to the third output terminal.

20. A power switching circuit comprising:
a first P-type transistor and a second P-type transistor connected in series between a first power source and a second power source;
a fourteenth N-type transistor connected between the first power source and the second power source;
a fourteenth resistive element connected between the first power source and the gate of the first P-type transistor;
a fifteenth resistive element connected between the second power source and the gate of the second P-type transistor;
an eighteenth N-type transistor connected between the gate of the second P-type transistor and an earth potential;
a seventeenth resistive element, an eighteenth resistive element, and a seventeenth N-type transistor connected in series between the first power source and the earth potential;
a first operational amplifier of which a normal input terminal is connected to a connection node between the seventeenth resistive element and the eighteenth resistive element;
a line for connecting an inverted input terminal of the first operational amplifier and the second power source;

a twentieth N-type transistor connected between the gate of the first P-type transistor and an output terminal of the first operational amplifier;

a sixteenth resistive element connected between the gate of the fourteenth N-type transistor and the earth potential;

a nineteenth N-type transistor connected between the gate of the fourteenth N-type transistor and the output terminal of the first operational amplifier;

a control signal terminal connected to the gate of the seventeenth N-type transistor, the gate of the eighteenth N-type transistor, the gate of the nineteenth N-type transistor, and the gate of the twentieth N-type transistor; and a well-potential control circuit having a first power supply terminal, a second power supply terminal, and an output terminal, wherein the well-potential control circuit outputs a voltage equal to the voltage of the first power source to the output terminal when the voltage of the first power source is higher than the voltage of the second power source, and outputs a voltage equal to the voltage of the second power source to the output terminal when the voltage of the second power source is higher than the voltage of the first power source.

21. A power switching circuit comprising:

an eighteenth P-type transistor connected between an inspecting power supply terminal and a first power source, a nineteenth P-type transistor connected between the inspecting power supply terminal and a second power source, a twentieth P-type transistor connected between the inspecting power supply terminal and a third power source, a twenty first P-type transistor connected between the inspecting power supply terminal and a fourth power source, and a twenty second P-type transistor connected between the inspecting power supply terminal and a fifth power source;

a 5-power gate control circuit including a first power supply terminal connected to the first power source, a second power supply terminal connected to the second power source, a third power supply terminal connected to the third power source, a fourth power supply terminal connected to the fourth power source, a fifth power supply terminal connected to the fifth power source, a control signal terminal to which a control signal is input, a first output terminal connected to the gate of the eighteenth P-type transistor, a second output terminal connected to the gate of the nineteenth P-type transistor, a third output terminal connected to the gate of the twentieth P-type transistor, a fourth output terminal connected to the gate of the twenty first P-type transistor, and a fifth output terminal connected to the gate of the twenty second P-type transistor; and a 5-power well-potential control circuit including a first power supply terminal connected to the first power source, a second power supply terminal connected to the second power source, a third power supply terminal connected to the third power source, a fourth power supply terminal connected to the fourth power source, a fifth power supply terminal connected to the fifth power source, and an output terminal simultaneously connected to the well of the eighteenth P-type transistor, the well of the nineteenth P-type transistor, the well of the twentieth P-type transistor, the well of the twenty first P-type transistor, and the well of the twenty second P-type transistor, wherein when the control signal is in a low level, the 5-power gate control signal outputs a voltage equal to the voltage of the first power source to the first output terminal, outputs a voltage equal to the voltage of the second power source to the second output terminal, outputs a voltage equal to the voltage of the third power source to the third output terminal, outputs a voltage equal to the voltage of the fourth power source to the fourth output terminal, and outputs a voltage equal to the voltage of the fifth power source to the fifth output terminal, and when the control signal is in a high level, the 5-power gate control circuit outputs the earth potential to the first output terminal, the second output terminal, the third output terminal, the fourth output terminal, and the fifth output terminal, and wherein the 5-power well-potential control circuit outputs a voltage equal to the voltage of the first power source to the output terminal when the voltage of the first power source is higher than the voltage of the second power source, the voltage of the third power source, the voltage of the fourth power source, and the voltage of the fifth power source, outputs a voltage equal to the voltage of the second power source to the output terminal when the voltage of the second power source is higher than the voltage of the first power source, the voltage of the third power source, the voltage of the fourth power source, and the voltage of the fifth power source, outputs a voltage equal to the voltage of the third power source to the output terminal when the voltage of the third power source is higher than the voltage of the first power source, the voltage of the second power source, the voltage of the fourth power source, and the voltage of the fifth power source, outputs a voltage equal to the voltage of the fourth power source to the output terminal when the voltage of the fourth power source is higher than the voltage of the first power source, the voltage of the second power source, the voltage of the third power source, and the voltage of the fifth power source, and outputs a voltage equal to the voltage of the fifth power source to the output terminal when the voltage of the fifth power source is higher than the voltage of the first power source, the voltage of the second power source, the voltage of the third power source, and the voltage of the fourth power source.

22. The power switching circuit according to claim 21, wherein the 5-power well-potential control circuit includes first, second, third, fourth, and fifth 5-power voltage determining circuits, wherein each of the first, second, third, fourth, and fifth 5-power voltage determining circuits includes a power supply terminal, first, second, third, and fourth power input terminals, and an output terminal, wherein the power supply terminal of the first 5-power voltage determining circuit is connected to the first power supply terminal of the 5-power well-potential control circuit, and the first, second, third, and fourth voltage input terminals of the first 5-power voltage determining circuit are connected to any one of the second power supply terminal, the third power supply terminal, the fourth power supply terminal, and the fifth power supply terminal of the 5-power well-potential control circuit, wherein the power supply terminal of the second 5-power voltage determining circuit is connected to the second power supply terminal of the 5-power well-potential control circuit, and the first, second, third, and fourth voltage input terminals of the second 5-power voltage determining circuit are connected to any one of the first power supply terminal, the third power supply terminal, the fourth power supply terminal, and the fifth power supply terminal of the 5-power well-potential control circuit, wherein the power supply terminal of the third 5-power voltage determining circuit is connected to the third power supply terminal of the 5-power well-potential control circuit, and the first, second, third, and fourth voltage input terminals of the third 5-power voltage determining circuit are connected to any one of the first power supply terminal, the second power supply terminal, the fourth power supply terminal, and the fifth power supply terminal of the 5-power well-potential control circuit, wherein the power supply terminal of the fourth 5-power voltage determining circuit is connected to the fourth power supply terminal of the 5-power well-potential control circuit, and the first, second, third, and fourth voltage input terminals of the fourth 5-power voltage determining circuit are connected to any one of the first power supply terminal, the second power supply terminal, the third power supply terminal, and the fifth power supply terminal of the 5-power well-potential control circuit, wherein the power supply terminal of the fifth 5-power voltage determining circuit is connected to the fifth power supply terminal of the 5-power well-potential control circuit, and the first, second, third, and fourth voltage input terminals of the fifth 5-power voltage determining circuit are connected to any one of the first power supply terminal, the second power supply terminal, the third power supply terminal, and the fourth power supply terminal of the 5-power well-potential control circuit, and wherein all the output terminals of the 5-power voltage determining circuits are connected to one node and serves as an output terminal of the 5-power well-potential control circuit.

23. The power switching circuit according to claim 21, wherein the 5-power gate control circuit includes first, second, third, fourth, and fifth gate signal circuits, wherein each of the first, second, third, fourth, and fifth gate signal circuits includes a power supply terminal, a control signal terminal, and an output terminal, wherein all the control signal terminals of the first, second, third, fourth, and fifth gate signal circuits are connected to the control signal terminal of the 5-power gate control signal, wherein the power supply terminals of the first, second, third, fourth, and fifth gate signal circuits are connected to the first, second, third, fourth, and fifth power supply terminals of the 5-power gate control circuit, respectively, and wherein the output terminals of the first, second, third, fourth, and fifth gate signal circuits are connected to the first, second, third, fourth, and fifth output terminals of the 5-power gate control circuit, respectively.

24. The power switching circuit according to claim 22, wherein the 5-power voltage determining circuit includes twenty third, twenty fourth, twenty fifth, and twenty sixth P-type transistors connected in series between the power supply terminal and the output terminal and a twenty first N-type transistor connected between the power supply terminal and the output terminal, wherein the gate of the twenty first N-type transistor is connected to the power supply terminal, and wherein the gates of the twenty third, twenty fourth, twenty fifth, and twenty sixth P-type transistors serve as the first, second, third, and fourth voltage input terminals, respectively.

25. The power switching circuit according to claim 22, wherein the 5-power voltage determining circuit includes twenty seventh, twenty eighth, twenty ninth, and thirtieth P-type transistors connected in series between the power supply terminal and the output terminal, and wherein the gates of the twenty seventh, twenty eighth, twenty ninth, and thirtieth P-type transistors serve as the first, second, third, and fourth voltage input terminals, respectively.

26. The power switching circuit according to claim 21, wherein an inspecting control input terminal is connected to the control signal terminal, and wherein a twentieth resistive element connected in series between a connection node between the control signal terminal and the inspecting control input terminal and the earth potential is further provided.

* * * * *

UNITED STATES PATENT AND TRADEMARK OFFICE
CERTIFICATE OF CORRECTION

PATENT NO.        : 7,423,472 B2
APPLICATION NO.   : 11/390443
DATED             : September 9, 2008
INVENTOR(S)       : Masaya Hirose et al.

It is certified that error appears in the above-identified patent and that said Letters Patent is hereby corrected as shown below:

On the title page, below the data for Item "(65)" and before Item "(51)", insert the following:

-- (30)  Foreign Application Priority Data
Mar. 28, 2005 (JP).......2005-092545
Mar. 02, 2006 (JP).......2006-056395 --.

Signed and Sealed this

Seventh Day of April, 2009

JOHN DOLL
*Acting Director of the United States Patent and Trademark Office*